(12) United States Patent
Kobata et al.

(10) Patent No.: US 10,665,487 B2
(45) Date of Patent: May 26, 2020

(54) SUBSTRATE PROCESSING APPARATUS, SUBSTRATE PROCESSING SYSTEM, AND SUBSTRATE PROCESSING METHOD

(71) Applicant: EBARA CORPORATION, Tokyo (JP)

(72) Inventors: Itsuki Kobata, Tokyo (JP); Keita Yagi, Tokyo (JP); Katsuhide Watanabe, Tokyo (JP); Yoichi Shiokawa, Tokyo (JP); Toru Maruyama, Tokyo (JP); Nobuyuki Takahashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 559 days.

(21) Appl. No.: 15/305,088

(22) PCT Filed: Apr. 17, 2015

(86) PCT No.: PCT/JP2015/061848
§ 371 (c)(1),
(2) Date: Oct. 18, 2016

(87) PCT Pub. No.: WO2015/159973
PCT Pub. Date: Oct. 22, 2015

(65) Prior Publication Data
US 2017/0047237 A1    Feb. 16, 2017

(30) Foreign Application Priority Data

Apr. 18, 2014    (JP) ................. 2014-086869

(51) Int. Cl.
*H01L 21/677*    (2006.01)
*H01L 21/3105*    (2006.01)
(Continued)

(52) U.S. Cl.
CPC ........ *H01L 21/67742* (2013.01); *B24B 37/04* (2013.01); *B24B 37/20* (2013.01);
(Continued)

(58) Field of Classification Search
None
See application file for complete search history.

(56) References Cited

U.S. PATENT DOCUMENTS 7,850,817 B2 * 12/2010  Wakabayashi ........ B24B 37/345
                                                      156/345.12
8,679,286 B2 *  3/2014  Yamauchi ........... B81C 1/00539
                                                      156/345.12
(Continued)

FOREIGN PATENT DOCUMENTS

JP    H10-044025 A    2/1998
JP    2001-322036 A   11/2001
(Continued)

OTHER PUBLICATIONS

Machine Generated English Translation of JP2011129596.Claims. Jun. 30, 2011. (Year: 2011).*
(Continued)

*Primary Examiner* — Sylvia MacArthur
(74) *Attorney, Agent, or Firm* — BakerHostetler

(57) ABSTRACT

An object of the present invention is to improve a substrate processing apparatus using the CARE method.
The present invention provides a substrate processing apparatus for polishing a processing target region of a substrate by bringing the substrate and a catalyst into contact with each other in the presence of processing liquid. The substrate processing apparatus includes a substrate holding unit configured to hold the substrate, a catalyst holding unit configured to hold the catalyst, and a driving unit configured to move the substrate holding unit and the catalyst holding unit relative to each other with the processing target region of the substrate and the catalyst kept in contact with each other. The catalyst is smaller than the substrate.

34 Claims, 44 Drawing Sheets

(51) Int. Cl.
*H01L 21/683* (2006.01)
*H01L 21/306* (2006.01)
*H01L 21/321* (2006.01)
*H01L 21/67* (2006.01)
*B24B 37/20* (2012.01)
*H01L 21/311* (2006.01)
*H01L 21/3213* (2006.01)
*B24B 37/04* (2012.01)
*H01L 21/66* (2006.01)

(52) U.S. Cl.
CPC .. *H01L 21/30612* (2013.01); *H01L 21/30625* (2013.01); *H01L 21/31055* (2013.01); *H01L 21/31111* (2013.01); *H01L 21/3212* (2013.01); *H01L 21/32115* (2013.01); *H01L 21/32134* (2013.01); *H01L 21/6708* (2013.01); *H01L 21/67092* (2013.01); *H01L 21/67248* (2013.01); *H01L 21/67253* (2013.01); *H01L 21/6838* (2013.01); *H01L 22/26* (2013.01); *H01L 22/12* (2013.01)

(56) References Cited

U.S. PATENT DOCUMENTS

| | | |
|---|---|---|
| 2001/0036746 A1 | 11/2001 | Sato et al. |
| 2008/0073222 A1 | 3/2008 | Yamauchi et al. |
| 2009/0095712 A1 | 4/2009 | Yamauchi et al. |
| 2010/0147463 A1 | 6/2010 | Yamauchi et al. |
| 2012/0244649 A1 | 9/2012 | Sano et al. |
| 2014/0017824 A1 | 1/2014 | Iizumi et al. |
| 2014/0051249 A1* | 2/2014 | Suzuki ............. H01L 21/30625 438/692 |
| 2014/0087629 A1* | 3/2014 | Takahashi ............. B24B 7/228 451/5 |
| 2014/0231011 A1 | 8/2014 | Yamauchi et al. |
| 2014/0326612 A1 | 11/2014 | Yamauchi |

FOREIGN PATENT DOCUMENTS

| | | |
|---|---|---|
| JP | 2003-086549 A | 3/2003 |
| JP | 2008-121099 A | 5/2008 |
| JP | 2008-136983 A | 6/2008 |
| JP | 2008-166709 A | 7/2008 |
| JP | 2008-221344 A | 9/2008 |
| JP | 2009-117782 A | 5/2009 |
| JP | 2009-269109 A | 11/2009 |
| JP | 2011-129596 | 6/2011 |
| JP | WO2013-084934 A | 6/2013 |
| JP | 2014-017418 A | 1/2014 |

OTHER PUBLICATIONS

Machine Generated English Translation of JP2011129596.Specification. Jun. 30, 2011. (Year: 2011).*
Machine Generated English Translation of JP19980044025. Specification. Feb. 17, 1998 (Year: 1998).*
Machine Generated English Translation of JJP19980044025, Claims. Feb. 17, 1998 (Year: 1998).*
International Patent Application No. PCT/JP2015/061848; Int'l Search Report; dated Jul. 7, 2015; 2 pages.

* cited by examiner (a)

(b)

SUBSTRATE PROCESSING APPARATUS, SUBSTRATE PROCESSING SYSTEM, AND SUBSTRATE PROCESSING METHOD

This application is a Section 371 National Stage Application of International Application No. PCT/JP2015/061848, filed on Apr. 17, 2015, entitled "SUBSTRATE PROCESSING APPARATUS, SUBSTRATE PROCESSING SYSTEM, AND SUBSTRATE PROCESSING METHOD", which claims priority to Japanese Application No. 086869/2014, filed on Apr. 18, 2014, incorporated herein by reference in their entirety.

TECHNICAL FIELD

The present invention relates to a technique for polishing a substrate.

BACKGROUND ART

There is known a chemical mechanical polishing (CMP, Chemical Mechanical Polishing) apparatus that polishes a surface of a substrate when a semiconductor device is manufactured. The CMP apparatus includes a polishing pad attached on a top surface of a polishing table, thereby forming a polishing surface. In this CMP apparatus, a polishing target surface of the substrate held by a top ring is pressed against the polishing surface, and the polishing table and the top ring rotates while supplying slurry as polishing liquid to the polishing surface. As a result, the polishing surface and the polishing target surface are slidably moved relative to each other, by which the polishing target surface is polished.

In recent years, the planarization technique including the CMP has been facing expansion of a variety of possible polishing target materials, and also has been subject to requirements that has been becoming increasingly stricter with respect to a polishing capability thereof (for example, flatness, a damage incurred from the polishing, and further, productivity). Under such circumstances, new planarization methods also have been proposed, and one of them is catalyst referred etching (Catalyst Referred Etching: hereinafter referred to as CARE). According to the CARE method, reactive species are produced from processing liquid that reacts with the polishing target surface only around a catalyst material in the presence of the processing liquid. Then, bringing the catalyst material and the polishing target surface into proximity to or contact with each other allows an etching reaction to selectively occur on the polishing subject surface on a surface located in proximity to or in contact with the catalyst material. For example, for a rough polishing target surface, bringing protrusions and the catalyst material into proximity to or contact with each other allows the protrusions to be selectively etched, thereby succeeding in the planarization of the polishing subject surface. Originally, this CARE method has been proposed for the purpose of planarizing next-generation substrate materials that used to be difficult to be highly efficiently planarized by the CMP due to their chemical stability, such as Sic and GaN (for example, the following patent literatures, PTL 1 to PTL 4). However, in recent years, the CARE method has been confirmed to be also usable to process a silicon dioxide film and the like, and has opened a possibility of being able to be employed even for a currently prevailing silicon substrate material (for example, the following patent literature, PTL 5).

CITATION LIST

Patent Literature

PTL 1: Japanese Patent Application Public Disclosure No. 2008-121099
PTL 2: Japanese Patent Application Public Disclosure No. 2008-136983
PTL 3: Japanese Patent Application Application Public Disclosure No. 2008-166709
PTL 4: Japanese Patent Application Application Public Disclosure No. 2009-117782
PTL 5: International Publication No. WO/2013/084934

SUMMARY OF INVENTION

Technical Problem

However, this CARE method is required to satisfy a similar processing capability to the CMP (the chemical mechanical polishing), which has been a representative method for this process until now, to be permitted to be employed for the planarization of a semiconductor material on the silicon substrate. Especially, in terms of an etching rate and an etching amount, the CARE method is required to be able to maintain evenness on a wafer level and a chip level. Further, the same applies to the planarization capability, and these requirements are getting further stricter as the process generation advances. Further, the normally practiced process for planarizing the semiconductor material on the silicon substrate often involves simultaneous removal and planarization of a plurality of materials, and a substrate processing apparatus using the CARE method is required to support similar processing.

Solution to Problem

The present invention has been made to solve at least a part of the above-described problems, and can be embodied according to the following aspects.

A first aspect of the present invention provides a substrate processing apparatus for processing a processing target region (a semiconductor material) on a substrate by bringing the substrate and a catalyst into contact with each other in the presence of processing liquid. This substrate processing apparatus includes a substrate holding unit configured to hold the substrate, a catalyst holding unit configured to hold the catalyst, and a driving unit configured to move the substrate holding unit and the catalyst holding unit relative to each other with the processing target region on the substrate and the catalyst kept in contact with each other. The catalyst holding unit includes an elastic member for holding the catalyst. According to this aspect, when the processing target region on the substrate and the catalyst are brought into contact with each other, the elastic member is deformed, which allows the catalyst to evenly contact the substrate in conformity with the shape of the substrate (warpage and the like of the substrate), thereby allowing a uniform etching rate within the contat area.

According to a second aspect of the present invention, in the first aspect, the elastic member includes a structure having a pressure chamber formed by an elastic film. A layer of the catalyst is formed on an outer surface of the elastic film. The pressure chamber is configured to control a contact pressure between the processing target region of the substrate and the catalyst by control of a pressure of fluid supplied into this pressure chamber. According to this aspect, the catalyst can evenly contact the substrate, thereby allowing uniform etching rate within the contact area.

According to a third aspect of the present invention, in the first aspect, the elastic member includes a spherical body held in such a manner that, when the substrate holding unit and the catalyst holding unit are moved relative to each other, the spherical body is rotatable according to this relative movement. A layer of the catalyst is formed on an outer surface of the spherical body. According to this aspect, when the processing target region on the substrate and the catalyst are brought into contact with each other, the elastic member is deformed, which allows the catalyst to evenly contact the substrate in conformity with the shape of the substrate (the warpage and the like of the substrate), thereby allowing uniform etching rate within the contact area.

According to a fourth aspect of the present invention, in the third aspect, the substrate processing apparatus further includes a pressure adjustment unit configured to adjust the contact pressure between the processing target region on the substrate and the catalyst by adjusting a force pressing the spherical body toward a substrate side where the substrate is located. According to this aspect, adjusting the pressure with which the processing target region on the substrate and the catalyst are in contact with each other allows the catalyst to evenly contact the substrate in conformity with the shape of the substrate (the warpage and the like of the substrate), thereby allowing uniform retching rate within the contact area.

According to a fifth aspect of the present invention, in the first aspect, the elastic member includes a sponge having a cavity. According to this aspect, the elastic member is deformed, which allows the catalyst to evenly contact the substrate in conformity with the shape of the substrate (the warpage and the like of the substrate), thereby allowing uniform etching rate within the contact area. Further, the sponge is flexible, which contributes to prevention or a reduction of damage that otherwise might be inflicted to the semiconductor material, which is the processing target surface, due to friction.

According to a sixth aspect of the present invention, in the fifth aspect, the substrate processing apparatus includes a processing liquid supply unit configured to supply the processing liquid into the sponge. A layer that is a layer of the catalyst and has a pore is formed on an outer surface of the sponge. According to this aspect, the processing liquid can be supplied from inside the sponge, where the processing liquid can easily flow, to the contact portion between the polishing target surface of the substrate and the catalyst. In other words, the processing liquid can be supplied directly to the contact portion only by a necessary amount, which can lead to a reduction in a use amount of the processing liquid.

According to a seventh aspect of the present invention, in any of the first to sixth aspects, a plurality of grooves is formed on the elastic member, and the catalyst is embedded in each of the plurality of grooves. According to this aspect, the catalysts can be arranged in a specific distribution on the contact surface between the elastic member and the processing target region on the substrate, which allows adjustment of etching amount at the portion in contact with the catalysts.

According to an eighth aspect of the present invention, in any of the first to seventh aspects, a plurality of grooves for transferring the processing liquid is formed on the elastic member. According to this aspect, these grooves facilitate introduction of the processing liquid onto the contact portion between the catalyst and the processing target region on the substrate, and substitution thereon, thereby allowing the substrate to be etched at a higher etching rate and with improved stability.

According to a ninth aspect of the present invention, in any of the first to eighth aspects, the elastic member includes a plurality of elastic members. Each of the plurality of elastic members individually holds the catalyst. According to this aspect, the catalyst can further easily follow the shape of the substrate. Further, when being combined with the second aspect, the ninth aspect allows an etching status to be controlled for each region, thereby allowing the contact portion to be etched with more uniform etching rate.

According to a tenth aspect of the present invention, in any of the first to ninth aspects, the catalyst includes two or more kinds of individual catalysts, or is a mixture or a compound containing two kinds of catalysts. According to this aspect, if the processing target surface is constituted by a plurality of materials, suitable catalysts for each materials are disposed in the form of the individual catalysts, the mixture, or the compound, which allows these materials to be etched at the same time with the aid of the individual catalysts.

According to an eleventh aspect of the present invention, in any of the first to tenth aspects, the catalyst holding unit includes a plurality of catalyst holding units, and the catalyst holding units individually holds the catalyst. According to this aspect, the plurality of catalyst holding units is used at the same time, which can improve a processing capability per unit time.

According to a twelfth aspect of the present invention, in the eleventh aspect, at least two of catalyst holding units, among the plurality of catalyst holding units, hold different kinds of catalysts from each other. According to this aspect, even if the processing target surface is constituted by the plurality of materials, the materials can be etched at the same time. And furthermore the simultaneous use of the plurality of catalyst holding units can improve the processing capability per unit time.

According to a thirteenth aspect of the present invention, in any of the first to twelfth aspects, the substrate processing apparatus includes a substrate temperature control unit configured to control a temperature of the substrate. According to this aspect, the etching rate can be changed by changing the temperature, and thus becomes adjustable.

According to a fourteenth aspect of the present invention, in any of the first to thirteenth aspects, the substrate holding unit includes a substrate position adjustment unit configured to rotate the substrate by an arbitrary predetermined angle so that a notch, an orientation flat, or a laser marker of the substrate is located at a predetermined position. According to this aspect, the catalyst can be brought into contact with a desired portion of the substrate.

According to a fifteenth aspect of the present invention, in any of the first to fourteenth aspects, the substrate processing apparatus further includes a processing liquid temperature adjustment unit configured to adjust a temperature of the processing liquid to a predetermined temperature within a range of 10 degrees to 60 degrees, inclusive. According to this aspect, the etching rate can be changed by changing the temperature, and thus becomes adjustable.

According to a sixteenth aspect of the present invention, in any of the first to fifteenth aspects, the substrate processing apparatus includes a processing liquid supply unit including a supply port for supplying the processing liquid onto the processing target region of the substrate. The processing liquid supply unit is configured in such a manner that the supply port is movable together with the catalyst holding unit. According to this aspect, fresh processing liquid can be always supplied to around the catalyst, resulting in a reduction in variation of the etching rate due to a change in concentration of the processing liquid. Further, the processing liquid can be efficiently supplied onto the processing target region on the substrate, resulting in a reduction in the use amount of the processing liquid.

According to a seventeenth aspect of the present invention, in any of the first to sixteenth aspects, the catalyst holding unit is disposed above the substrate holding unit. The substrate holding unit includes a wall extending vertically upwardly throughout an entire circumferential direction outside a region for holding the substrate. According to this aspect, the processing liquid can be held inside the wall portion, which can prevent or reduce an outward leak of the processing liquid. As a result, the use amount of the processing liquid can be reduced.

According to an eighteenth aspect of the present invention, in any of the first to seventeenth aspects, the substrate processing apparatus includes a processing liquid holding unit surrounding the catalyst holding unit and open on a substrate side that faces the substrate. The processing liquid holding unit is configured to hold the processing liquid in this processing liquid holding unit. The processing liquid is supplied into the processing liquid holding unit. According to this aspect, most of the supplied processing liquid is held inside the processing liquid holding unit, which contributes to the reduction in the use amount of the processing liquid.

According to a nineteenth aspect of the present invention, in any of the first to eighteenth aspects, the substrate processing apparatus includes a processing liquid suction unit in communication with the inside of the processing liquid holding unit. The processing liquid suction unit is configured to suck the processing liquid held in the processing liquid holding unit. According to this aspect, the processing liquid is circulated, so that fresh processing liquid can be always supplied to around the catalyst, resulting in a reduction in variation of the etching rate due to a change in concentration of the processing liquid.

According to a twentieth aspect of the present invention, in any of the first to nineteenth aspects, the substrate processing apparatus includes a conditioning unit configured to condition a surface of the catalyst. According to this aspect, an etching product adhered on the surface of the catalyst during the etching processing can be removed. As a result, the surface of the catalyst is recovered into an active status, which allows a plurality of substrates to be processed stably.

According to a twenty-first aspect of the present invention, in the twentieth aspect, the conditioning unit includes a scrub cleaning unit configured to scrub and clean the surface of the catalyst. According to this aspect, the etching product adhered on the surface of the catalyst during the etching processing can be removed. As a result, the surface of the catalyst is recovered into the active status, which allows a plurality of substrates to be processed stably.

According to a twenty-second aspect of the present invention, in the twentieth or twenty-first aspect, the conditioning unit includes a chemical supply unit configured to supply a chemical for removing the etching product adhered on the surface of the catalyst. According to this aspect, the etching product adhered on the surface of the catalyst during the etching processing can be removed. As a result, the surface of the catalyst is recovered into the active status, which allows a plurality of substrates to be processed stably.

According to a twenty-third aspect of the present invention, in any of the twentieth to twenty-second aspects, the conditioning unit includes an electrolytic regeneration unit configured to remove the etching product on the surface of the catalyst with use of an electrolytic action. The electrolytic regeneration unit includes an electrode configured to be electrically connectable to the catalyst, and is configured to remove the etching product adhered on the surface of the catalyst with use of the electrolytic action by applying a voltage to between the catalyst and the electrode. According to this aspect, the etching product adhered on the surface of the catalyst during the etching processing can be removed. As a result, the surface of the catalyst is recovered into the active status, which allows a plurality of substrates to be processed stably.

According to a twenty-fourth aspect of the present invention, in any of the twentieth to twenty-third aspects, the conditioning unit includes a plating regeneration unit configured to regenerate the catalyst by plating the catalyst with a regeneration catalyst prepared from the same kind of catalyst as the catalyst. The plating regeneration unit includes an electrode configured to be electrically connectable to the catalyst, and is configured to plate and regenerate the surface of the catalyst by applying a voltage to between the catalyst and the electrode with the catalyst immersed in liquid containing the regeneration catalyst. According to this aspect, a new catalyst layer can be formed on the catalyst. As a result, the surface of the catalyst is recovered into the active status, which allows a plurality of substrates to be processed stably.

According to a twenty-fifth aspect of the present invention, in any of the twentieth to twenty-fourth aspects, the substrate processing apparatus includes a monitoring unit configured to monitor a status of processing for etching the processing target region of the substrate. According to this aspect, the processing status of the processing target region on the substrate can be monitored in real time.

According to a twenty-sixth aspect of the present invention, in the twenty-fifth aspect, the substrate processing apparatus includes a control unit configured to control an operation of the substrate processing apparatus. The control unit is configured to control at least one parameter in a processing condition of the substrate in process based on the status of the processing for etching the substrate that is acquired by the monitoring unit. According to this aspect, the processing target region on the substrate can be processed so as to approach a predetermined target value.

According to a twenty-seventh aspect of the present invention, in the twenty-fifth aspect, the control unit is configured to determine an end point of the processing based on the status of the processing for etching the substrate that is acquired by the monitoring unit. According to this aspect, the processing target region on the substrate can be processed so as to approach a predetermined target value.

According to a twenty-eighth aspect of the present invention, in the twenty-fifth or twenty-seventh aspect, the monitoring unit includes a torque current monitoring unit configured to monitor the status of the processing for etching the substrate based on a torque current of the driving unit when the catalyst holding unit and the substrate holding unit are moved relative to each other. According to this aspect, a friction generated due to the contact between the processing target region of the substrate and the catalyst can be monitored via the torque current. For example, the status of the processing for etching the substrate can be fed back to a determination about the processing end point and a processing condition by monitoring a variation in the torque current due to, for example, a change in a roughness status of the processing target region or an exposure of another material on the processing target surface.

According to a twenty-ninth aspect of the present invention, in any of the twenty-fifth to twenty-seven aspects, the monitoring unit includes an optical monitoring unit configured to emit light toward the processing target region of the substrate to receive reflection light reflected on a surface of the processing target region of the substrate or reflected after being transmitted through the substrate, and monitor the status of the processing for etching the substrate based on the received light. According to this aspect, if the semiconductor material of the processing target region is a light transmissive material, the status of the processing for etching the substrate can be fed back to the determination about the processing end point and the processing condition by monitoring a variation in intensity of reflected light due to a change in a film thickness.

According to a thirtieth aspect of the present invention, in any of the twenty-fifth to twenty-seventh aspects, the monitoring unit includes an eddy current monitoring unit configured to apply a high-frequency current to a sensor coil disposed in proximity to the surface of the substrate to generate an eddy current on the substrate, and monitor the status of the processing for etching the substrate based on a change in the eddy current or a synthetic impedance according to a thickness of the processing target region of the substrate. According to this aspect, if the semiconductor material of the processing target region is a conductive material, the status of the processing for etching the substrate can be fed back to the determination about the processing end point and the processing condition by monitoring a variation in an eddy current value or synthetic impedance due to the change in the film thickness.

According to a thirty-first aspect of the present invention, in any of the first to thirtieth aspects, the substrate processing apparatus includes a potential adjustment unit including a reference electrode. The potential adjustment unit is configured to establish an electrochemical connection between the catalyst and the reference electrode to each other via the processing liquid to control a potential on the surface of the catalyst. According to this aspect, the substrate processing apparatus can prevent the surface of the catalyst during the etching processing from adhering of a material that would block an activity of catalyst. As a result, the surface of the catalyst can be kept in the active status.

According to a thirty-second aspect of the present invention, in any of the first to thirty-first aspects, the catalyst holding unit includes a spherical body or a cylindrical body with the layer of the catalyst formed on a spherical surface of the spherical body or a circumferential surface of the cylindrical body. The spherical body or the cylindrical body is configured in such a manner that, when the substrate holding unit and the catalyst holding unit are moved relative to each other, the spherical body or the cylindrical body is rotatable according to this relative movement. According to this aspect, the friction can be reduced between the surface of the processing target region on the substrate and the catalyst when the substrate holding unit and the catalyst holding unit are moved relative to each other, resulting in prevention or a reduction of the damage on the surface of the processing target region and wear of the catalyst due to the friction.

According to a thirty-third aspect of the present invention, in the thirty-second aspect, the spherical body or the cylindrical body includes an elastic member therein. According to this aspect, the elastic member is deformed, which allows the catalyst to evenly contact the substrate in conformity with the shape of the substrate (warpage and the like of the substrate), thereby allowing the contact portion to be etched with more uniform etching rate.

A thirty-fourth aspect of the present invention provides a substrate processing system. This substrate processing system includes the substrate processing apparatus according to any one of the first to thirty-third aspects, a substrate cleaning unit configured to clean the substrate, and a substrate transfer unit configured to transfer the substrate. According to this substrate processing system, the etching product can be removed from the surface of the substrate after the substrate is processed, as a result of which the surface of the substrate can be cleaned.

According to a thirty-fifth aspect of the present invention, in the thirty-fourth aspect according to the fourteenth aspect, the substrate processing system includes a detection unit configured to detect at least one of the notch, the orientation flat, and the laser marker of the substrate. According to this aspect, the effect of the fourteenth aspect can be preferably brought about.

According to a thirty-sixth aspect of the present invention, in the thirty-fourth or thirty-fifth aspect, the substrate processing system includes a thickness measurement unit configured to measure a thickness of the processing target region of the substrate after the substrate is processed by the substrate processing apparatus. According to this aspect, the substrate processing system can detect a thickness distribution of the processing target region of the substrate after the processing, and therefore can improve a quality of the processing performed on the substrate by changing a parameter in a processing condition based on a result of the measurement by the thickness measurement unit when processing a next substrate.

According to a thirty-seventh aspect of the present invention, in the thirty-sixth aspect, the substrate processing system includes a first parameter setting unit configured to set, based on the result of the measurement by the thickness measurement unit, a control parameter for use in substrate processing that will be performed by the substrate processing apparatus next time. According to this aspect, the substrate processing system can perform the processing after correcting an original processing condition based on the result of the measurement by the thickness measurement unit when processing a next substrate, and therefore can improve the quality of the processing performed on the substrate.

According to a thirty-eighth aspect of the present invention, in the thirty-seventh aspect, the first parameter setting unit corrects the control parameter based on a difference between a distribution of the thickness of the processing target region that is acquired based on the result of the measurement by the thickness measurement unit, and a predetermined target distribution of the thickness. According to this aspect, the substrate processing system can process the processing target region so as to achieve a thickness distribution closer to a target value when processing the next substrate, and therefore can improve the quality of the processing performed on the substrate.

According to a thirty-ninth aspect of the present invention, in any of the thirty-sixth to thirty-eighth aspects, the substrate processing system includes a reprocessing control unit configured to reprocess the substrate after the substrate is processed by the substrate processing apparatus if the result of the measurement by the thickness measurement unit does not satisfy a predetermined target value. According to this aspect, the substrate processing system can process the processing target region so as to achieve a thickness distribution closer to a target value when processing the next substrate, and therefore can improve the quality of the processing performed on the substrate.

According to a fortieth aspect of the present invention, in any of the twentieth to thirtieth aspects, the substrate processing system includes a second parameter change unit configured to change the control parameter to be used by the substrate processing apparatus in the next substrate processing based on the status of the processing for etching the substrate that is monitored by the monitoring unit. According to this aspect, a similar effect to the thirty-sixth aspect can be brought about.

According to a forty-first aspect of the present invention, in the fortieth aspect, the second parameter change unit changes the control parameter based on the result of the monitoring by the monitoring unit. According to this aspect, a similar effect to the thirty-eighth aspect can be brought about.

According to a forty-second aspect of the present invention, in any of the thirty-fourth to forty-first aspects, the substrate processing system includes a Chemical Mechanical Polishing apparatus configured to polish the substrate before or after the substrate is processed by the substrate processing apparatus. According to this aspect, more flexibly polishing processing can be performed by using the substrate processing system as prior processing or subsequent processing to the polishing by the Chemical Mechanical Polishing apparatus.

A forty-third aspect of the present invention provides a substrate processing apparatus for processing a processing target region of a substrate by bringing the substrate and a catalyst into contact with each other in the presence of processing liquid. The substrate processing apparatus includes a catalyst holding unit configured to hold the catalyst, and a conditioning unit configured to condition a surface of the catalyst. The substrate processing apparatus according to this aspect can condition the surface of the catalyst, for example, during exchanging the catalyst or replacing the substrate to be processed.

According to a forty-fourth aspect of the present invention, in the forty-third aspect, the conditioning unit includes a scrub cleaning unit configured to scrub and clean the surface of the catalyst. According to this aspect, the substrate processing apparatus can clean and condition the surface of the catalyst by applying a physical force to the surface of the catalyst, and can effectively remove a residue and the like adhered on the surface of the catalyst during deposition of the catalyst and the processing of the substrate.

According to a forty-fifth aspect of the present invention, in the forty-third or forty-fourth aspect, the conditioning unit includes a chemical supply unit configured to supply a chemical for removing an etching product adhered on the surface of the catalyst. According to this aspect, the etching product adhered on the surface of the catalyst and an altered layer on the surface of the catalyst can be removed with use of a chemical action.

According to a forty-sixth aspect of the present invention, in any one of the forty-third to forty-fifth aspects, the conditioning unit includes an electrolytic regeneration unit configured to remove the etching product on the surface of the catalyst with use of an electrolytic action. The electrolytic regeneration unit includes a regeneration electrode configured to be electrically connectable to the catalyst, and is configured to remove the etching product adhered on the surface of the catalyst with use of the electrolytic action by applying a voltage to between the catalyst and the regeneration electrode. According to this aspect, the etching product adhered on the surface of the catalyst and the altered layer on the surface of the catalyst can be removed with use of an electrolytic action.

According to a forty-seventh aspect of the present invention, in any of the forty-third to forty-sixth aspects, the conditioning unit includes a plating regeneration unit configured to regenerate the catalyst by plating the catalyst with a regeneration catalyst prepared from the same kind of catalyst as the catalyst. The plating regeneration unit includes a regeneration electrode configured to be electrically connectable to the catalyst, and is configured to regenerate the catalyst by plating the catalyst with the regeneration catalyst by applying a voltage to between the catalyst and the regeneration electrode with the catalyst immersed in liquid containing the regeneration catalyst. According to this aspect, a new surface of the catalyst can be created.

According to a forty-eighth aspect of the present invention, in the forty-third aspect, the conditioning unit includes a conditioning stage disposed so as to face the surface of the catalyst.

According to a forty-ninth aspect of the present invention, in the forty-eighth aspect, the substrate processing apparatus includes a catalyst cleaning nozzle configured to supply water and/or a chemical for cleaning the surface of the catalyst to the surface of the catalyst. According to this aspect, the etching product and the like adhered on the surface of the catalyst can be easily removed.

According to a fiftieth aspect of the present invention, in the forty-ninth aspect, the catalyst cleaning nozzle is disposed outside the conditioning stage. According to this aspect, the catalyst cleaning nozzle can be prepared as a different member from the other structure, which improves maintainability.

According to a fifty-first aspect of the present invention, in the forty-eighth aspect, the catalyst cleaning nozzle is disposed inside the conditioning stage. The conditioning stage includes a passage for passing the water and/or the chemical into the conditioning stage. The passage is in fluid communication with the catalyst cleaning nozzle. According to this aspect, the water and/or chemical can be evenly sprayed from below the catalyst. Further, a space where an external nozzle is disposed can be reduced.

According to a fifty-second aspect of the present invention, in any of the forty-eighth to fifty-first aspects, the conditioning unit includes a scrub member disposed on the conditioning stage for cleaning the surface of the catalyst.

According to a fifty-third aspect of the present invention, in any of the forty-eighth to fifty-second aspects, the substrate processing apparatus includes an electrode configured to be electrically connectable to the catalyst, a regeneration electrode disposed on the conditioning stage, and a power source configured to apply a voltage to between the electrode and the regeneration electrode. According to this aspect, the catalyst can be conditioned with use of the electrolytic action.

According to a fifty-fourth aspect of the present invention, in the fifty-third aspect, the substrate processing apparatus is configured to electrolytically etch the surface of the catalyst by applying the voltage in such a manner that the electrode on the catalyst side becomes a positive side and the regeneration electrode becomes a negative side in conditioning. According to this aspect, the surface of the catalyst can be conditioned by electrolytic etching. As a result, a foreign object and the like which cannot be removed by other action can be removed.

According to a fifty-fifth aspect of the present invention, in the fifty-fourth aspect, the substrate processing apparatus is configured to reduce an oxide on the surface of the catalyst by applying the voltage in such a manner that the electrode on the catalyst side becomes the negative side and the regeneration electrode becomes the positive side in conditioning. According to this aspect, the surface of the oxidized catalyst can be recovered into the active status by a reduction action.

According to a fifty-sixth aspect of the present invention, in the fifty-third aspect, the substrate processing apparatus includes an ion exchanger provided on the regeneration electrode. The substrate processing apparatus is configured to apply the voltage with the catalyst and the ion exchanger located in proximity to or in contact with each other. The ion exchanger has a catalytic function for enhancing ionization of the water under an electric field, and H+ ions and OH− ions generated therefrom act on the surface of the catalyst, by which a similar effect to the fifty-fourth or fifty-fifth aspect can be brought about. Further, liquid used in this case may be water or a dilute chemical, which can reduce a use amount of the chemical in conditioning.

According to a fifty-seventh aspect of the present invention, in any of the forty-eighth to fifty-sixth aspects, the conditioning stage includes a liquid reservoir portion configured to be able to keep liquid on the conditioning stage. According to this aspect, the surface of the catalyst can keep the liquid during the conditioning, so that the surface of the catalyst can be effectively conditioned. Further, the use amount of the liquid can be reduced.

According to a fifty-eighth aspect of the present invention, in the fifty-seventh aspect, the substrate processing apparatus includes an ultrasonic wave generator configured to emit an ultrasonic wave to the liquid kept in the liquid reservoir portion. According to this aspect, the use of the ultrasonic wave can effectively remove a foreign object and the like adhered on the catalyst.

According to a fifty-ninth aspect of the present invention, in any of the forty-eighth to fifty-eighth aspects, the conditioning stage is rotatably configured.

According to a sixtieth aspect of the present invention, in any of the forty-eighth to fifty-ninth aspects, the substrate processing apparatus includes a catalyst measurement sensor for measuring a status of the surface of the catalyst. The conditioning status is monitored by the catalyst sensor, which can prevent or reduce an excess or insufficient conditioning of the catalyst.

According to a sixty-first aspect of the present invention, in the sixtieth aspect, the catalyst measurement sensor includes at least one of (i) a resistance sensor configured to measure electric resistance of the catalyst, (ii) a thickness sensor configured to measure the thickness of the catalyst, and (iii) an optical sensor.

According to a sixty-second aspect of the present invention, in any of the forty-third to sixty-first aspects, the catalyst includes metal, and the substrate processing apparatus includes an electrode electrically connectable to the metal of the catalyst. The electrode includes metal having larger ionization tendency than the metal of the catalyst. According to this aspect, the reduction action can be caused on the surface of the catalyst with use of a cell reaction. As a result, the surface of the catalyst can be prevented from being oxidized and hydroxylated or kept less oxidized and hydroxylated, and therefore can be kept in the active status.

According to a sixty-third aspect of the present invention, in any of the forty-third to sixty-first aspects, the substrate processing apparatus includes a gas supply nozzle for supplying gas to the surface of the catalyst. According to this aspect, the surface of the catalyst can be prevented from being oxidized and hydroxylated or kept less oxidized and hydroxylated, which otherwise would be caused due to a reaction between the catalyst and the water, by being dried, and therefore can be kept in the active status when the etching processing of the substrate is not performed for a long time, for example, during an interval period in lot processing of the wafer W.

A sixty-fourth aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, a catalyst holding unit configured to hold the catalyst, and a control unit configured to control an operation of the substrate processing apparatus. The control unit performs control so as to move the catalyst holding unit in an in-plane direction of the processing target region of the substrate with the processing target region of the substrate and the catalyst kept in contact with each other, and performs control so as to change a speed at which the catalyst holding unit is moved according to a position of the catalyst holding unit on the processing target region of the substrate. According to this aspect, the substrate processing apparatus can move the catalyst holding unit with a variable speed according to a position of the substrate and can control a time for which the catalyst and the substrate are in contact with each other, i.e., an etching time within the substrate, and thus can control the uniformity of etching rate within the substrate.

A sixty-fifth aspect of the present invention provides a substrate processing apparatus for processing a processing target region of a substrate by bringing the substrate and a catalyst into contact with each other in the presence of processing liquid. The substrate processing apparatus includes a substrate holding stage including a substrate holding surface for holding the substrate, and a catalyst holding unit configured to hold the catalyst. The substrate holding surface of the substrate holding stage is larger in area than a surface of the catalyst on the catalyst holding unit. The substrate holding stage includes an extension portion located externally with respect to an outer periphery of the substrate when the substrate to be processed is set on the substrate holding stage. According to this aspect, the substrate processing apparatus can prevent the catalyst holding unit from tilting even when the catalyst holding unit overhangs beyond the substrate, and therefore can keep the catalyst and the substrate in a constant contact status (for example, a distribution of a contact pressure). Therefore, the substrate processing apparatus can improve the uniformity of etching rate within the substrate.

According to a sixty-sixth aspect of the present invention, in the sixty-fifth aspect, the substrate processing apparatus includes a conditioning unit at the extension portion of the substrate holding stage. The conditioning unit is configured to condition the surface of the catalyst. This configuration allows the catalyst to be conditioned during not only the interval period of the substrate processing but also the period of the substrate processing, thereby allowing the surface of the catalyst to be kept in the active status during the processing.

A sixty-seventh aspect of the present invention provides a substrate processing apparatus for processing a processing target region of a substrate by bringing the substrate and a catalyst into contact with each other in the presence of processing liquid. The substrate processing apparatus includes a substrate holding stage including a substrate holding surface for holding the substrate, and a catalyst holding unit configured to hold the catalyst. The substrate holding surface of the substrate holding stage is larger in area than a surface of the catalyst on the catalyst holding unit. The catalyst holding unit further includes a tilt sensor for detecting a tilt of the surface of the catalyst with respect to the substrate holding surface of the substrate holding stage, and a tilt correction mechanism for correcting the tilt of the surface of the catalyst with respect to the substrate holding surface of the substrate holding stage. According to this aspect, the substrate processing apparatus can detect the tilt of the catalyst holding surface, and prevent or reduce concentration of a load due to the tilt of the catalyst holding surface by correcting the tilt according to a result of the detection, and thus can keep the catalyst and the substrate in the constant contact status (for example, the distribution of the contact pressure). Therefore, the substrate processing apparatus can improve the uniformity of etching rate within the substrate.

A sixty-eighth aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, a catalyst holding unit configured to hold the catalyst, and a processing liquid supply unit including a supply port for supplying the processing liquid passed through an inside of the catalyst holding unit onto the processing target region of the substrate. According to this aspect, the processing liquid can be supplied to the surface where the catalyst and the substrate are in contact with each other, which allows the processing liquid to be effectively supplied to the surface where the catalyst and the substrate are in contact with each other, improving the uniformity of etching rate within the substrate.

According to a sixty-ninth aspect of the present invention, in the sixty-eighth aspect, the catalyst holding unit includes a buffer portion configured to temporarily hold the processing liquid in the catalyst holding unit, and a processing liquid supply portion including a plurality of supply ports for supplying the processing liquid passed through the inside the catalyst holding portion onto the processing target region of the substrate. The plurality of supply ports is in fluid communication with the buffer portion. According to this aspect, the processing liquid can be evenly supplied to the surface where the catalyst and the substrate are in contact with each other, which can improve the uniformity of etching rate within the substrate.

A seventieth aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, and a catalyst holding unit configured to hold the catalyst. The catalyst holding unit includes a plurality of grooves configured to allow the processing liquid to flow between the catalyst holding unit and the substrate with the catalyst holding unit and the substrate kept in contact with each other. According to this aspect, the processing liquid can be effectively supplied to the surface where the catalyst and the substrate are in contact with each other, which can improve the uniformity of etching rate within the substrate.

According to a seventy-first aspect of the present invention, in the seventieth aspect, the plurality of grooves each has such a trapezoidal shape in cross-section that a width of the groove is wider at an opening of the groove than a bottom of the groove. According to this aspect, the grooves can be maintained without being closed when the catalyst and the substrate are in contact with each other, thereby keeping the supply of the processing liquid to between the catalyst and the substrate, which can improve the uniformity of etching rate within the substrate.

According to a seventy-second aspect of the present invention, in the seventieth or the seventy-first aspect, the plurality of grooves includes at least one of (i) a pattern including a plurality of concentric circles, (ii) a pattern including a plurality of radial lines, (iii) a pattern including pluralities of parallel lines extending in intersecting different directions, and (iv) a spiral pattern.

A seventy-third aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, and a catalyst holding unit configured to hold the catalyst. The catalyst holding unit includes a counter electrode configured to be electrically connectable to the catalyst via the processing liquid. According to this aspect, the active status of the surface of the catalyst can be changed by application of a voltage optimum for the substrate processing to the catalyst, which can improve the etching rate within the substrate.

According to a seventy-fourth aspect of the present invention, in the seventy-third aspect, the catalyst holding unit includes a catalyst holding member for holding the catalyst. The counter electrode is disposed outside the catalyst holding member.

According to a seventy-fifth aspect of the present invention, in the seventy-third aspect, the counter electrode is disposed in such a manner that a plurality of counter electrodes is exposed to an inside of the catalyst holding member. According to this aspect, an uniform potential can be applied in the plane of the catalyst, resulting in achievement of evenness of the distribution of the active status of the surface of the catalyst, thereby improving the uniformity of etching rate on the surface where the catalyst and the substrate are in contact with each other.

According to a seventy-sixth aspect of the present invention, in any of the seventy-third to seventy-fifth aspects, the catalyst holding unit includes a processing liquid holding portion surrounding the catalyst and open on a surface thereof facing the substrate holding portion, and is configured in such a manner that the processing liquid is kept in the processing liquid holding portion with the catalyst brought into contact with the substrate.

According to a seventy-seventh aspect of the present invention, in the seventy-sixth aspect, the substrate processing apparatus includes a processing liquid supply unit including a supply port for supplying the processing liquid passed through the catalyst holding portion onto the processing target region of the substrate.

According to a seventy-eighth aspect of the present invention, in any of the seventy-third to seventy-seventh aspects, the substrate processing apparatus includes a voltage control device configured to apply a voltage to between the catalyst and the counter electrode. The voltage control device is configured to control the voltage in such a manner that a potential on the catalyst side decreases below a potential of the counter electrode so as to intermittently become a reduction side while the substrate is processed. According to this aspect, the reduction action can be caused on the catalyst while the substrate is processed, by which the catalyst can be prevented from being oxidized and hydroxylated or kept less oxidized and hydroxylated, and the surface of the catalyst can be kept in the active status.

According to a seventy-ninth aspect of the present invention, in any one of the seventy-third to seventy-eighth aspects, the catalyst is electrically divided into a plurality of regions, and is configured to allow a different voltage to be applied for each of the plurality of regions. According to this aspect, the active status of the surface of the catalyst can be changed by the application of the voltage varying for each region of the catalyst, which leads to an ability to change the etching rate of substrate for each region, thereby improving controllability of the etching of the substrate.

According to an eightieth aspect of the present invention, in the seventy-ninth aspect, the catalyst holding unit is rotatably configured. The substrate processing apparatus includes a rotational position sensor configured to detect a rotational position of the catalyst holding unit, and a position sensor configured to detect a position of the catalyst holding unit relative to the substrate holding unit.

According to an eighty-first aspect of the present invention, in the eightieth aspect, the substrate processing apparatus includes a voltage control device configured to apply a voltage to between each of the regions of the catalyst and the counter electrode. The voltage control device receives the rotational position of the catalyst holding unit that is detected by the rotational position sensor and the position of the catalyst holding unit relative to the substrate holding unit that is detected by the position sensor, and control the voltage to each of the regions of the catalyst according to the rotational position of the catalyst holding unit and the position of the catalyst holing unit relative to the substrate holding unit.

An eighty-second aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, a catalyst holding unit configured to hold the catalyst and including a plurality of catalyst holding members for holding the catalyst, and a pressure control mechanism configured to control the each of catalyst holding members independently and control a contact pressure between the substrate and the catalyst when the substrate and the catalyst are in contact with each other.

According to an eighty-third aspect of the present invention, in the eighty-second aspect, the pressure control mechanism controls the contact pressure between the substrate and the catalyst by controlling a pressure or a flow amount of fluid supplied into the plurality of catalyst holding members.

According to an eighty-fourth aspect of the present invention, in the eighty-second aspect, the pressure control mechanism includes piezoelectric elements attached to the plurality of catalyst holding members, and controls the contact pressure between the catalyst and the substrate by controlling each of the piezoelectric elements independently.

According to an eighty-fifth aspect of the present invention, in any one of the eighty-second to eighty-fourth aspects, the catalyst holding unit is rotatably configured. The substrate processing apparatus includes a rotational position sensor configured to detect a rotational position of the catalyst holding unit, and a position sensor configured to detect a position of the catalyst holding unit relative to the substrate holding unit.

According to an eighty-sixth aspect of the present invention, in the eighty-fifth aspect, the pressure control mechanism receives a signal indicating the rotational position of the catalyst holding unit that is detected by the rotational position sensor and a signal indicating the position of the catalyst holding unit relative to the substrate holding unit that is detected by the position sensor, and controls contact pressures between the substrate and the catalyst at the plurality of catalyst holding members independently according to the rotational position of the catalyst holding unit and the position of the catalyst holing unit relative to the substrate holding unit.

According to an eighty-seventh aspect of the present invention, in any one of the eighty-second to eighty-sixth aspects, each of the plurality of catalyst holding members includes a pressure sensor configured to detect the contact pressure between the substrate and the catalyst.

According to an eighty-eighth aspect of the present invention, in the eighty-seventh aspect, the pressure control mechanism receives a signal indicating the pressure detected by each of the pressure sensors, and controls the contact pressures between the substrate and the catalyst at the plurality of catalyst holding members independently so that the substrate and the catalyst are in contact with each other with a pressure that achieves a predetermined contact pressure distribution.

An eighty-ninth aspect of the present invention provides a substrate processing apparatus for processing a processing target region of a substrate by bringing the substrate and a catalyst into contact with each other in the presence of processing liquid. The substrate processing apparatus includes a catalyst holding unit configured to hold the catalyst and including a plurality of catalyst holding members for holding the catalyst, and a processing liquid supply unit including a plurality of processing liquid supply passages and a plurality of processing liquid supply ports for supplying the processing liquid passed through an inside of the catalyst holding unit onto the processing target region of the substrate. Each of the plurality of processing liquid supply passages is configured to allow a flow amount of the processing liquid to be adjusted independently.

According to a ninetieth aspect of the present invention, in the eighty-ninth aspect, each of the plurality of processing liquid supply passages is provided with a flowmeter for measuring the flow amount of the processing liquid and a valve for adjusting the flow amount of the processing liquid.

According to a ninety-first aspect of the present invention, in the eighty-ninth or ninetieth aspect, the substrate processing apparatus includes a pressure control mechanism configured to control the plurality of catalyst holding members independently to control a contact pressure between the substrate and the catalyst independently for each of the plurality of catalyst holding members when the substrate and the catalyst are in contact with each other.

According to a ninety-second aspect of the present invention, in the ninety-first aspect, the pressure control mechanism controls the contact pressure between the substrate and the catalyst by supplying fluid into each of the plurality of catalyst holding members.

According to a ninety-third aspect of the present invention, in the ninety-first aspect, the pressure control mechanism includes piezoelectric elements attached to the plurality of catalyst holding members, and controls a distribution of the contact pressure between the catalyst and the substrate by controlling each of the piezoelectric elements independently.

A ninety-fourth aspect of the present invention provides a substrate processing apparatus for processing a processing target region of a substrate by bringing the disk-shaped substrate and a catalyst into contact with each other in the presence of processing liquid. The substrate processing apparatus includes a substrate holding unit configured to hold the substrate, a catalyst holding unit configured to hold the catalyst, and a driving unit configured to move the substrate holding unit and the catalyst holding unit relative to each other with the processing target region of the substrate and the catalyst kept in contact with each other. The substrate holding unit has a circular region for holding the substrate. The catalyst holding unit includes a catalyst holding member for holding the catalyst. The catalyst holding member has a substantially fan-like shape or triangular shape overlapping the substrate from a central portion of the substrate to a part of an outer edge of the substrate with the disk-shaped substrate and the catalyst kept in contact with each other.

According to a ninety-fifth aspect of the present invention, in the ninety-fourth aspect, the driving unit is configured to be able to move the catalyst holding unit in a radial direction of the circler region for holding the substrate.

According to a ninety-sixth aspect of the present invention, in the ninety-fourth or ninety-fifth aspect, the catalyst holding member includes a groove configured to allow the processing liquid to pass through between the catalyst holding member and the substrate with the catalyst holding member and the substrate kept in contact with each other.

A ninety-seventh aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, a catalyst holding unit configured to hold the catalyst, and a driving unit configured to move the substrate holding unit and the catalyst holding unit relative to each other with the processing target region of the substrate and the catalyst kept in contact with each other. The catalyst holding unit includes a catalyst holding member for holding the catalyst. The catalyst holding member includes a plurality of spherical bodies or a plurality of cylindrical bodies with a layer of the catalyst formed on special surfaces of the spherical bodies or circumferential surfaces of the cylindrical bodies. The plurality of spherical bodies or the plurality of cylindrical bodies is configured to be held in such a manner that, when the substrate holding unit and the catalyst holding unit are moved relative to each other, the plurality of spherical bodies or the plurality of cylindrical bodies is rotatable according to this relative movement.

A ninety-eighth aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, and a catalyst holding unit configured to hold the catalyst. The catalyst holding unit is configured to be able to vibrate in a direction perpendicular to a surface of the substrate.

According to a ninety-ninth aspect of the present invention, in the ninety-eighth aspect, the catalyst holding unit includes a piezoelectric element. The substrate processing apparatus includes a power source configured to apply an alternating-current to the piezoelectric element.

A hundredth aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate and including a plurality of substrate holding stages each configured to hold a single substrate, and a plurality of catalyst holding units each associated with corresponding one of the plurality of substrate holding stages and configured to hold the catalyst.

According to a hundred and first aspect of the present invention, in the hundredth aspect, at least some of the plurality of catalyst holding units hold different kinds of catalysts.

A hundred and second aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, and a plurality of catalyst holding units configured to hold the catalyst.

According to a hundred and third aspect of the present invention, in the hundred and second aspect, the substrate processing includes a conditioning unit configured to condition a surface of the catalyst.

According to a hundred and fourth aspect of the present invention, in the hundred and second or hundred and third aspect, at least some of the plurality of catalyst holding units are operable under different processing conditions.

According to a hundred and fifth aspect of the present invention, in any one of the hundred and second to hundred and fourth aspects, at least some of the plurality of catalyst holding units have regions for holding the catalyst that are different from each other or one another in area.

According to a hundred and sixth aspect of the present invention, in any one of the hundred and second to hundred and fifth aspects, at least some of the plurality of catalyst holding units hold different kinds of catalysts.

A hundred and seventh aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, a catalyst holding unit configured to hold the catalyst for processing the substrate held on the substrate holding unit, and a substrate cleaning unit configured to clean the substrate held on the substrate holding unit.

A hundred and eighth aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate, a catalyst holding unit configured to hold the catalyst, and a processing liquid supply unit including a supply port for supplying the processing liquid onto the processing target region of the substrate. A region of the substrate holding unit for holding the substrate tilts by a predetermined angle with respect to a horizontal plane. The supply port of the processing liquid supply unit is disposed on an upper side with respect to the catalyst holding unit in terms of the gravity with the substrate and the catalyst kept in contact with each other.

According to a hundred and ninth aspect of the present invention, in the hundred and eighth aspect, the processing liquid supply unit is configured in such a manner that the supply port is movable together with the supply port.

A hundred and tenth aspect of the present invention provides a substrate processing apparatus for processing a processing target region of a substrate by bringing the substrate and a catalyst into contact with each other in the presence of processing liquid. The substrate processing apparatus includes a catalyst holding unit configured to hold the catalyst. The catalyst holding unit includes a catalyst temperature control mechanism for controlling a temperature of the catalyst.

According to a hundred and eleventh aspect of the present invention, in the hundred and tenth fourth aspect, the catalyst temperature control mechanism includes a Peltier element.

A hundred and twelfth aspect of the present invention provides a substrate processing system. The substrate processing system includes the substrate processing apparatus according to any one of the first to thirty-second aspects and the forty-third to the hundred and eleventh aspects, a substrate cleaning unit configured to clean the substrate, a substrate drying unit for drying the cleaned substrate, and a substrate transfer unit configured to transfer the substrate.

According to a hundred and thirteenth aspect of the present invention, in the hundred and twelfth aspect, the substrate transfer unit is configured to be able to transfer the substrate in a wet status and the substrate in a dry status separately.

A hundred and fourteenth aspect of the present invention provides a substrate processing system. The substrate processing system includes the substrate processing apparatus according to any one of the first to thirty-second aspects and the forty-third to the hundred and eleventh aspects, and a deposition apparatus configured to perform deposition processing on the substrate.

According to a hundred and fifteenth aspect of the present invention, in the hundred and fourteenth aspect, the deposition apparatus includes at least one of a chemical vapor deposition (CVD) apparatus, a sputtering apparatus, a plating apparatus, and a coater apparatus.

A hundred and sixteenth aspect of the present invention provides a substrate processing apparatus for processing a processing target region of a substrate by bringing the substrate and a catalyst into contact with each other in the presence of processing liquid. The substrate processing apparatus includes a catalyst holding unit configured to hold the catalyst. The catalyst holding unit includes an elastic member, and a film attached to the elastic member to hold the catalyst.

According to a hundred and seventeenth aspect of the present invention, in the hundred and sixteenth aspect, the film is made from resin.

According to a hundred and eighteenth aspect of the present invention, in the hundred and sixteenth or hundred and seventeenth aspect, the film includes a groove configured in such a manner that the processing liquid can flow in a plane of the substrate between the catalyst and the substrate with the catalyst and the substrate kept in contact with each other.

According to a hundred and nineteenth aspect of the present invention, in the hundred and eighteenth aspect, a cross-sectional shape of the groove is such a trapezoidal shape that a width of the groove is wider at an opening of the groove than at a bottom of the groove.

According to a hundred and twentieth aspect of the present invention, in any one of the hundred and sixteenth to hundred nineteenth aspects, the catalyst holding unit includes a processing liquid supply unit provided with a plurality of processing liquid supply passages and a plurality of processing liquid supply ports for transmitting the processing liquid in the catalyst holding unit to supply the processing liquid to the processing target region of the substrate.

A hundred and twenty-first aspect of the present invention provides a substrate processing apparatus for processing a processing target region of a substrate by bringing the substrate and a catalyst into contact with each other in the presence of processing liquid. The substrate processing apparatus includes a catalyst holding unit configured to hold the catalyst. The catalyst holding unit includes an elastic member and a layer of a harder material than the elastic member that is disposed between the elastic member and the catalyst.

A hundred and twenty-second aspect of the present invention provides a substrate processing apparatus for processing a processing target region of a substrate by bringing the substrate and a catalyst into contact with each other in the presence of processing liquid. The substrate processing apparatus includes a catalyst holding unit configured to hold the catalyst. The catalyst holding unit includes an inlet passage for supplying the processing liquid to a surface of the catalyst, and an outlet passage for collecting the processing liquid from the surface of the catalyst.

A hundred and twenty-third aspect of the present invention provides a substrate processing apparatus for processing a processing target region of a substrate by bringing the substrate and a catalyst into contact with each other in the presence of processing liquid. The substrate processing apparatus includes a monitoring unit configured to monitor a status of processing for etching the processing target region of the substrate.

According to a hundred and twenty-fourth aspect of the present invention, in the hundred and twenty-third aspect, the substrate processing apparatus includes a control unit configured to control an operation of the substrate processing apparatus. The control unit is configured to control at least one parameter in a condition of the processing performed on the substrate in process based on the status of the processing for etching the substrate that is acquired by the monitoring unit.

According to a hundred and twenty-fifth aspect of the present invention, in the hundred and twenty-third aspect, the control unit is configured to determine an end point of the processing based on the status of the processing for etching the substrate that is acquired by the monitoring unit.

According to a hundred and twenty-sixth aspect of the present invention, in the hundred and twenty-third or hundred and twenty-fifth aspect, the substrate processing apparatus includes a catalyst holding unit configured to hold the catalyst. The monitoring unit includes a torque current monitoring unit configured to monitor the status of the processing for etching the substrate based on a torque current of the driving unit when the catalyst holding unit and a substrate holding unit are moved relative to each other.

According to a hundred and twenty-seventh aspect of the present invention, in the hundred and twenty-third aspect, the substrate processing apparatus includes a substrate holding unit configured to hold the substrate, and a catalyst holding unit configured to hold the catalyst. The monitoring unit includes a torque current monitoring unit configured to monitor the status of the processing for etching the substrate based on at least one of a torque current when the catalyst holding unit is rotationally driven and a torque current when the substrate holding unit is rotationally driven.

According to a hundred and twenty-eighth aspect of the present invention, in the hundred and twenty-third aspect, the substrate processing apparatus includes a substrate holding unit configured to hold the substrate, and a catalyst holding unit configured to hold the catalyst. The monitoring unit includes a vibration sensor provided to the catalyst holding unit. The vibration sensor is configured to detect a vibration when the substrate holding unit and the catalyst holding unit are moved relative to each other. The monitoring unit is configured to monitor the status of the processing for etching the substrate by detecting a change in the vibration detected by the vibration sensor.

A hundred and twenty-ninth aspect of the present invention provides a substrate processing apparatus for processing a processing target region of a substrate by bringing the substrate and a catalyst into contact with each other in the presence of processing liquid. The substrate processing apparatus includes a catalyst holding unit configure to hold the catalyst. The catalyst holding unit includes a disk holder portion, and a catalyzer disk portion coupled detachably from the disk holder portion. The catalyzer disk portion includes a catalyst holding unit having a surface where the catalyst is held, a catalyst electrode electrically connected to the catalyst, and a counter electrode. The disk holder portion includes a catalyst electrode wiring electrically connected to the catalyst electrode, a counter electrode wiring electrically connected to the counter electrode, and a contact probe for electrically connecting the catalyst electrode to the catalyst electrode wiring and a contact probe for electrically connecting the counter electrode to the couther electrode wiring when the disk holder portion and the catalyzer disk portion are coupled with each other. The substrate processing apparatus includes power source for applying a voltage to between the catalyst electrode and the counter electrode.

A hundred and thirtieth aspect of the present invention provides a substrate processing apparatus for processing a processing target region of a substrate by bringing the substrate and a catalyst into contact with each other in the presence of processing liquid. The substrate processing apparatus includes a catalyst holding unit configured to hold the catalyst, and a swing arm configured to be able to move the catalyst holding unit in a direction perpendicular to a surface of the substrate. The swing arm is attached to the catalyst holding unit. The swing arm includes a load cell configured to measure a contact pressure when the catalyst of the catalyst holding unit is in contact with the substrate.

According to a hundred and thirty-first aspect of the present invention, in the hundred and thirtieth aspect, the substrate processing apparatus includes a PID controller configured to control a pressure with which the catalyst and the substrate are in contact with each other based on the contact pressure measured by the load cell.

According to a hundred and thirty-second aspect of the present invention, in the hundred and thirtieth aspect, the swing arm includes a cover surrounding the entire swing arm, and is configured to be able to supply air and/or nitrogen into the cover.

A hundred and thirty-third aspect of the present invention provides a substrate processing apparatus for processing a processing target region of a substrate by bringing the substrate and a catalyst into contact with each other in the presence of processing liquid. The substrate processing apparatus includes a substrate holding unit configured to hold the substrate. The substrate holding unit includes a substrate holding stage and a vacuum suction plate for holding the substrate onto the substrate holding stage with use of vacuum suction. The vacuum suction plate includes a suction bore. The substrate holding unit includes a vacuum line in fluid communication with the suction bore of the vacuum suction plate. The vacuum line is configured to be able to carry out vacuum suction of the substrate onto the vacuum suction plate by vacuuming, and release the vacuum suction by supplying water and/or air or nitrogen to the vacuum line.

A hundred and thirty-fourth aspect of the present invention provides a method for processing a processing target region of a substrate by bringing the substrate and a catalyst into contact with each other in the presence of processing liquid. The method includes supplying the processing liquid to the processing target region of the substrate, bringing the catalyst into contact with the processing target region of the substrate, moving the substrate and the catalyst relative to each other with the substrate and the catalyst kept in contact with each other, cleaning the substrate with a chemical, cleaning the substrate with water, and conditioning a surface of the catalyst while cleaning the substrate with the chemical or the water.

The present invention can also be realized by freely combining or omitting at least a part of the components of any of the above-described aspects or components of embodiments that will be described below, besides the above-described aspects. Several specific examples thereof will be described now. For example, an aspect of the present invention may be an arbitrary substrate processing apparatus including at least one of a substrate holding unit configured to hold a substrate, a catalyst holding unit configured to hold a catalyst, and a driving unit configured to move the substrate holding unit and the catalyst holding unit relative to each other with a processing target region of the substrate and the catalyst kept in contact with each other, and having a part of the features described in the present disclosure. Alternatively, an aspect of the present invention may be an arbitrary substrate processing apparatus including at least one of a substrate holding unit configured to hold a substrate, a catalyst holding unit configured to hold a catalyst, and a driving unit configured to move the substrate holding unit and the catalyst holding unit relative to each other with a processing target region of the substrate and the catalyst kept in contact with each other, in which the catalyst includes two or more kinds of individual catalysts, or is a mixture or a compound containing two kinds of catalysts. Alternatively, an aspect of the present invention may be an arbitrary substrate processing apparatus including at least one of a substrate holding unit configured to hold a substrate, a catalyst holding unit configured to hold a catalyst, and a driving unit configured to move the substrate holding unit and the catalyst holding unit relative to each other with a processing target region of the substrate and the catalyst kept in contact with each other, in which the catalyst holding unit includes a spherical body or a cylindrical body with a layer of the catalyst formed on a spherical surface of the spherical body or a circumferential surface of the cylindrical body, and the spherical body or the cylindrical body is configured in such a manner that, when the substrate holding unit and the catalyst holding unit are moved relative to each other, the spherical body or the cylindrical body is rotatable according to this relative movement. It should be noted that, in these aspects, the catalyst does not necessarily have to be smaller than the substrate, which is one of characteristic features of the first aspect.

Further, the specific features of the components in the above-described aspects or the components in the embodiments that will be described below can be treated separately from one another, and can be omitted as needed. For example, the processing liquid temperature adjustment unit in the fifteenth aspect can be modified into a component configured to adjust the temperature of the processing liquid to a predetermined temperature without the range from ten degrees to sixth degrees, inclusive. Having described several modifications other than the first to forty-second aspects, but they are merely one example. The present invention can also be realized by arbitrarily combining or omitting at least a part of the components describe in the present disclosure and the respective specific features of these components, as long as at least a part of the above-described problems can be solved or at least a part of the above-described effects can be brought about.

DESCRIPTION OF EMBODIMENTS

In the following description, embodiments of a substrate processing apparatus and a substrate processing system including the substrate processing apparatus according to the present invention will be described with reference to the drawings. The drawings and the following description cover only characteristic features of the embodiments as will be described below, and refrain from elaborating other components herein. The present invention can be embodied with use of features of other embodiments and known techniques in terms of the components undiscussed herein.

A. First Embodiment

Figure 1:
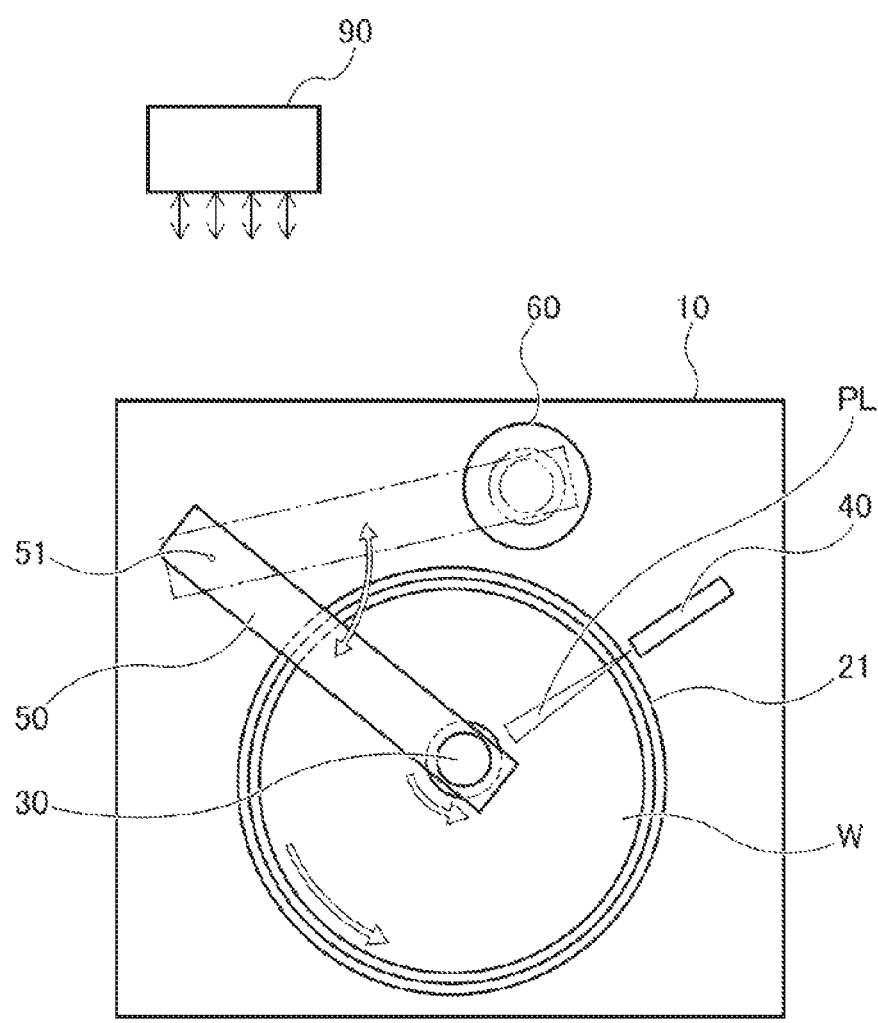
FIG. 1 is a schematic plan view schematically illustrating a configuration of a substrate processing apparatus as one embodiment of the present invention.
Figure 2:
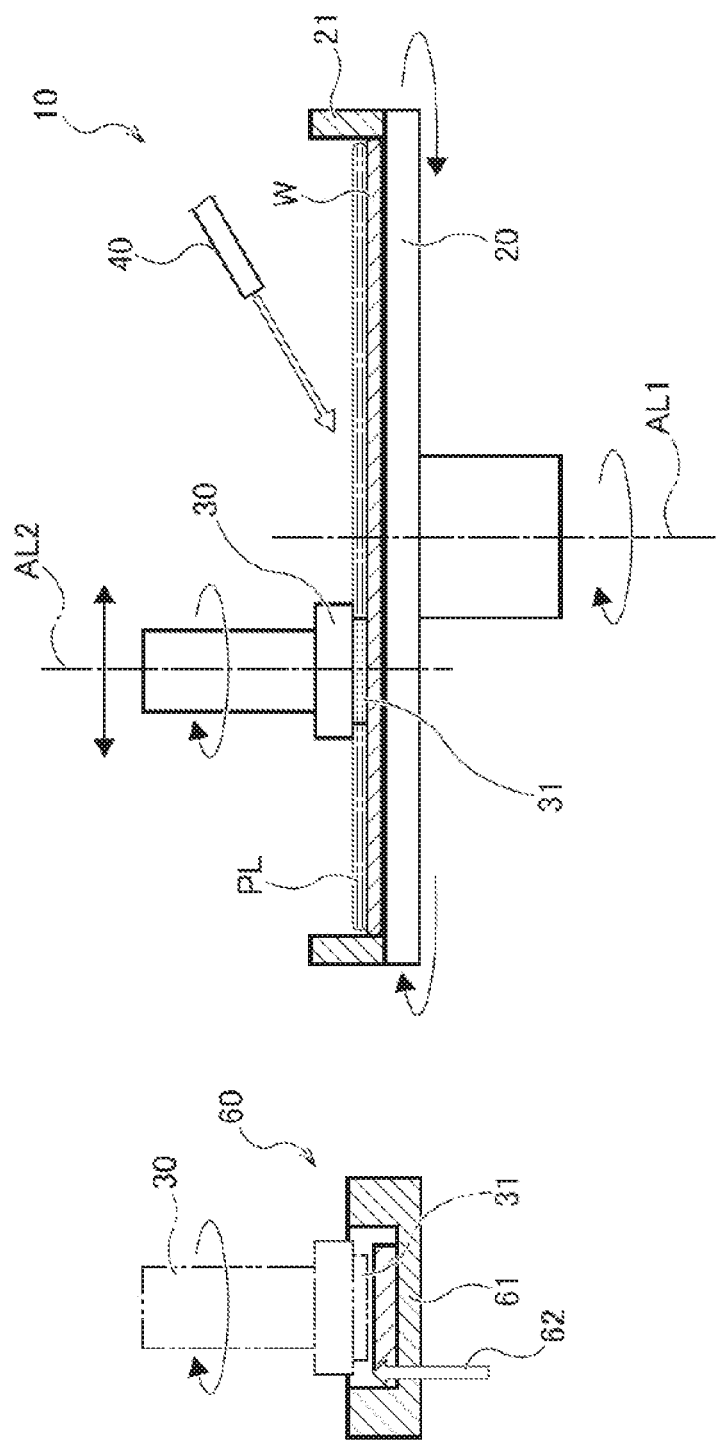
FIG. 2 is a schematic side view of the substrate processing apparatus.

FIG. 1 is a schematic plan view of a substrate processing apparatus 10 of a substrate processing system as one embodiment of the present invention. FIG. 2 is a side view of the substrate processing apparatus 10 illustrated in FIG. 1. The substrate processing apparatus 10 is an apparatus that performs etching processing on a semiconductor material (a processing target region) on a substrate with use of the CARE method. The substrate processing system includes the substrate processing apparatus 10, a substrate cleaning unit configured to clean the substrate, and a substrate transfer unit configured to transfer the substrate. Further, the substrate processing system may include a substrate drying unit (not illustrated) if necessary. The substrate transfer unit is configured to be able to transfer a substrate in a wet status and a substrate in a dry status separately. Further, the substrate processing system may perform processing based on the conventional CMP method before or after the processing performed by the present substrate processing apparatus depending on the kind of the substrate material, and therefore may further include a CMP apparatus. Further, the substrate processing system may include a deposition apparatus, such as a chemical vapor deposition (CVD) apparatus, a sputtering apparatus, a plating apparatus, and a coater apparatus. In the present embodiment, the substrate processing apparatus 10 is configured as a separate unit from the CMP apparatus. The substrate cleaning unit, the substrate transfer unit, and the CMP apparatus are known techniques, so that they are not illustrated and will not be described in the following description.

The substrate processing apparatus 10 includes a substrate holding unit 20, a catalyst holding unit 30, a processing liquid supply unit 40, a swing arm 50, a conditioning unit 60, and a control unit 90. The substrate holding unit 20 is configured to hold a wafer W, which is one kind of substrate. In the present embodiment, the substrate holding unit 20 holds the wafer W in such a manner that the wafer W is placed with a polishing target surface face up. Further, in the present embodiment, the substrate holding unit 20 includes a vacuum suction mechanism equipped with a vacuum suction plate that sucks a back surface of the wafer W (an opposite surface from the polishing target surface) with vacuum as a mechanism for holding the wafer W. The vacuum suction may be carried out by any method of a point suction method using a suction plate including a plurality of suction holes connected to a suction line on a suction surface thereof, and a surface suction method using a suction surface including grooves (for example, concentrically formed grooves) to suck the wafer via connection holes formed in the grooves that lead to a vacuum line. Further, a packing member may be attached on the surface of the suction plate and the wafer W may be sucked via this packing member so that the suction status can be stabilized. However, the mechanism for holding the wafer W can be any known mechanism, and for example, may be a clamp mechanism that clamps the front surface and the back surface of the wafer W on at least one portion along a circumferential edge of the wafer W or a roller chuck mechanism that holds a side surface of the wafer W on at least one portion along the circumferential edge of the wafer W. This substrate holding unit 20 is configured rotatably around an axis AL1 by a driving unit motor and an actuator (not illustrated). Further, in FIGS. 1 and 2, the substrate holding unit 20 includes a vertically upwardly extending wall 21 throughout an entire circumferential direction outside a region of the substrate holding unit 20 for holding the wafer W. This provision allows processing liquid to be held within a wafer surface, resulting in a reduction in a consumed amount of the processing liquid. In FIGS. 1 and 2, the wall 21 is fixed on an outer periphery of the substrate holding unit 20, but may be configured as a separate member from the substrate holding unit. In this case, the wall 21 may be configured vertically movability. The vertical movability allows the processing liquid to be kept by a variable amount, and, for example, allows cleaning liquid to be efficiently discharged out of the wafer W by a downward movement of the wall 21 if a surface of the substrate is supposed to be cleaned after the etching processing.

Figure 62:
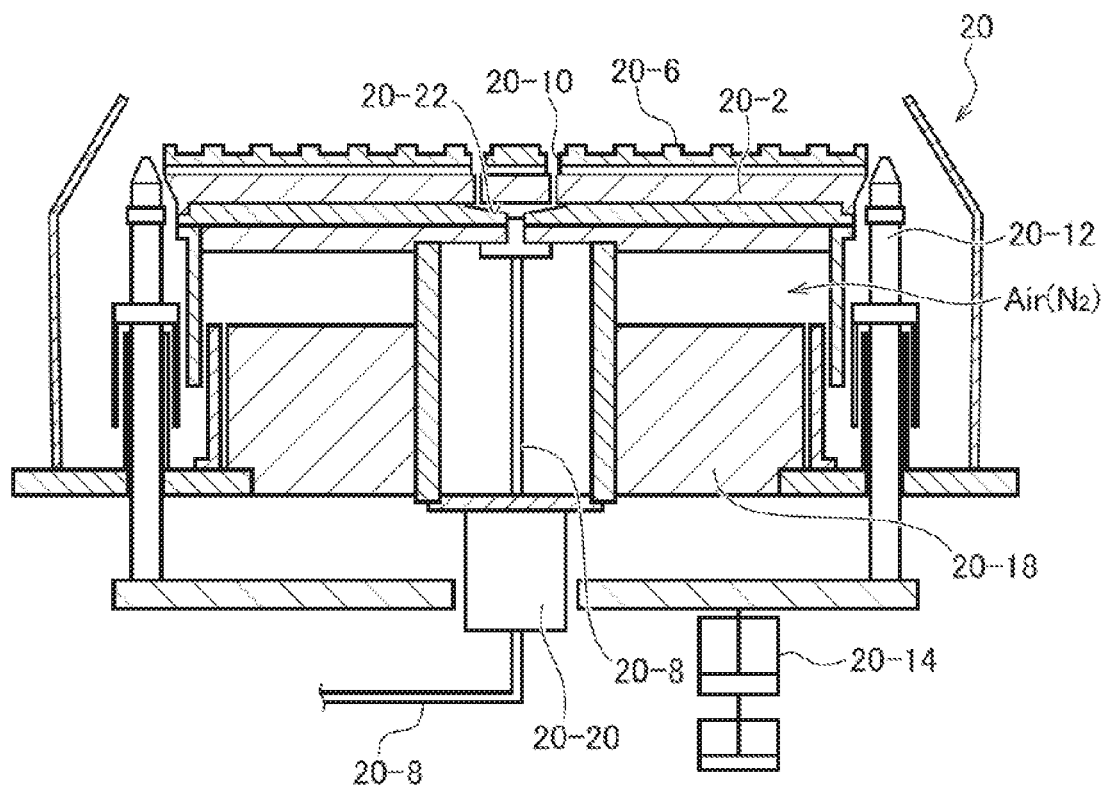
FIG. 62 is a schematic side cross-sectional view illustrating a substrate holding unit as one embodiment.

FIG. 62 is a schematic side cross-sectional view illustrating the substrate holding unit 20 as one embodiment. The illustrated substrate holding unit 20 includes a wafer holding stage 20-2 that holds the wafer W. The substrate holding unit 20 according to the illustrated embodiment holds the wafer W in such a manner that the wafer W is placed with the processing target surface thereof face up. Further, in the present embodiment, the substrate holding unit 20 includes the vacuum suction mechanism provided with a vacuum suction plate 20-6 that sucks the back surface of the wafer W with vacuum as the mechanism for holding the wafer W. The vacuum suction plate 20-6 can be attached to the wafer holing stage 20-2 by means of, for example, a double-sided tape or a screw. The wafer holding stage 20-2 is rotatable by a motor 20-18. As one embodiment, the substrate holding unit 20 can be configured to be able to supply air or nitrogen to around the motor 20-18. The CARE processing may use a highly corrosive chemical, whereby a higher pressure in the substrate holding unit 20 than an outer atmospheric pressure contributes to preventing processing liquid PL from entering the substrate holding unit 20, thereby succeeding in protecting the motor and the like against corrosion. A plurality of suction holes 20-10, which is connected to a vacuum line 20-8, is formed through the wafer holding stage 20-2 and the vacuum suction plate 20-6. In the illustrated embodiment, the suction holes 20-10 are located around centers of the wafer holding stage 20-2 and the vacuum suction plate 20-6. This positioning can reduce a size of a liquid reservoir portion 20-22 inside the wafer holding stage 20-2. The vacuum line 20-8 can be connected to a not-illustrated vacuum source via a rotary joint 20-20. Further, the vacuum line 20-8 can supply water and/or air (or nitrogen) by a switching valve, and releases the suction of the wafer W by supplying the water and/or the air (or the nitrogen). The substrate holding unit 20 includes a plurality of vertically movable lift pins 20-12 outside the wafer holding stage 20-2. A cylinder mechanism 20-14 is coupled with the lift pines 20-12, and the lift pins are vertically movable by the cylinder mechanism 20-14. When the lift pins 20-12 are moved upward, the substrate holding unit 20 can lift the wafer W from the wafer holding stage 20-2 to transfer the wafer W to a transfer mechanism. Further, when the wafer W is transferred from the transfer mechanism, the substrate holding unit 20 also receives the wafer W with the lift pins 20-1 located at upward moved positions. The substrate holding unit 20 includes a cup 20-18 surrounding around the wafer holding stage 20-2. The cup 20-18 prevents liquid such as the processing liquid PL from being scattered around while the wafer W is processed.

Figure 63:
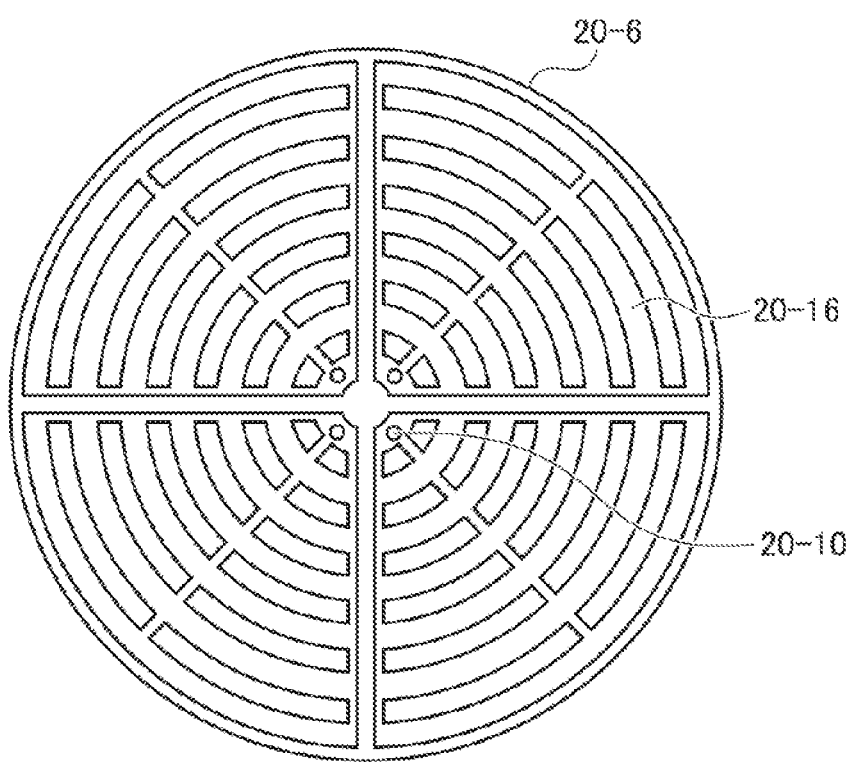
FIG. 63 is a top view illustrating a vacuum suction plate as one embodiment.

FIG. 63 is a top view illustrating the vacuum suction plate 20-6 as one embodiment. As illustrated in FIG. 63, the plurality of suction holes 20-10 (four suction holes 20-10 in FIG. 63) is formed through the vacuum suction plate 20-6. A groove pattern 20-16 including concentric grooves is radially and circumferentially formed on a surface of the vacuum suction plate 20-6. A material of the vacuum suction plate 20-6 may be a rubber material, or a resin material such as a PEEK material. However, the rubber material may have the possibility of difficulty of wafer W release by sticking the wafer W to the rubber material or contamination of the back surface of the wafer W. In consideration of this possibility, for example, the surface of the rubber material may be subjected to a treatment such as surface roughening processing or provision of a coating material. On the other hand, the resin material may cause insufficient vacuum suction or damage incurred on the back surface of the wafer W depending on hardness and workability of the material. In consideration of this influence, the suction surface may be provided with a protection film, a coating material, or the like.

The catalyst holding unit 30 according to the embodiment illustrated in FIGS. 1 and 2 is configured to hold a catalyst 31 at a lower end thereof. In the present embodiment, the catalyst 31 is smaller than the wafer W. More specifically, a projected area of the catalyst 31, which is defined by projecting the catalyst 31 from the catalyst 31 toward the wafer W, is smaller than an area of the wafer W. Further, the catalyst holding unit 30 is configured rotatably around an axis AL2 by a driving unit, i.e., an actuator (not illustrated). Further, the catalyst holding unit 30 include a motor and an air cylinder (not illustrated) for sliding the catalyst 31 of the catalyst holding unit 30 in contact with the wafer W, at a swing arm 50 thereof, which will be described below. Next, the processing liquid supply unit 40 is configured to supply the processing liquid onto the surface of the wafer W. In FIGS. 1 and 2, the substrate processing apparatus 10 includes the single processing liquid supply unit 40, but may include a plurality of processing liquid supply units 40. In this case, different kinds of processing liquid may be supplied from the processing liquid supply units, respectively. Further, if the present substrate processing apparatus 10 is supposed to clean the front surface of the wafer W after the etching processing, a cleaning chemical or water may be supplied from the processing liquid supply unit 40. Next, the swing arm 50 is configured swingably around a rotational center 51 and is further configure vertically movably by a driving unit, i.e., an actuator (not illustrated). The catalyst holding unit 30 is rotatably mounted at a distal end (an opposite end from the rotational center 51) of the swing arm 50.

Figure 3:
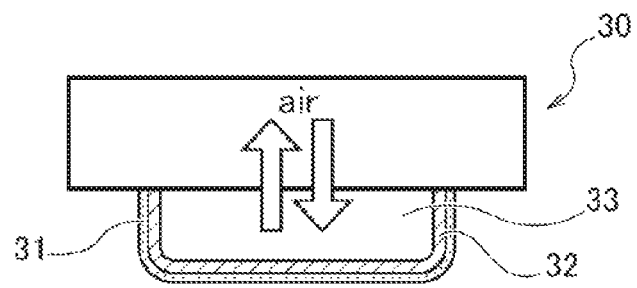
FIG. 3 is a schematic cross-sectional view illustrating details of a catalyst holding unit.
Figure 3:
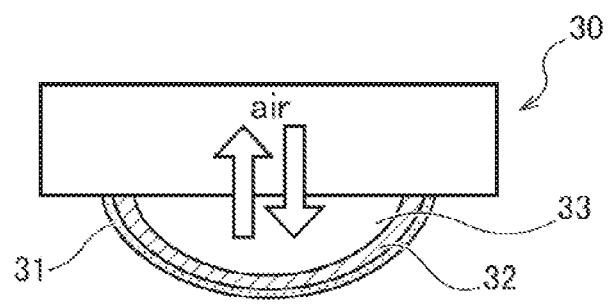

FIGS. 3(a) and (b) are schematic cross-sectional views illustrating details of the catalyst holding unit 30. As illustrated in FIG. 3(a), the catalyst holding unit 30 includes an elastic member 32 for holding the catalyst 31. The elastic member 32 is made of an elastic film, and a pressure chamber 33 is formed inside the elastic member (elastic film) 32. A layer of the catalyst 31 is formed on an outer surface of the elastic film 32. In the present embodiment, the catalyst 31 is deposited onto the outer surface of the elastic member 32. Further, examples of a method for depositing the catalyst 31 include a physical vapor deposition method such as resistive heating vapor deposition and sputter vapor deposition, and a chemical vapor deposition method such as CVD. Further, the catalyst 31 may be deposited by another deposition method, such as electrolytic plating and non-electrolytic plating. Further, desirably, a thickness of the deposited catalyst is approximately 100 nm to several dozen μm. The reason therefor is as follows. An extremely thin thickness of the deposited catalyst leads to the necessity of replacing the catalyst frequently due to deterioration of the catalyst worn when the catalyst is in contact with the wafer W with a relative motion generated therebetween. On the other hand, a great thickness of the deposited catalyst leads to rigidity of the catalyst itself that is enhanced enough to dominate the elasticity of the elastic member when the catalyst and the wafer W are in contact with each other, resulting in deterioration of adhesibility to the wafer W that can be established with the aid of the elasticity owned by the elastic member. The present deposition may fail to achieve sufficient adhesibility to the catalyst 31 depending on the kind of the elastic member 32. In this case, for example, an adhesive layer, such as carbon, titan, chrome, and tantalum, may be formed on the elastic member 32 in advance and the catalyst 31 may be formed after that to improve the adhesibility between the elastic member 32 and the catalyst 31. Alternatively, the catalyst 31 prepared in the form of a plate may be fixed to the elastic member 32. Alternatively, the catalyst 31 may be formed by impregnation of the elastic member 32 with the catalyst 31, or may be formed from a mixture of an elastic member material and a catalyst material. The pressure chamber 33 is configured to control a contact pressure between the processing target region of the wafer W and the catalyst 31 by control of fluid (air in the present example, but may be nitrogen gas or the like) supplied into the pressure chamber 33 by a fluid source (not illustrated). According to this configuration, when the processing target region of the wafer W and the catalyst 31 are brought into contact with each other, the elastic member 32 is deformed, which allows the catalyst 31 to evenly contact the wafer W in conformity with the shape of the wafer W (warpage and the like of the wafer W), resulting in succeeding in etching a contact portion between the catalyst 31 and the wafer W at an uniform etching rate.

In the present embodiment, the pressure chamber 33 has a substantially cuboid shape or cylindrical shape as illustrated in FIG. 3(a). However, the shape of the pressure chamber 33 may be any arbitrary shape. For example, the pressure chamber 33 may have a circular arc shape or a semi-circular shape as illustrated in FIG. 3(b). The use of a simple shape for the pressure chamber 33 in this manner allows the catalyst 31 and the wafer W to be kept in contact with each other in a further even manner.

Figure 4:
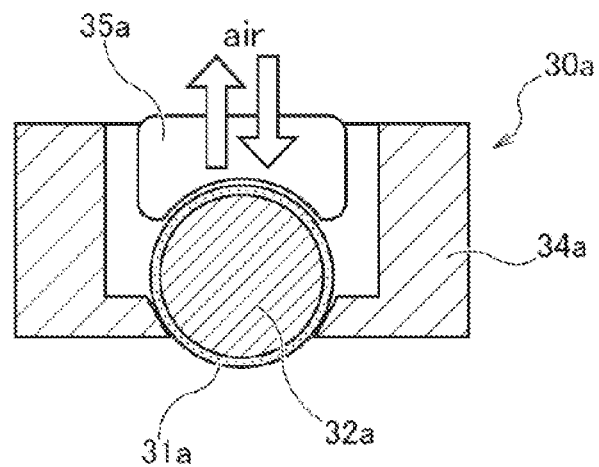
FIG. 4 is a schematic cross-sectional view illustrating another example of the catalyst holding unit.

FIG. 4 is a schematic cross-sectional view illustrating details of a catalyst holding unit 30a as another embodiment. The catalyst holding unit 30a includes an elastic member 32a. The elastic member 32a is configured as a spherical member. A layer of a catalyst 31a is formed on an outer surface of the elastic member 32a. The elastic member 32a is rotatably held by a support frame 34a with a bottom of the elastic member 32a exposed. According to this configuration, when the catalyst holding unit 30a and the substrate holding unit 20 are moved relative to each other, the elastic member 32a rotates according to this relative movement. According to this configuration, when the processing target region of the wafer W and the catalyst 31a are brought into contact each other, the elastic member 32a is deformed, which allows the catalyst 31a to evenly contact the wafer W in conformity with the shape of the wafer W (the warpage and the like of the wafer W), resulting in succeeding in etching the contact portion between the catalyst 31 and the wafer W at an uniform etching rate. Further, this configuration can reduce friction between the processing target surface of the wafer W and the catalyst 31a when the substrate holding unit 20 and the catalyst holding unit 30a are moved relative to each other. Therefore, the processing target surface can be prevented from being damaged or can be kept less damaged from the friction. Further, in the present embodiment, the catalyst holding unit 30a includes a pressure adjustment portion 35a. In the present embodiment, the pressure adjustment portion 35a is made of an elastic film with a pressure chamber formed therein, similarly to the above-described elastic member 32. The pressure adjustment portion 35a is configured to adjust the contact pressure between the processing target region of the wafer W and the catalyst 31a by an adjustment of a force pressing the elastic member 32a toward the wafer W side with the aid of fluid supplied from a fluid source (not illustrated). The pressure adjustment portion 35a may be an elastic member prepared in another form, such as a plate spring. The elastic member 32a may be pressed toward the wafer W side in a contactless manner, like an air bearing.

Exemplary candidates of the materials of the elastic members 32 and 32a illustrated in FIGS. 3(a) and (b), and 4 include nitrile rubber, hydrogenated nitrile rubber, fluorine-contained rugger, silicon rubber, ethylene-propylene rubber, chloroprene rubber, acrylic rubber, butyl rubber, urethane rubber, isoprene rubber, styrene-butadiene rubber, butadiene rubber, polyethylene rubber, epichlorohydrin rubber, polytetrafluoroethylene, polytrifluorochloroethylene, perfluoroalkyl, fluorinated ethylene propylene, polycarbonate, polyethylene, vinyl chloride, polymethylmethacrylate (acrylic), polypropylene, polyether ether ketone, and polyimide.

Figure 5:
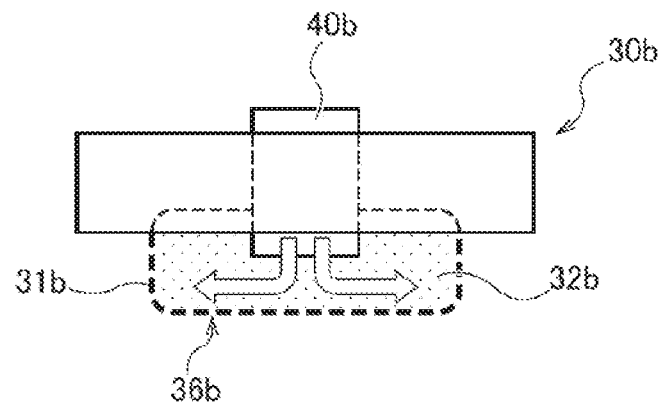
FIG. 5 is a schematic cross-sectional view illustrating another example of the catalyst holding unit.

FIG. 5 is a schematic cross-sectional view illustrating details of a catalyst holding unit 30b as another embodiment. The catalyst holding unit 30b includes a sponge 32b having pores. A layer of a catalyst 31b is formed on an outer surface of the sponge 32b. A plurality of bores 36b is formed in the catalyst 31b. Further, in this example, the substrate processing apparatus 10 also includes a processing liquid supply unit 40b in the catalyst holding unit 30b. The processing liquid supply unit 40b is configured to supply the processing liquid PL into the sponge 32b. In the present embodiment, the catalyst holding unit 30b is vertically moved, which adjusts a contact pressure between the catalyst 31b and the wafer W. According to this configuration, the sponge 32b is deformed, which allows the catalyst 31 to evenly contact the wafer W, resulting in succeeding in etching a contact portion at an uniform etching rate. In addition, the sponge 32b is flexible, so that the semiconductor material, which is the processing target surface, can be prevented from being damaged or can be kept less damaged from the friction with the catalyst. Further, the processing liquid PL is supplied from inside the sponge 32b to the contact portion between the processing target surface of the wafer W and the catalyst 31b, which allows the processing liquid PL to be supplied only by a required amount directly to the contact portion, resulting in succeeding in reducing a consumed amount of the processing liquid PL. The supply via the above-described processing liquid supply unit 40 may be employed in place of the processing liquid supply unit 40b. In this case, the catalyst 31b does not have to have the bores 36b. Further, although not illustrated, a CMP pad with the catalyst deposited on a surface thereof may be used as one example of the elastic member 32. Examples of the CMP pad include an unwoven pad impregnated with foamed polyurethane, polyurethane, or the like. All of these materials have sufficient elasticity against the contact with the processing target surface of the wafer W, and therefore can be used as the elastic member 32.

Figure 6:
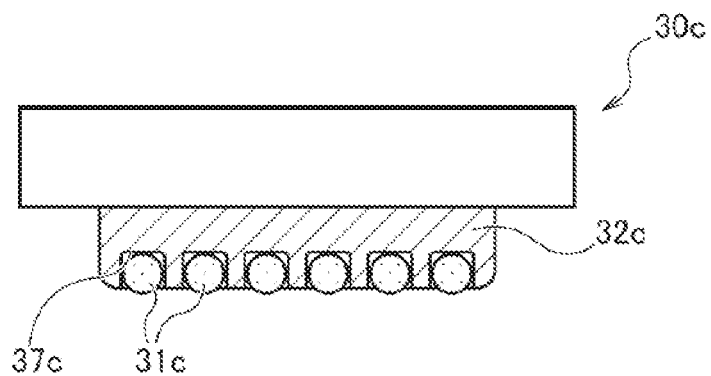
FIG. 6 is a schematic cross-sectional view illustrating another example of the catalyst holding unit.

FIG. 6 is a schematic cross-sectional view illustrating details of a catalyst holding unit 30c as another embodiment. The catalyst holding unit 30c includes an elastic member 32c. A plurality of grooves 37c is formed on a bottom surface (a surface facing the wafer W) of the elastic member 32c. Catalysts 31c are embedded in the plurality of grooves 37c, respectively. In the present embodiment, the catalysts 31c have concentrically arranged ring-like shapes. This configuration allows the catalysts to be arranged in a specific distribution on the contact surface between the elastic member and the semiconductor material on the substrate, thereby allowing the adjustment of etching amount within the contact portion with the catalysts.

Figure 7:
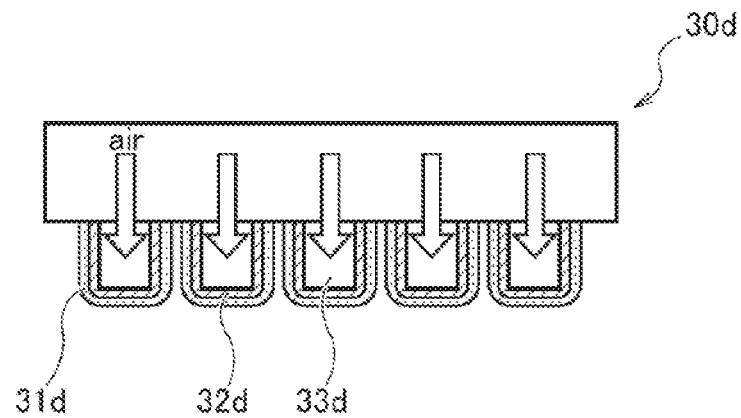
FIG. 7 is a schematic cross-sectional view illustrating another example of the catalyst holding unit.

FIG. 7 is a schematic cross-sectional view illustrating details of a catalyst holding unit 30d as another embodiment. The catalyst holding unit 30d includes a plurality of elastic members 32d. In other words, the catalyst holding unit 30d is divided into a plurality of regions. Each of the elastic members 32*d* is made of an elastic film similarly to the embodiment illustrated in FIG. 3, and a pressure chamber 33*d* is formed inside the elastic member (elastic film) 32*d*. A layer of a catalyst 31*d* is formed on an outer surface of the elastic film 32*d*. In the present embodiment, the elastic members 32*d* are arranged concentrically, and the elastic members 32*d* each have a ring-like shape except for the elastic member 32*d* located at a center. A pressure applied to each of the elastic members 32*d* is adjusted by supply of fluid. According to this configuration, the processing target region of the wafer W and the catalyst 32*d* can be brought into contact with each other with a pressure controlled for each of the elastic members 32*d*, which allows the catalyst and the wafer W to be brought into contact with each other in a manner controlled for each of the regions.

In the embodiments illustrated in FIGS. 3 to 7, a groove form may be provided on the surface of the elastic member. This groove facilitates introduction of the processing liquid onto the contact portion between the catalyst and the wafer W and substitution thereon, thereby allowing the wafer W to be etched at a higher etching rate and with improved stability of etching rate.

As one embodiment, the groove formed on the surface of the catalyst 31 or the elastic member 32 is formed so as to extend in a direction in the plane of the catalyst 31, and is formed so as to allow the processing liquid PL to flow in the plane of the wafer W between the catalyst 31 and the wafer W with the catalyst 31 and the wafer W in contact with each other. As one embodiment of the groove form, the groove form has such a trapezoidal shape in cross-section that a width of the groove is greater at an opening of the groove than at a bottom of the groove (for example, refer to FIGS. 29 and 30). Therefore, when the catalyst 31 and the wafer W are in contact with each other, the groove form can be maintained without being squeezed, thereby maintaining the supply of the processing liquid PL to between the catalyst 31 and the wafer W. Further, as one embodiment, the groove is formed on the surface of the elastic member 32 so as to define a pattern including a plurality of concentric circles or a plurality of radial lines. As one embodiment, the groove is formed on the surface of the elastic member so as to define a pattern including pluralities of parallel lines extending in intersecting different directions, or a helical pattern. Another arbitrary width and pattern than the above-described examples can be used as the width and the pattern of the groove.

Figure 54:
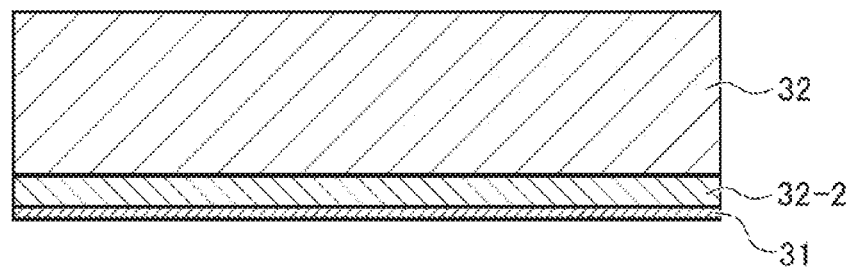
FIG. 54 is a schematic side view illustrating a catalyst holding unit as one embodiment.

FIG. 54 is a schematic side view illustrating the catalyst holding unit 30 as one embodiment. As illustrated in FIG. 54, the catalyst holding unit 30 includes a catalyst holding member 32 (for example, the elastic member 32). A resin film 32-2 is attached to the catalyst holding member 32. The catalyst 31 is held on a surface of the resin film 32-2 that is located opposite from the catalyst holding member 32. The resin film 32-2 can be detached from the catalyst holding member 32 together with the catalyst 31. Therefore, the catalyst holding unit 30 according to the embodiment illustrated in FIG. 54 allows the catalyst holding member 32 to be repeatedly used by replacement of the film 32-2. If the catalyst holding member 32 is made of, for example, an elastic member, the surface of the catalyst holding member 32 may be roughened. Attaching the film 32-2 to the catalyst holding member 32 like the present embodiment can eliminate the roughness of the surface of the catalyst holding member 32, thereby making the surface of the catalyst 31 more flat. Further, the elastic member 32 normally exhibits elasticity in all directions, so that the catalyst 31 may be torn when the elastic member 32 is extended or contracted in a direction in the plane of the catalyst 31 if the catalyst 31 is held on the surface of the elastic member 32. The resin film 32-2 is less extendable and contractable in a direction in the plane of the film than the elastic member 32, so that attaching the film 32-2 to the catalyst holding member 32 can prevent the catalyst holding member 32 from being extended and contracted in the in-plane direction. As a result, this embodiment can prevent the catalyst 31 held on the film 32-2 from being torn, while maintaining the elasticity of the elastic member 32 in a direction perpendicular to the plane of the film 32-2, thereby allowing the catalyst 31 to evenly contact the wafer W in conformity with the shape of the wafer W.

Figure 55:
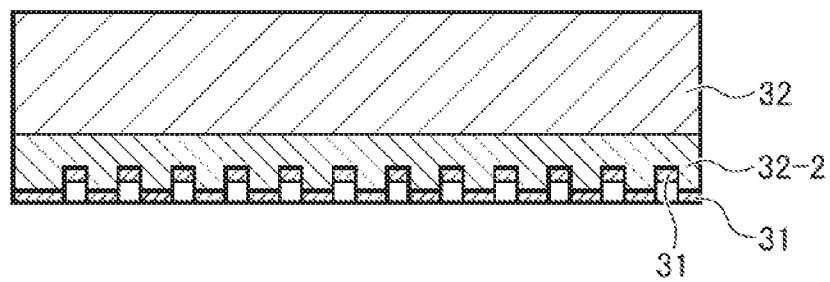
FIG. 55 is a schematic side view illustrating a catalyst holding unit as one embodiment.

FIG. 55 is a schematic side view illustrating the catalyst holding unit 30 as one embodiment. The catalyst 31 according to the embodiment illustrated in FIG. 55 is held on the resin film 32-2, similarly to the embodiment illustrated in FIG. 54. However, the resin film 32-2 according to the embodiment illustrated in FIG. 55 includes a groove pattern formed thereon, unlike the embodiment illustrated in FIG. 54. The catalyst 31 is held on this groove pattern. This groove is formed so as to extend in a direction in the plane of the film 32-2 and the catalyst 31, and is formed so as to allow the processing liquid PL to flow in the plane of the wafer W between the catalyst 31 and the wafer W with the catalyst 31 and the wafer W in contact with each other. An arbitrary shape can be used as the groove form, but the groove can be formed into such a trapezoidal shape in cross-section that a width of the groove is wider at an opening of the groove than at a bottom of the groove, similarly to the above-described embodiment (for example, refer to FIGS. 29 and 30). Alternatively, a plurality of through-holes may be formed at positions corresponding to outlet/inlets 30-40*a* illustrated in FIG. 57 instead of the groove pattern of the film 32-2.

Figure 56:
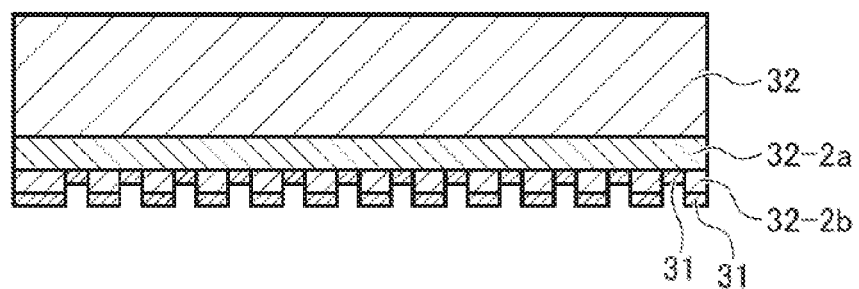
FIG. 56 is a schematic side view illustrating a catalyst holding unit as one embodiment.

FIG. 56 is a schematic side view illustrating the catalyst holding unit 30 as one embodiment. In the embodiment illustrated in FIG. 56, the catalyst 31 is held on the resin film 32-2, similarly to the embodiment illustrated in FIG. 55. In the embodiment illustrated in FIG. 56, the resin film 32-2 has a two-layered structure. No groove pattern is formed on a first layer resin film 32-2*a* located on a surface facing the catalyst holding member 32. An arbitrary groove pattern can be formed on a second layer resin film 32-2*b* located on a surface facing the catalyst 31. In this case, the groove pattern is formed through the second layer resin film 32-2*b*. It may be difficult to accurately form the groove on the film while keeping an even depth, but this embodiment allows the groove form to be formed with an even depth equal to a thickness of the second layer resin film 32-2*b*.

Each of the catalyst holding units 30 according to the embodiments illustrated in FIGS. 54 to 56 can be configured to have any feature of the catalyst holding units disclosed herein. For example, the catalyst holding unit 30 can be configured to supply the processing liquid PL from inside the catalyst holding unit 30 to the surface of the catalyst 31, like the embodiments illustrated in FIGS. 29 and 30. In this case, in the embodiments illustrated in FIGS. 54 to 56, the catalyst holding member 32, the resin film 32-2, and the catalyst 31 are provided with a processing liquid supply passage 30-40 and a supply port 30-42 for delivering the processing liquid PL.

Each of the catalyst holding units 30 illustrated in FIGS. 54 to 56 can be formed by the following procedure. First, the groove pattern is formed on the resin film 32-2. The groove pattern does not have to be formed, if the groove pattern is unnecessary. Next, the catalyst material is deposited on the resin film 32-2 with (or without) the groove pattern formed thereon. The method for depositing the catalyst material can be any method described in the present disclosure, or any known method. Next, the resin film 32-2 with the catalyst 31 deposited thereon is attached to the catalyst holding member 32 with use of an adhesive, a double-sided tape, or the like.

Each of the catalyst holding units 30 illustrated in FIGS. 54 to 56 is configured in such a manner that the replaceable resin film 32-2 is attached to the catalyst holding member 32. However, the measure taken to eliminate extremely small protrusions and dents on the surface of the catalyst holding member 32 to make the surface of the catalyst 31 flat does not necessarily have to rely on the resin film 32-2, and also does not necessary have to relay on the replaceable film. For example, glass may be applied or sprayed, or resin may be applied or sprayed onto the surface of the catalyst holding member 32, such as the elastic member 32. In this case, polyurethane, polyimide, or the like can be used as the resin. Alternatively, a glass sheet or a metal sheet may be attached onto the catalyst holding member 32. Besides them, any configuration can be employed as long as the configuration can make the surface flatter than the catalyst holding member 32. These configurations do not necessarily have to be replaceable.

Figure 57:
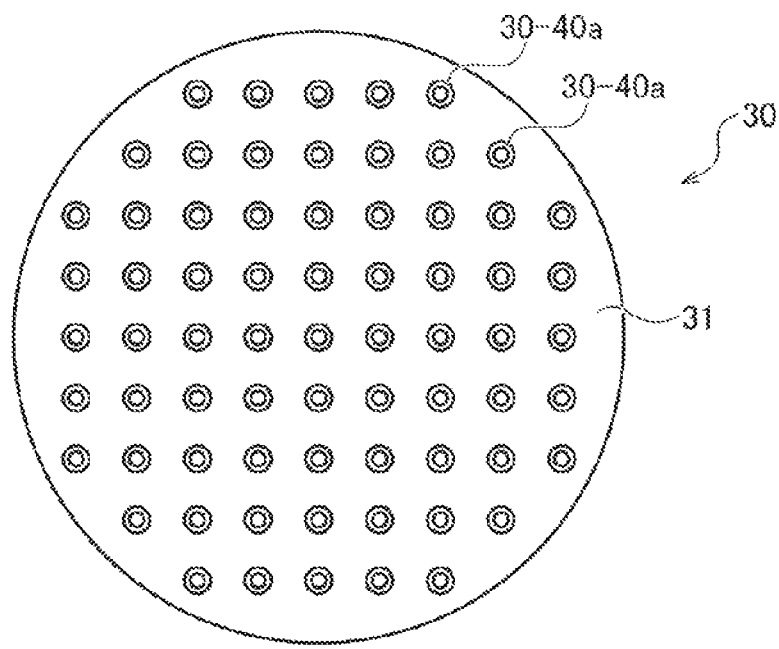
FIG. 57 is a schematic bottom view illustrating a catalyst holding unit as one embodiment.
Figure 58:
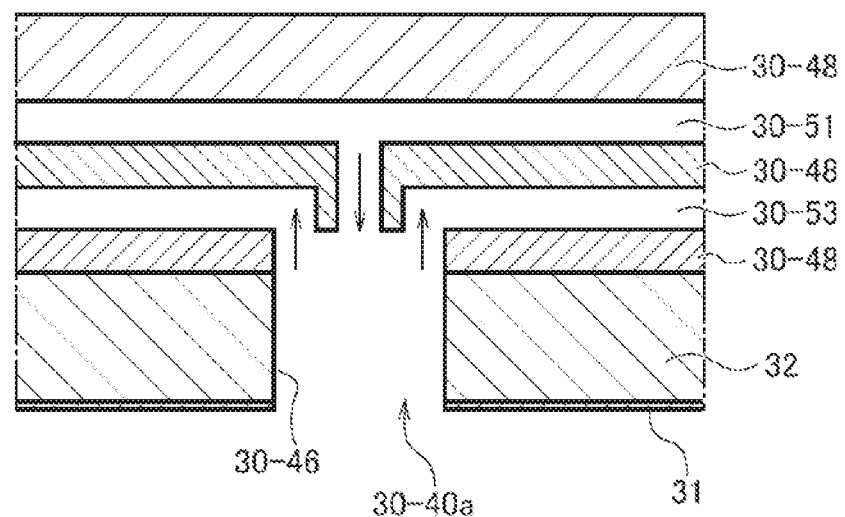
FIG. 58 is a schematic cross-sectional view illustrating one of outlet/inlets of the catalyst holding unit illustrated in FIG. 57.

FIG. 57 is a plan view illustrating the catalyst holding unit 30 as one embodiment, as viewed from the catalyst 31. As illustrated in FIG. 57, the plurality of inlet/outlets 30-40a, which is used for the processing liquid PL to enter and exit, is formed on the surface of the catalyst 31 of the catalyst holding unit 30. FIG. 58 is a cross-sectional view illustrating one of the inlet/outlets 30-40a illustrated in FIG. 57. As illustrated in FIG. 58, the catalyst holding unit 30 includes the catalyst holding member 32 on which the catalyst 31 is held. A through-hole 30-46, which is used for the processing liquid PL to pass through the catalyst holding member 32, is formed on the catalyst holding member 32. A support member 30-48 is disposed on an opposite side of the catalyst holding member 32 from the catalyst 31. An inlet passage 30-51, which is used to supply the processing liquid PL onto the surface of the catalyst 31, and an outlet passage 30-53, which is used to collect the processing liquid PL, are formed in the support member 30-48. Both the inlet passage 30-51 and the outlet passage 30-53 are open to the through-hole 30-46. In the embodiment illustrated in FIGS. 57 and 58, the outlet passage 30-53 is arranged so as to surround the inlet passage 30-51. In the embodiment illustrated in FIGS. 57 and 58, a groove pattern, like the groove patterns described in the other embodiments, is not formed on the surface of the catalyst 31, but a groove pattern may be formed as another embodiment. In the embodiment illustrated in FIGS. 57 and 58, the processing liquid PL can be supplied onto and collected from the surface of the catalyst 31 via the inlet/outlets 30-40a, and thus can be substituted on the surface of the catalyst 31 even with no groove pattern formed or with a groove pattern including a small number of grooves. If the groove pattern is formed on the surface of the catalyst 31, the catalyst 31 may be detached from a corner of the groove of the catalyst when the wafer W and the catalyst 31 are slidably moved relative to each other while being in contact with each other. The inlet/outlets 30-40a of the processing liquid according to the embodiment illustrated in FIGS. 57 and 58 allows the catalyst 31 to have less corners compared to the formation of the groove pattern, thereby succeeding in reducing the risk of the detachment of the catalyst 31.

Figure 40:
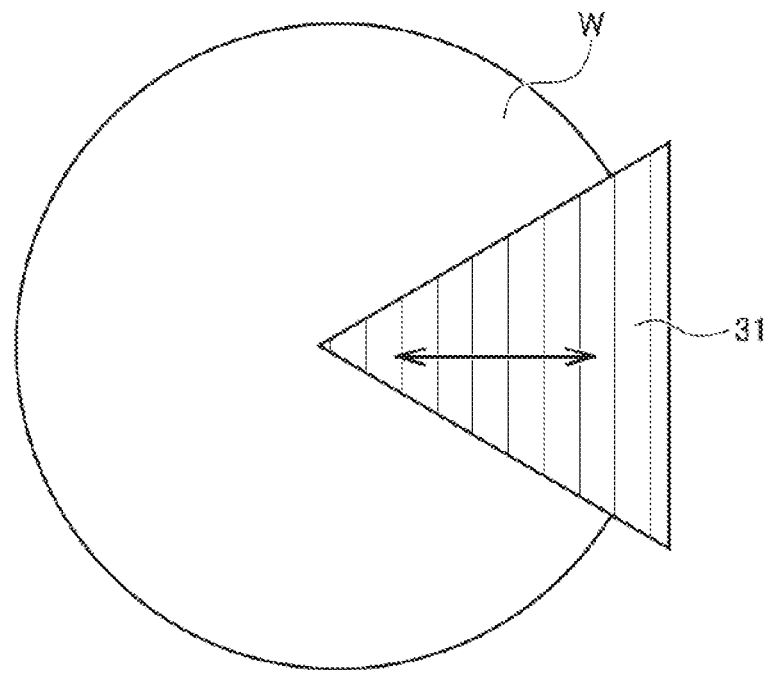
FIG. 40 is a schematic plan view of a catalyst holding unit as one embodiment.
Figure 41:
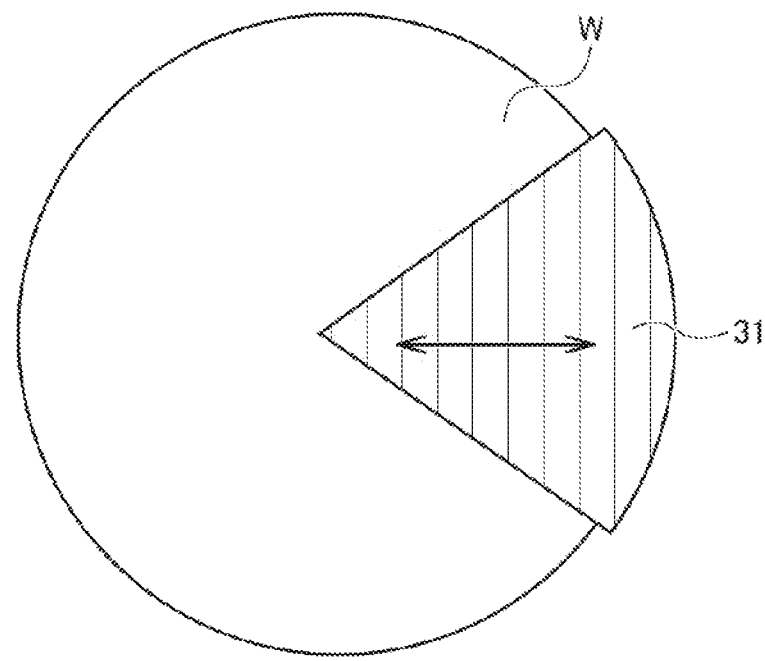
FIG. 41 is a schematic plan view of a catalyst holding unit as one embodiment.

FIGS. 40 and 41 are plan views illustrating the shape of the catalyst holding unit 30 as one embodiment. The method of swinging the catalyst holding unit 30, which is smaller than the wafer W, on the wafer W as described above may result in a reduction in the etching amount due to a reduction in a time for which the catalyst 31 and the wafer W are in contact with each other on an edge side of the wafer W than on other portions, leading to a difficulty in evenly controlling the etching amount. In this case, swinging the catalyst 31 so as to move the catalyst 31 beyond an outer periphery of the wafer W (causing the catalyst 31 to overhang the wafer W) can increase the contact time for the purpose of keeping the etching amount even on the edge side of the wafer W. Further, the catalyst holding unit 30 according to the embodiment illustrated in FIGS. 40 and 41 includes the triangle or fan-shaped catalyst holding member 32 (for example, the elastic member 32) having two sides having dimensions approximately equal to or slightly longer than a radius of the wafer W to be processed. In this case, the wafer W is processed while the catalyst 31 and the wafer W are arranged into contact with each other in such a manner that a vertex of the triangle or the fan shape is located around a center of the wafer W to be processed. This catalyst holding member 32 itself is configured non-rotatably. Shaping the catalyst holding member 32 in this manner allows the catalyst 31 to contact the wafer W at each radial position of the wafer W at an approximately constant rate of the contact to a circumference of the wafer, thereby keeping the constant time of the catalyst 31 approximately constant in the radial direction with respect to the rotation of the wafer W even without the catalyst 31 itself rotated. Therefore, the uniformity of the processing performed on the wafer W can be improved even without requiring a complicated operation. In the embodiment illustrated in FIGS. 40 and 41, the catalyst holding unit 30 may be configured to include a mechanism for swinging the catalyst holding unit 30 in the radial direction of the wafer W, like the mechanism illustrated in the other embodiments (for example, the swinging arm 50). Swinging the catalyst holding unit 30 in the radial direction of the wafer W can prevent the wafer W from constantly contacting with the catalyst 31 only at the center of the wafer W. Further, in the embodiment illustrated in FIGS. 40 and 41, a groove, which is used for the processing liquid to pass through the catalyst 31 or the catalyst holding member 32, may be formed on the surface of the catalyst 31 or the catalyst holding member 32, like the grooves described in the other embodiments. The groove in cooperation with the swinging movement of the catalyst holding unit 30 on the wafer W allows the processing liquid PL to be sufficiently introduced onto the catalyst contact surface.

Figure 66:
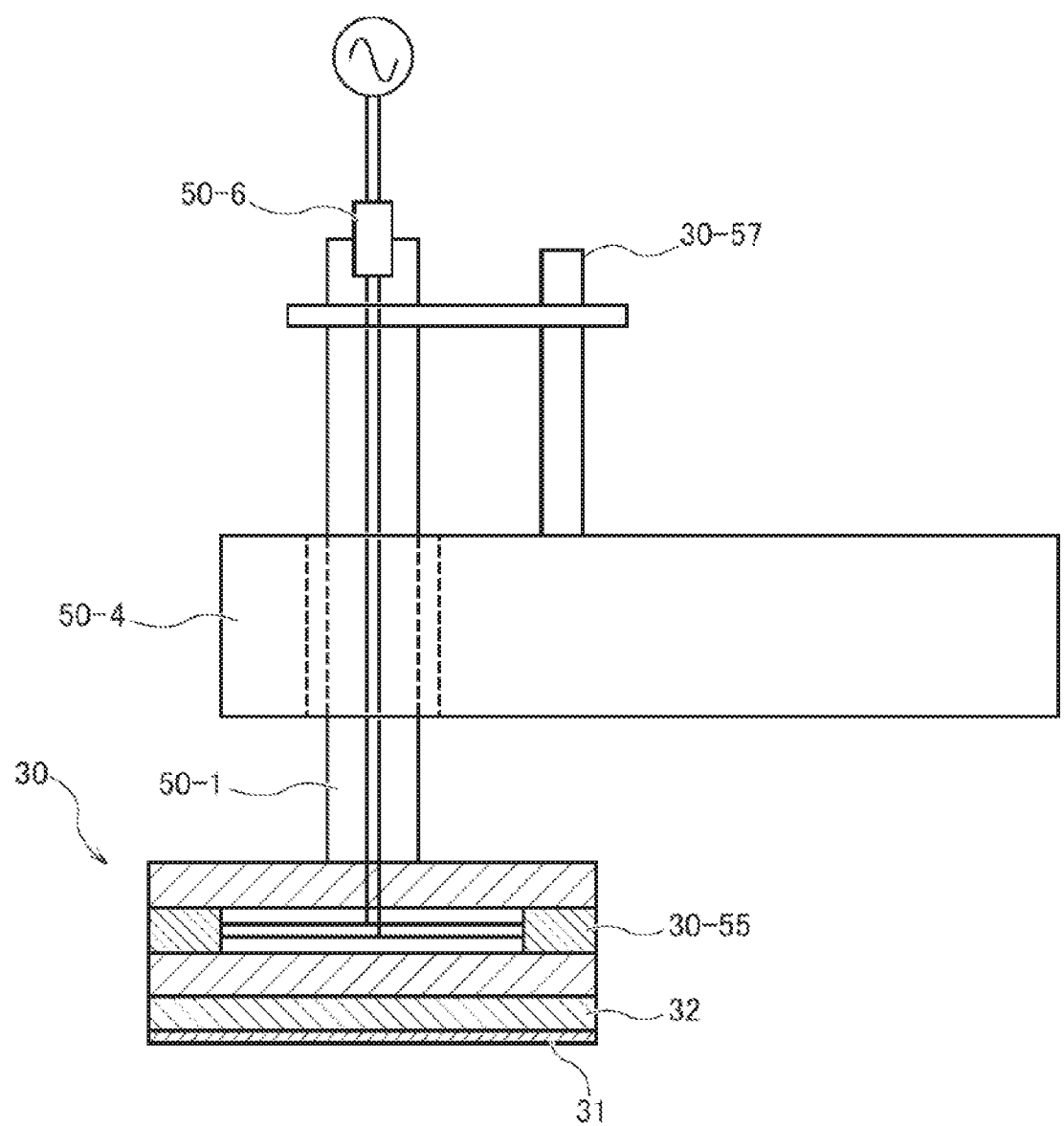
FIG. 66 is a schematic side cross-sectional view illustrating a catalyst holding unit as one embodiment.

FIG. 66 illustrates one embodiment of the catalyst holding unit 30 of the substrate processing apparatus according to the present disclosure. The catalyst holding unit 30 can be configured to be able to vibrate the catalyst 31 held on the catalyst holding unit 30 perpendicularly to the surface of the wafer W (not illustrated) by application of an alternating-current voltage corresponding to a vibration frequency to a piezoelectric element 30-55 installed in the catalyst holding unit 30. Alternatively, the catalyst holding unit 30 may be configured to be entirely vibrated vertically with use of a ball screw 30-57. Regarding other configurations, the features of the embodiments described in the present disclosure or known features can be arbitrarily combined therefor. The catalyst 31 is vibrated to alternately repeat establishment of the contact between the catalyst 31 and the surface of the wafer W and disconnection of the catalyst 31 from the surface of the wafer W, which reduces the friction due to the contact between the catalyst 31 and the wafer W, thereby succeeding in reducing the risk of the detachment of the catalyst 31 from the catalyst holding member 32. Preferably, the vibration frequency is 10 Hz to 100 kHz. If the vibration frequency is lower than 10 Hz, the wafer W after the processing ends up being processed unevenly according to the vibration frequency. If the vibration frequency is higher than 100 kHz, cavitation occurs in the processing liquid PL, and damages the surface of the wafer W and the surface of the catalyst 31.

Figure 31:
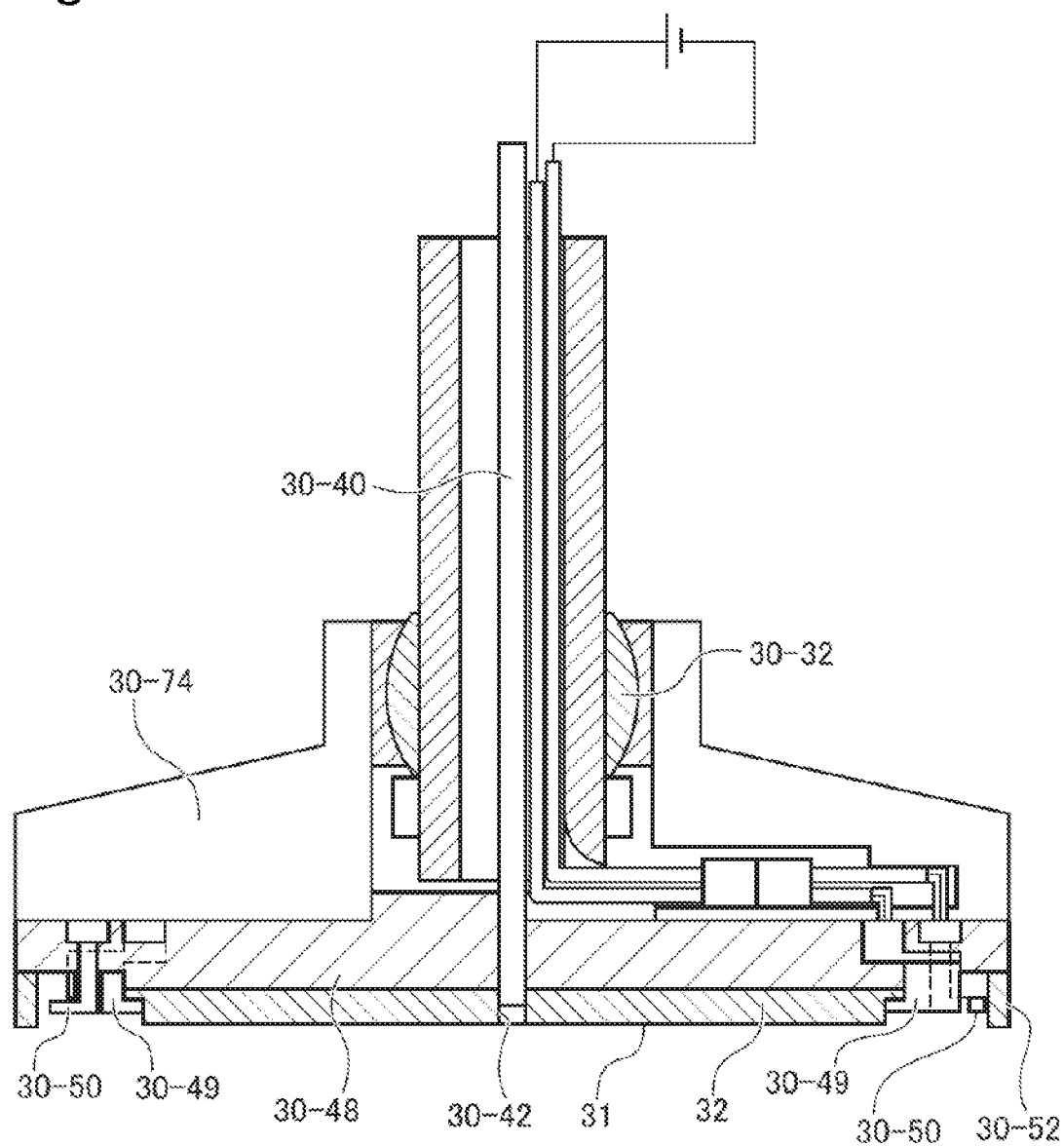
FIG. 31 is a schematic side view of a catalyst holding unit as one embodiment.
Figure 46:
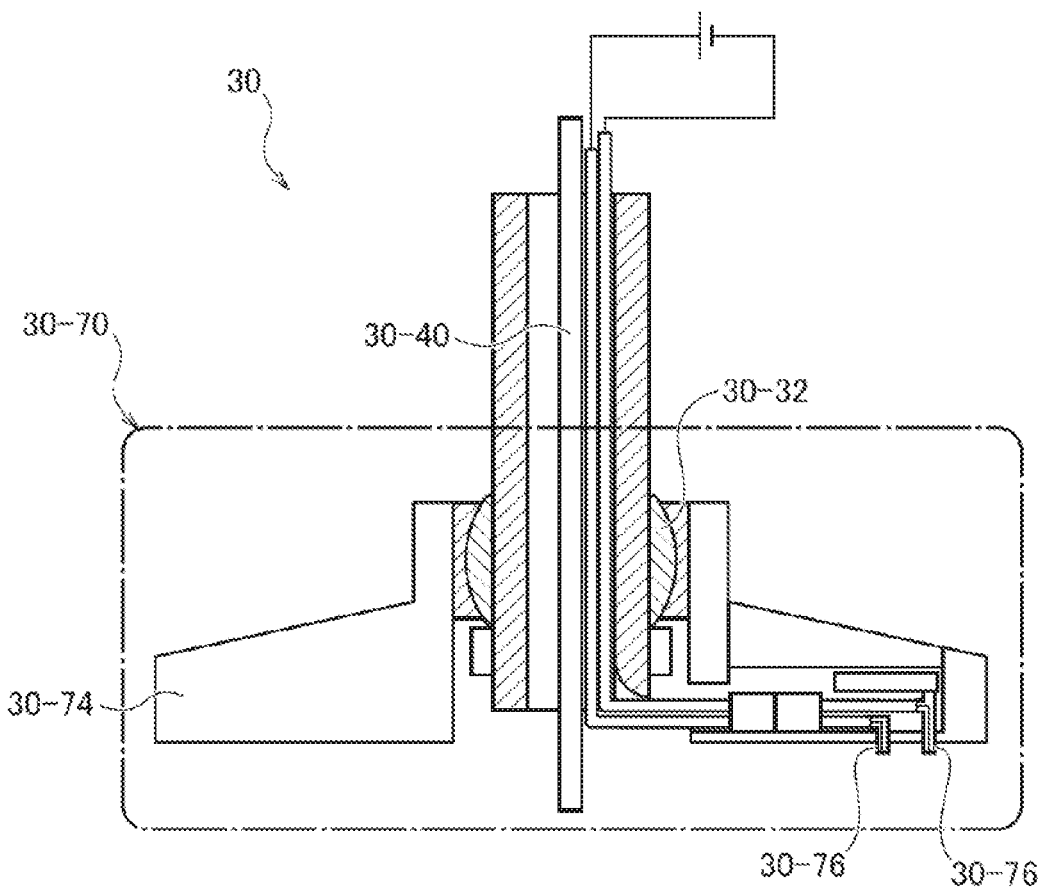
FIG. 46 is a schematic side view illustrating components of a catalyst holding unit as one embodiment.
Figure 47A:
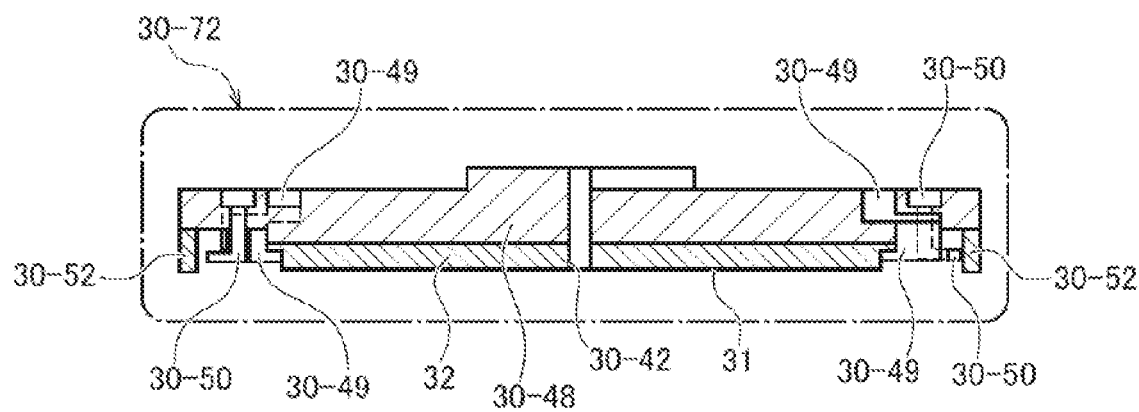
FIG. 47A is a schematic side view illustrating components of a catalyst holding unit as one embodiment.
Figure 47B:
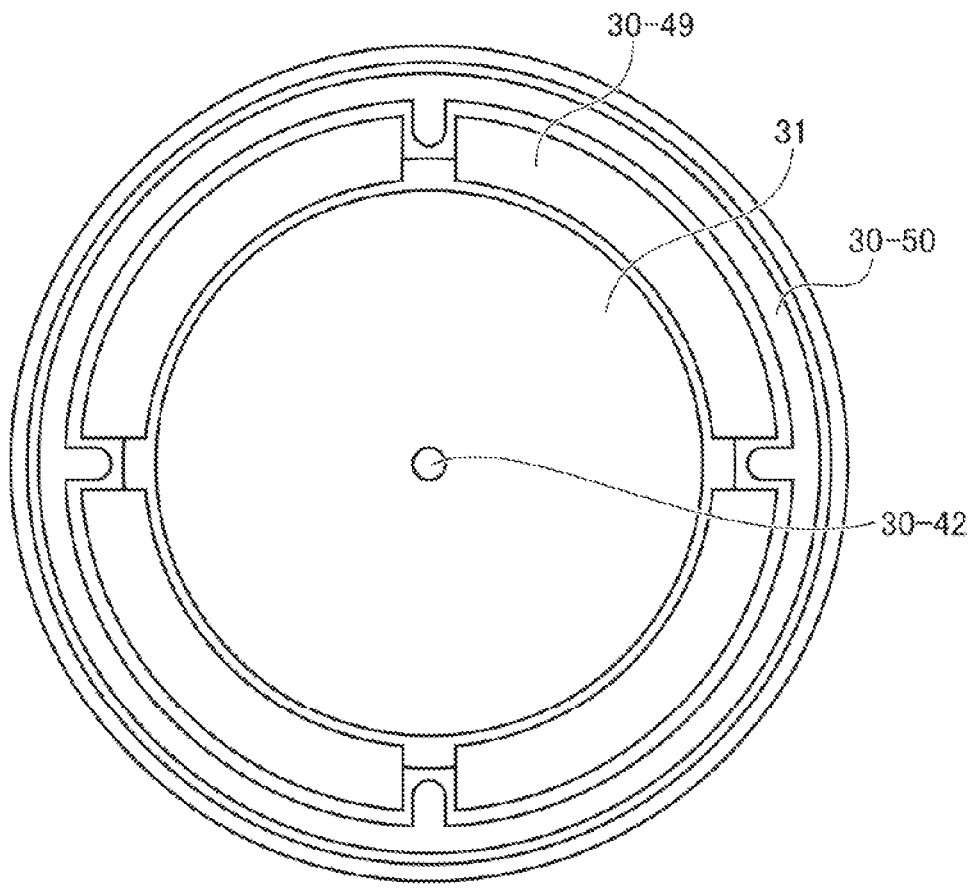
FIG. 47B is a schematic bottom view illustrating the components illustrated in FIG. 47A.
Figure 48:
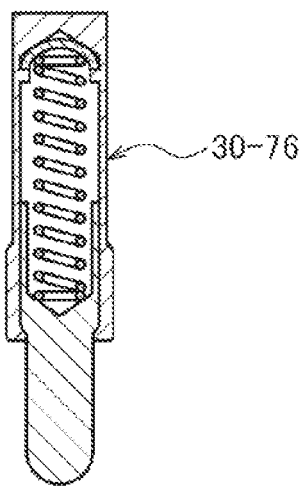
FIG. 48 is a schematic side view illustrating components of a catalyst holding unit as one embodiment.

FIGS. 46, 47A, and 48 are schematic side cross-sectional views illustrating a configuration of the catalyst holding unit 30 as one embodiment disclosed in the present disclosure. The catalyst holding unit 30 according to the present embodiment includes a disk holder portion 30-70 illustrated in FIG. 46, and a catalyzer disk portion 30-72 illustrated in FIG. 47A that is attachable to and replaceable from the disk holder portion 30-70. FIG. 47B is a schematic plan view illustrating the catalyzer disk portion 30-72 illustrated in FIG. 47A as viewed from the catalyst 31. FIG. 31 illustrates the catalyst holding unit 30 with the disk holder portion 30-70 and the catalyzer disk portion 30-72 attached to each other. As illustrated in FIG. 46, the disk holder portion 30-70 includes a head 30-74. A processing liquid supply passage 30-40, a wiring for a catalyst electrode, and a wiring for a counter electrode are laid through a center of the head 30-74. Further, a head 30-74 is attached to the swing arm 50 so that the head 30-40 is rotatable via a gimbal mechanism 30-32 (for example, a spherical plain bearing). The gimbal mechanism 30-32 can be embodied by using, for example, a similar mechanism to a disclosure of Japanese Patent Application Public Disclosure No. 2002-210650. As illustrated in FIGS. 47A and 47B, the catalyzer disk portion 30-72 includes the catalyst holding member 32 (for example, the elastic member 32) and the catalyst 31 held on the catalyst holding member 32. As illustrated in FIGS. 47A and 47B, the catalyst 31 is electrically connected to a catalyst electrode 30-49. Further, a counter electrode 30-50 is disposed outside the catalyst holding member 32. The wiring for the catalyst electrode and the wiring for the counter electrode in the disk holder portion 30-70 are electrically connected to the catalyst electrode 30-49 and the counter electrode 30-50, respectively, when the disk holder portion 30-70 is connected to the catalyzer disk portion 30-72. A voltage can be applied from an external power source to between the catalyst electrode 30-49 and the counter electrode 30-50. Further, the catalyzer disk portion 30-72 includes a wall 30-52 formed outside the catalyst holding member 32 and the catalyst 31 so as to surround the catalyst holding member 32 and the catalyst 31 with a gap generated therefrom. A processing liquid holding portion, which holds the processing liquid PL, is defined by the wall 30-52 with the catalyst 31 and the wafer W in contact with each other. When the disk holder portion 30-70 and the catalyzer disk portion 30-72 are connected to each other, a contact probe 30-76, like a probe illustrated in FIG. 48, is used for an electric connection. When the disk holder portion 30-70 and the catalyzer disk portion 30-72 are connected to each other, the processing liquid supply passage 30-40 extends through the catalyst holding member 32 of the catalyze disk portion 30-72, and reaches to the supply port 30-42 on the surface of the catalyst 31.

Figure 59:
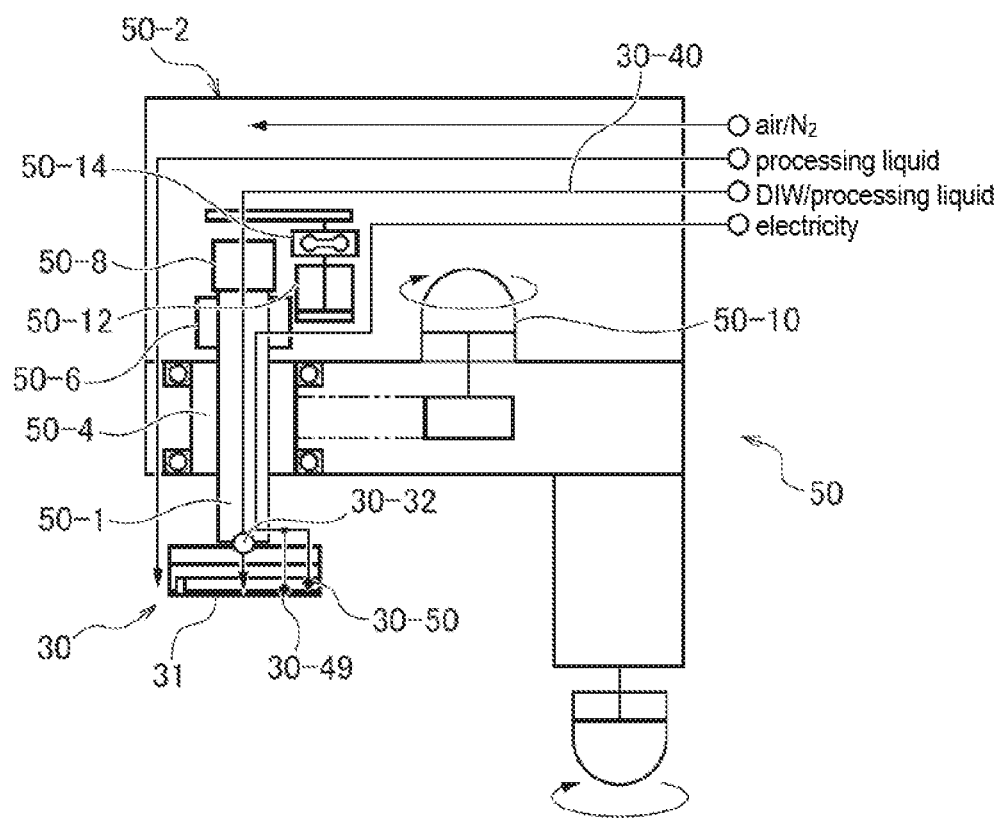
FIG. 59 is a schematic side cross-sectional view illustrating a catalyst holding unit mounted on a swing arm as one embodiment.

As one embodiment, the catalyst holding unit 30 disclosed in the present disclosure can be attached to the swing arm 50. FIG. 59 is a schematic side cross-sectional view illustrating the catalyst holding unit 30 attached to the swing arm 50 as one embodiment. As illustrated in FIG. 59, the swing arm 50 is entirely covered by a cover 50-2. The catalyst holding unit 30 is coupled to a shaft 50-1 via the gimbal mechanism 30-32. The shaft 50-1 is rotatably supported by a ball spline 50-4, a slip ring 50-6, and a rotary joint 50-8. A rotary connector may be used in place of the spring ring 50-6, and the electric connection may be realized in a non-contact manner. The catalyst holding unit 30 can be rotated by a rotational motor 50-10. The shaft 50-1 is axially driven by an elevating air cylinder 50-12. The air cylinder 50-12 can be embodied by using an air bearing cylinder. The use of the air bearing cylinder can reduce sliding resistance, and can also reduce a hysteresis. The air cylinder 50-12 is coupled to the shaft 50-1 via a load cell 50-14, and can measure a force applied from the air cylinder 50-12 to the shaft 50-1 by the load cell 50-14. The swing arm 50 includes the processing liquid supply passage 30-40 so that the processing liquid and/or the water can be supplied from the supply port 30-42 on the surface of the catalyst 31 of the catalyst holding unit 30. Alternatively, the catalyst holding unit 30 may be configured to supply the processing liquid and/or the water from outside the catalyst holding unit 30. The swing arm 50 can be configured to be connected to a supply source of air or nitrogen to supply the air or the nitrogen into the cover 50-2. The CARE processing may use a highly corrosive chemical, whereby the pressure in the cover 50-2 is increased to a higher pressure than the outer atmospheric pressure, which can prevent the processing liquid PL from entering the cover 50-2.

Figure 60:
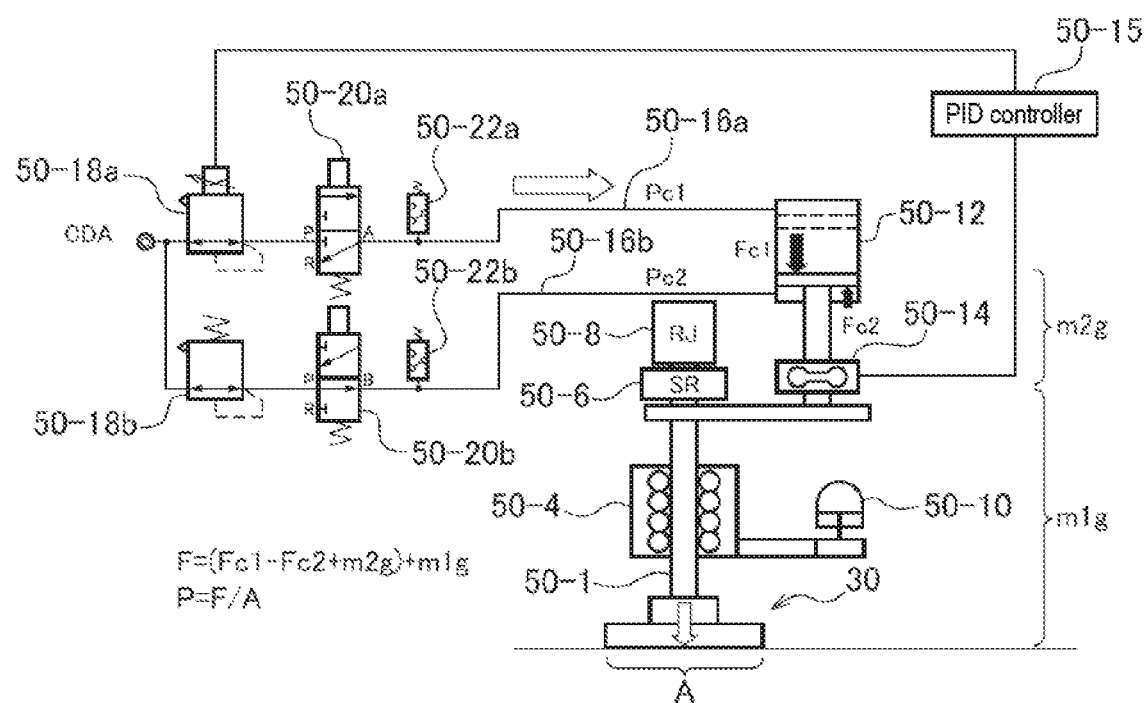
FIG. 60 schematically illustrates a configuration for controlling a pressure with which the catalyst holding unit and the wafer W are in contact with each other with use of the swing arm as one embodiment.

FIG. 60 schematically illustrates a configuration for controlling a pressure with which the catalyst holding unit 30 and the wafer W are in contact with each other by using the swing arm 50 as one embodiment. As illustrated in FIG. 60, a first pipe line 50-16a, which is used to supply air, is connected to one side of surfaces of a piston of the air cylinder 50-12. An electropneumatic regulator 50-18a, an electromagnetic valve 50-20a, and a pressure meter 50-22a are connected to the first pipe line 50-16a. The electropneumatic regulator 50-18a is connected to a PID controller 50-15, and converts an electric signal received from the PID controller 50-15 into a pneumatic pressure. The electromagnetic valve 50-20a is a normally closed valve, and permits the air to flow therethrough when being switched on. The pressure meter 50-22a can measure a pressure in the first pipe line 50-16a. A second pipe line 50-16b, which is used to supply the air, is connected to the other side of the surfaces of the piston of the air cylinder 50-12. A precision regulator 50-18b, an electromagnetic valve 50-20b, and a pressure meter 50-22b are connected to the second pipe line 50-16b. The electromagnetic valve 50-20b is a normally opened valve, and permits the air to flow therethrough when being switched off. The pressure meter 50-22b can measure a pressure in the second pipe line 50-16b. The second pipe line 50-16b is provided with a pneumatic pressure enough to cancel out m2g+m1g, which is a weight of the second pipe line 50-16b itself from the air cylinder 50-12 to the catalyst holding unit 30. The weight m2g is a weight above the load cell 50-14, and is included in the measurement by the load cell 50-14. The weight m1g is a weight below the load cell 50-14, and is not included in the measurement by the load cell 50-14. As described above, the force applied from the air cylinder 50-12 to the shaft can be measured by the load cell 50-14.

Figure 61:
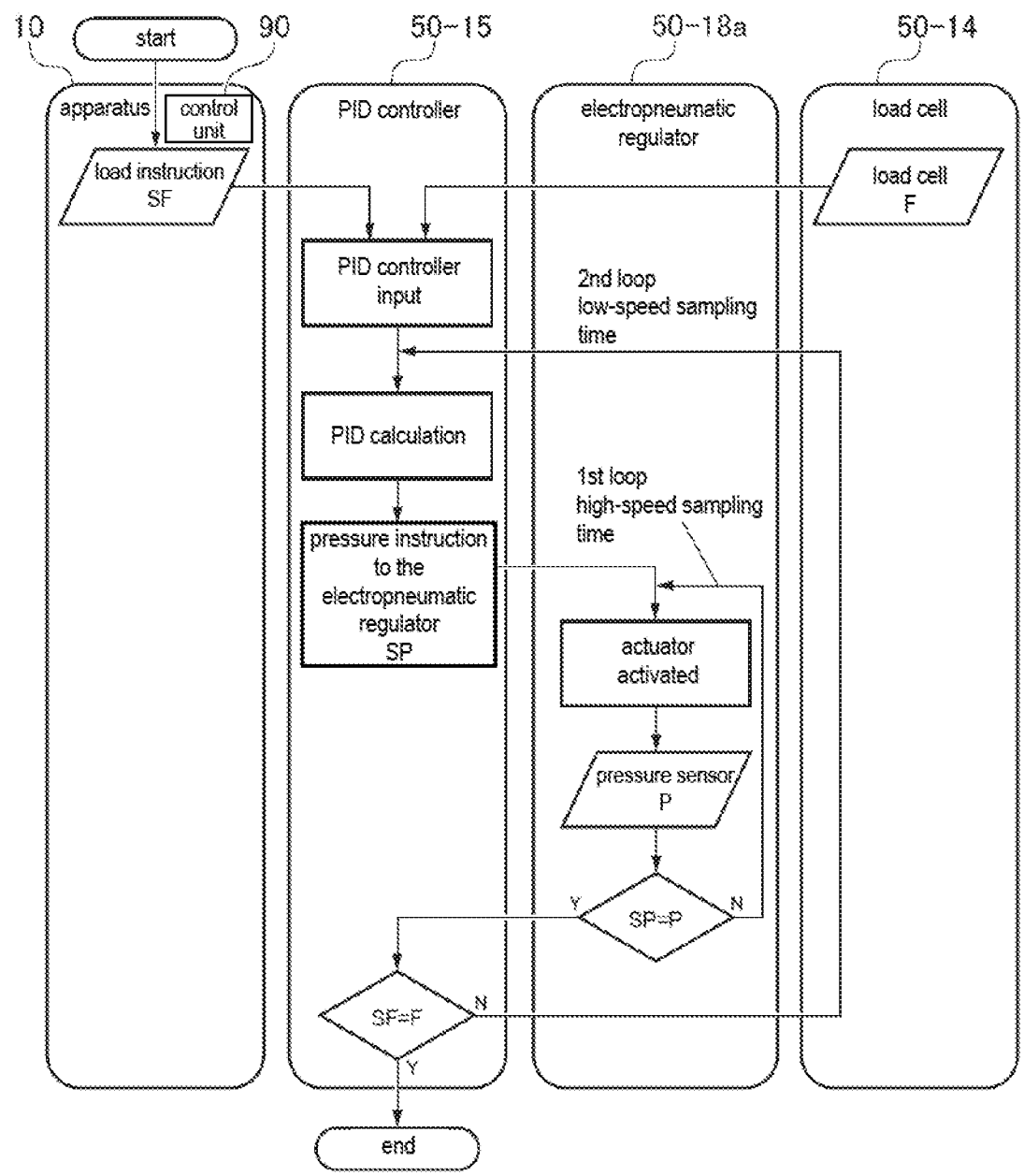
FIG. 61 is a flowchart illustrating a flow of performing PID control on the pressure with which the catalyst holding unit and the wafer are in contact with each other as one embodiment.

As one embodiment, the pressure with which the catalyst holding unit 30 and the wafer W are in contact with each other can be controlled by PID control. FIG. 61 is a flowchart illustrating a flow of the PID control that controls the pressure with which the catalyst holding unit 30 and the wafer W are in contact with each other as one embodiment. As illustrated in the flowchart of FIG. 61, a PID controller 50-15 receives a load instruction SF from the control unit 90 of the substrate processing apparatus 10. On the other hand, the PID controller 50-15 receives a measured force F from the load cell 50-14. The PID controller 50-15 carries out a PID calculation for realizing the received load instruction SF within the PID controller. The PID controller 50-15 provides a pressure instruction SP to the electropneumatic regulator 50-18a based on a result of the PID calculation. Upon receiving the pressure instruction SP, the electropneumatic 50-18a activates an internal actuator to thereby discharge air having a predetermined pressure P. The electropneumatic regulator 50-18a holds a pressure sensor therein, and is controlled by feedback control so that the pressure P of the air discharged from the electropneumatic regulator 50-18a matches the pressure instruction SP. This feedback control is performed according to a relatively high-speed sampling time. The air discharged from the electropneumatic regulator 50-18a is supplied to the air cylinder 50-12, thereby driving the air cylinder. The force F generated by the air cylinder 50-12 is measured by the load cell 50-14. The PID controller 50-15 compares the measured value F received from the load cell 50-14 with the load instruction SF received from the control unit 90, and repeats the PID calculation and the processing after that until the measured value F matches the load instruction SF. This feedback control is performed according to a lower-speed sampling time than the above-described inner feedback control of electropneumatic regulator 50-18a. The force pressing the catalyst holding unit 30 against the wafer W is monitored and controlled by the feedback control with use of the load cell 50-14 and the PID controller 50-15 in this manner, which allows the catalyst holding unit 30 to be constantly pressed with an optimum force. This control can be modified in such a manner that the load instruction varies in a stepwise manner (for example, every 0.1 seconds) to reach the final load instruction SF so as to control a speed at which the air cylinder 50-12 is driven.

Figure 65:
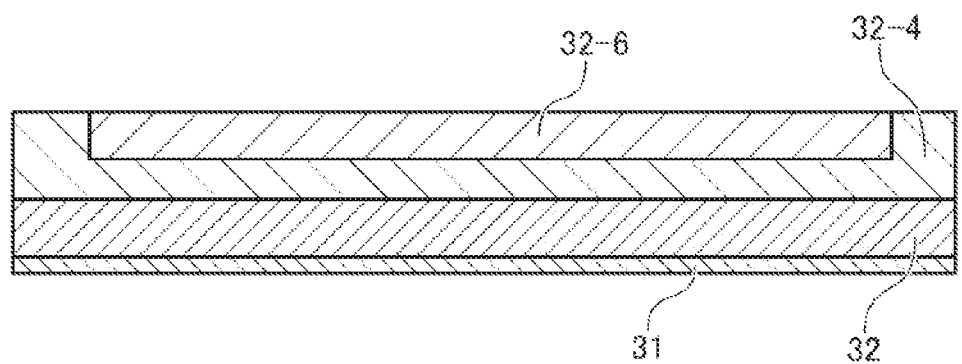
FIG. 65 is a schematic side view illustrating a catalyst holding unit as one embodiment.

Any of the catalyst holding units 30 disclosed in the present disclosure can include a catalyst temperature control mechanism for controlling a temperature of the catalyst 31. For example, a Peltier element can be used as the catalyst temperature control mechanism. FIG. 65 is a schematic side view illustrating the catalyst holding unit 30 as one embodiment. In the embodiment illustrated in FIG. 65, the catalyst 31 is held on the surface of elastic member 32. A support member 32-4 is disposed on a surface of the elastic member 32 opposite from the surface where the catalyst 31 is held. A Peltier element 32-6 is attached to the support member 32-4. Desirably, the support member 32-4 is made of a highly thermally conductive material, and can be made of, for example, metal or ceramic. In the present embodiment, an etching rate can be increased by warming the catalyst 31 with use of the Peltier element 32-6. Conversely, step removability by the etching can be enhanced by cooling the catalyst 31 with use of the Peltier element 32-6 to increase the hardness of the elastic member 32. Further, both the etching rate and the step removability can be improved by warming the catalyst 31 at the time of a start of the etching and cooling the catalyst 31 after the etching advances to some degree.

Next, the conditioning unit 60 is configured to condition the surface of the catalyst 31 at a predetermined timing. This conditioning unit 60 is disposed outside the wafer W held on the substrate holding unit 20. The catalyst 31 held on the catalyst holding unit 30 can be positioned above the conditioning unit 60 by the swing arm 50.

The control unit 90 controls an entire operation of the substrate processing apparatus 10. Further, the control unit 90 also controls a parameter regarding a condition of the etching processing to be performed on the wafer W. Examples of such a parameter include a condition of a motion such as a rotation and an angular rotation of the substrate holding unit, the pressure with which the catalyst 31 and the wafer W are in contact with each other, a condition of the swinging motion of the swing arm 50, a condition of the supply such as a flow amount and a temperature of the processing liquid to be supplied from the processing liquid supply unit 40, a condition of application of a voltage of a potential adjustment unit 580, which will be described below, and a condition of conditioning the surface of the catalyst by the conditioning unit 60.

A flow of the etching processing that is performed on the substrate by the present substrate processing apparatus 10 will be described. First, the wafer W is held onto the substrate holding unit 20 by the substrate transfer unit with the aid of the vacuum suction. Next, the processing liquid is supplied from the processing liquid supply unit 40. Next, after the catalyst 31 on the catalyst holding unit 30 is placed at a predetermined position on the wafer W by the swing arm 50, the vertical movement of the catalyst holding unit 30 brings the catalyst 31 into contact with the processing target region of the wafer W, and also adjusts the pressure therebetween to a predetermined contact pressure. Further, at the same time as this contact operation or after the contact, the relative movement between the substrate holding unit 20 and the catalyst holding unit 30 is started. In the present embodiment, this relative movement is realized by the rotation of the substrate holding unit 20, the rotation of the catalyst holding unit 30, and the swinging motion by the swing arm 50. The relative movement between the substrate holding unit 20 and the catalyst holding unit 30 can be realized by at least one of a rotational motion, a translation motion, a circular arc motion, a reciprocating motion, a scroll motion, and an angular rotational motion (a motion of rotating only by a predetermined angle smaller than 360 degrees) of at least one of the substrate holding unit 20 and the catalyst holding unit 30.

By this operation, an etchant generated from an action of the catalyst 31 acts on the surface of the wafer W at the portion where the wafer W and the catalyst 31 are in contact with each other with the aid of a catalytic action of the catalyst 31, by which the surface of the wafer W is etched and removed. The processing target region of the wafer W can be made of an arbitrary single material or a plurality of arbitrary materials, and examples of the material(s) include an insulating film represented by an $SiO_2$ material and a Low-k material, wiring metal represented by Cu and W, barrier metal represented by Ta, Ti, TaN, TiN, Co, and the like, and a III-V series material represented by GaAs and the like. Further, the material of the catalyst 31 can be, for example, precious metal, transition metal, a ceramic solid catalyst, a basic solid catalyst, or an acid solid catalyst. Further, the processing liquid PL can be, for example, an oxygen solution, ozone water, acid, an alkali solution, $H_2O_2$ water, and a hydrofluoric acid solution. The catalyst 31 and the processing liquid PL can be arbitrary set according to the material of the processing target region of the wafer W. For example, if the material of the processing target region is Cu, an acid solid catalyst and ozone water may be used as the catalyst 31 and the processing liquid PL, respectively. Further, if the material of the processing target region is $SiO_2$, platinum or nickel, and acid may be used as the catalyst 31 and the processing liquid PL, respectively. Further, if the material of the processing target region is the III-V series metal (for example, GaAs), iron and $H_2O_2$ water may be used as the catalyst 31 and the processing liquid PL, respectively.

Further, if a plurality of materials to be etched is mixed together in the processing target region of the wafer W, a plurality of catalysts and/or a plurality of kinds of processing liquid may be used for the individual materials. Specific examples of how to actually construct this configuration regarding the catalyst side include (1) constructing this configuration with use of a single catalyst holding unit with the plurality of catalysts mounted thereon, and (2) constructing this configuration with use of a plurality of catalyst holding units with the different catalysts mounted thereon, respectively. In the configuration (1), the plurality of catalysts may be a mixture or a compound including a plurality of catalyst materials. Further, regarding the processing liquid side, if the configuration (1) is employed on the catalyst side, a mixture of elements suitable for etching materials to be etched by the individual catalyst materials may be used as the processing liquid. Alternatively, if the configuration (2) is employed on the catalyst side, processing liquid suitable for etching a material that should be etched may be supplied to around each of the catalyst holding units. However, the processing liquid may be deteriorated due to the mixture depending on the kind of the processing liquid. In this case, this deterioration can be avoided with use of a processing liquid holding unit 270, which will be described below in a fourth embodiment, so that regions where the processing liquid exists are localized.

Further, in the present embodiment, because the catalyst 31 is smaller than the wafer W, the catalyst holding unit 30 swings on the entire surface of the wafer W when the entire surface of the wafer W should be processed by the etching processing. Then, the present CARE method etches the wafer W only at the portion in contact with the catalyst, whereby the distribution of the etching amount in the plane of the wafer W is largely affected by a distribution of the contact time between the wafer W and the catalyst 31 in the plane of the wafer. Regarding that, varying a speed at which the swing arm 50 swings in the plane of the wafer can even out the distribution of the contact time. More specifically, a range where the swing arm 50 swings in the plane of the wafer W is divided into a plurality of sectors, and the swing arm 50 is arranged to swing at a controlled speed in each section.

Figure 22:
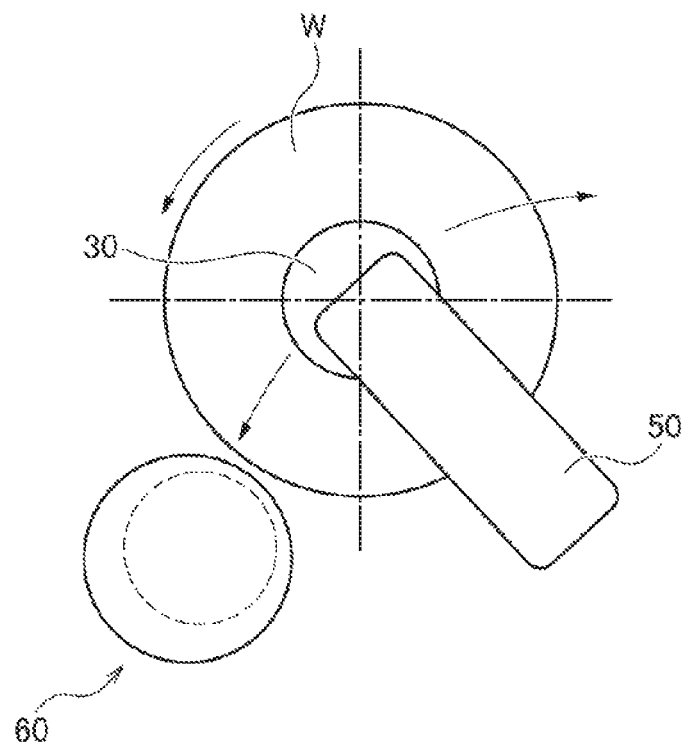
FIG. 22 is a schematic top view of a substrate processing apparatus as one embodiment.
Figure 23:
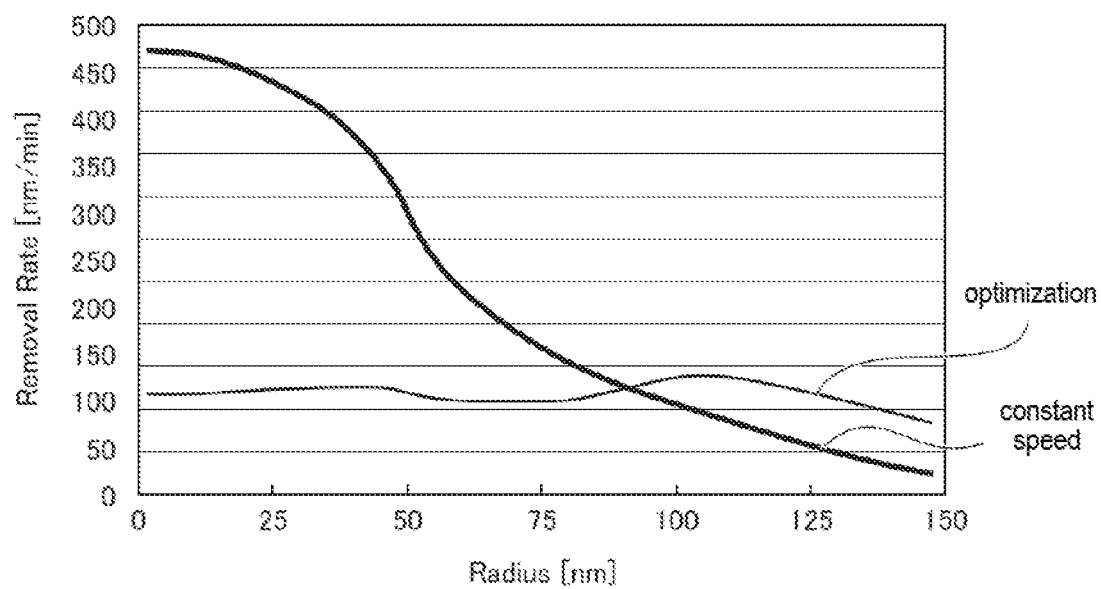
FIG. 23 is a graph indicating a relationship between a speed at which a catalyst swings and a etching rate of substrate.

For example, if the catalyst holding unit 30 swings along such a track that the catalyst holding unit 30 passes through the center of the wafer W with the wafer W rotating at a constant rotational speed as illustrated in FIG. 22, some single point in the catalyst contacts the wafer W for a time inversely proportional to the radius of the wafer W. Therefore, basically, the time for which the catalyst 31 and the wafer W are in contact with each other can be kept constant by also adjusting the distribution of the swing speed in such a manner that the swing speed slows down so as to be inversely proportional to the radius of the wafer W. However, the catalyst 31 of the catalyst holding unit 30 has a predetermined size and a predetermined radius, and should overhang beyond the end of the wafer W to etch the end of the wafer W. This means that the catalyst 31 and the wafer W contact with each other over a variable area. Therefore, it is desirable to adjust the time for which the wafer W is in contact with the catalyst 31 at each point in the plane of the wafer W by adjusting the speed at which the catalyst holding unit 30 swings, so as to correct such a variation in the area. FIG. 23 illustrates a graph indicating etching rate of wafer W when the catalyst holding unit 30 swings in the plane of the wafer W at a constant speed, and when the swing range is divided into eleven sections and the swing speed is optimized for each section. As indicated by the graph illustrated in FIG. 23, when the catalyst holding unit 30 swings at a constant speed, the catalyst 31 and the wafer W contact with each other at the center of the wafer W for a longer time, and the etching rate increases at the center of the wafer W, as a result of which the etching rate exhibits a further uneven in-plane distribution. On the other hand, when the range where the catalyst holding unit 30 swings is divided into the eleven sectors and the swing speed is adjusted for each section, the catalyst 31 and the wafer W can be in contact with each other for a time that is further evened out. This leads to improvement of the distribution of the etching rate in the plane of the wafer W. In the example of the optimization illustrated in FIG. 23, the range where the catalyst holding unit 30 swings is divided into the eleven sections, but increasing the number of divided sectors (for example, thirty sectors) can realize a more fine adjustment of the swing speed and thus achieve an adjustment of the distribution of the time for which the catalyst 31 and the wafer W are in contact with each other, thereby contributing to further improving the uniformity of etching rate within the wafer W.

Figure 27:
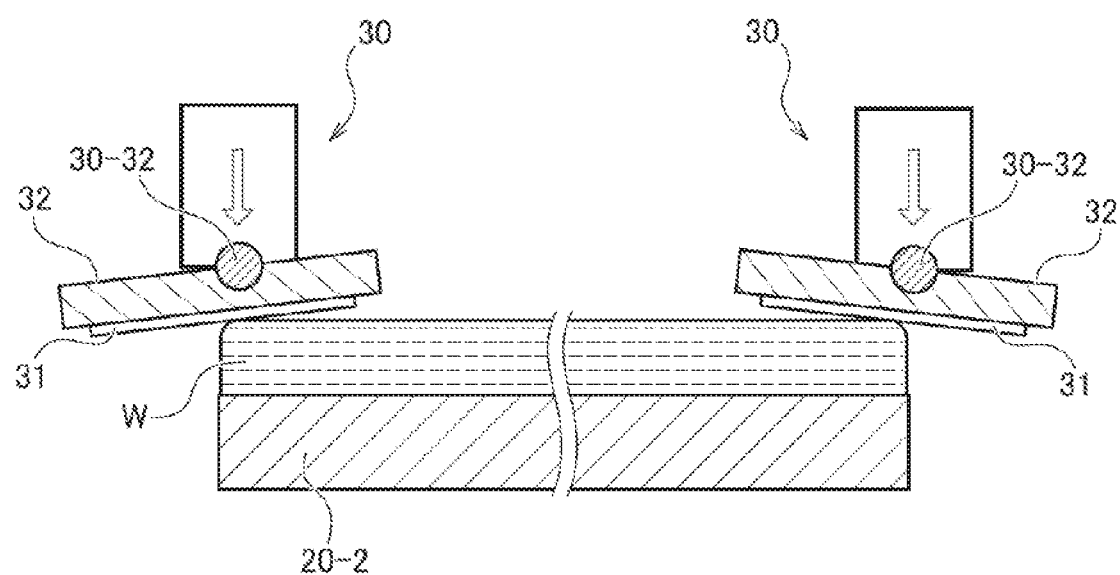
FIG. 27 is a schematic side view of a substrate processing apparatus as one embodiment.

The substrate processing apparatus that processes the wafer W while swinging, on the wafer W, the catalyst holding unit 30 having a smaller radius than the wafer W to be processed may require the catalyst holding unit 30 to overhang out of the wafer W. If the catalyst holding unit 30 is caused so as to overhang from the wafer W, the catalyst holding unit 30 may tilt with respect to the plane of the wafer W because of absence of a structure for supporting the catalyst holding unit 30 outside the wafer W. FIG. 27 is a side view illustrating the catalyst holding unit 30 tilting when overhanging beyond the wafer W. As illustrated in FIG. 27, when the catalyst holding unit 30 overhangs beyond the wafer, the contact pressure is concentrated on around the edge of the wafer W. If the catalyst 31 is held on the elastic member 32, the elastic member 32 is deformed according to the increase in the contact pressure, which widens the area over which the catalyst 31 and the wafer W are in contact with each other, resulting in an increase in the etching rate around the edge of the wafer W. Therefore, if the surface of the catalyst 31 and the processing target surface of the wafer W are not in parallel with each other, the catalyst 30 and the wafer W fail to main the even contact distribution therebetween, whereby the etching rate of the wafer W exhibits a further uneven in-plane distribution. Especially, if the catalyst holding unit 30 like the catalyst holding unit 30 illustrated in FIG. 27 overhangs beyond the wafer W, the catalyst holding unit 30 may largely tilt, and the mechanism that attempts to maintain the contact with the wafer W with use of the elastic member 32 like the above-described elastic member 32 may be unable to necessarily sufficiently maintain uniformity of the etching rate of the wafer W. Therefore, one embodiment of the substrate processing apparatus disclosed in the present disclosure proposes the following solution to this problem.

Figure 24:
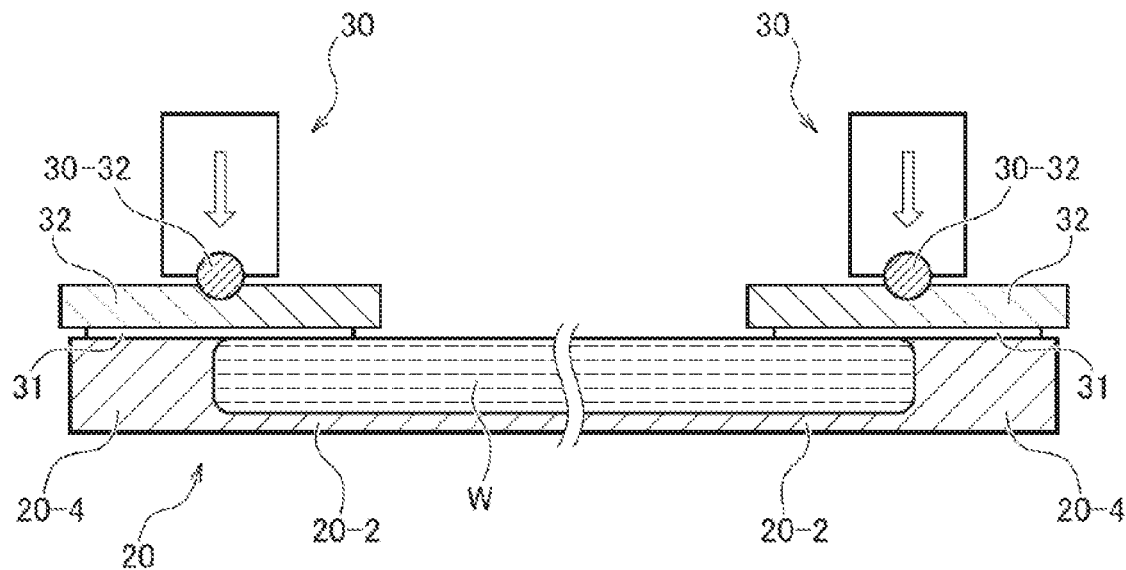
FIG. 24 is a schematic side view of a substrate processing apparatus as one embodiment.

FIG. 24 is a schematic side view illustrating the substrate holding unit 20 and the catalyst holding unit 30 as one embodiment of the substrate processing apparatus 10. In the embodiment illustrated in FIG. 24, the substrate holding unit 20 includes a wafer holding stage 20-2 having a wafer holding surface for holding the wafer W. As illustrated in FIG. 24, in the present embodiment, the wafer holding surface of the wafer holding stage 20-2 is larger than the area of the surface of the catalyst 31 of the catalyst holding unit 30. The wafer holding stage 20-2 includes an extension portion 20-4, which will be located outside the outer periphery of the wafer W when the wafer W to be processed is mounted thereon. A radial dimension of this extension portion 20-4 may be an arbitrary dimension, but is desirably approximately equal to or larger than a radius of the surface of the catalyst holding unit 30 that holds the catalyst 31.

Figure 25:
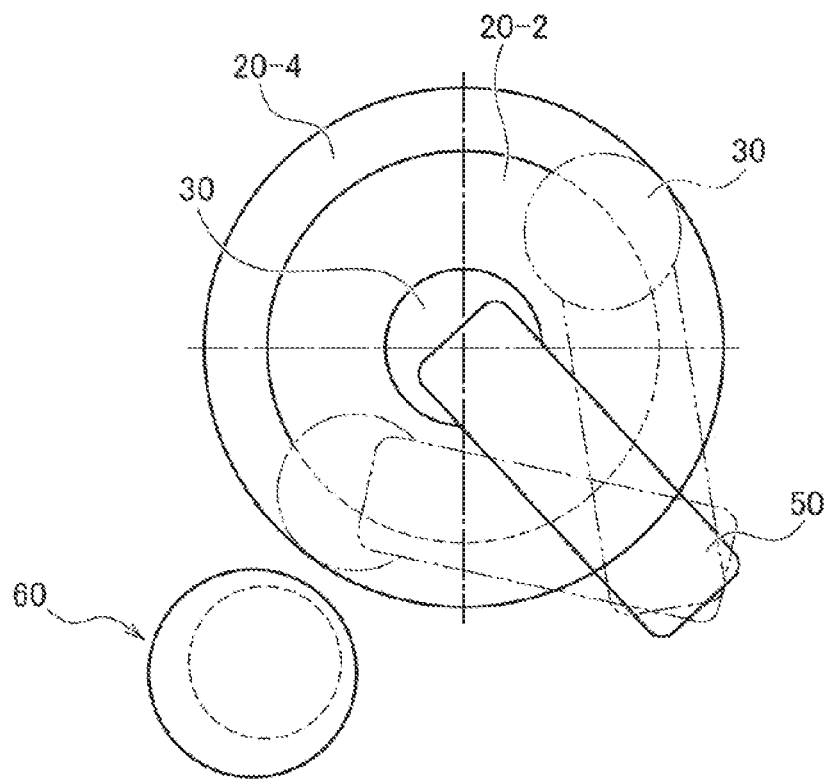
FIG. 25 is a schematic top view of a substrate processing apparatus as one embodiment.

FIG. 25 is a schematic top view illustrating the substrate holding unit 20 and the catalyst holding unit 30 illustrated in FIG. 24. In the example illustrated in FIG. 25, the extension portion 20-4 of the wafer holding stage 20-2 can be configured integrally with the wafer holding stage 20-2, and can also be provided around the entire outer periphery of the wafer holding stage 20-2. In the present example, the extension portion 20-4 of the wafer holding stage 20-2 is configured integrally with the wafer holding stage 20-2, but may be configured in such a manner that they are individually independent structures.

Figure 26:
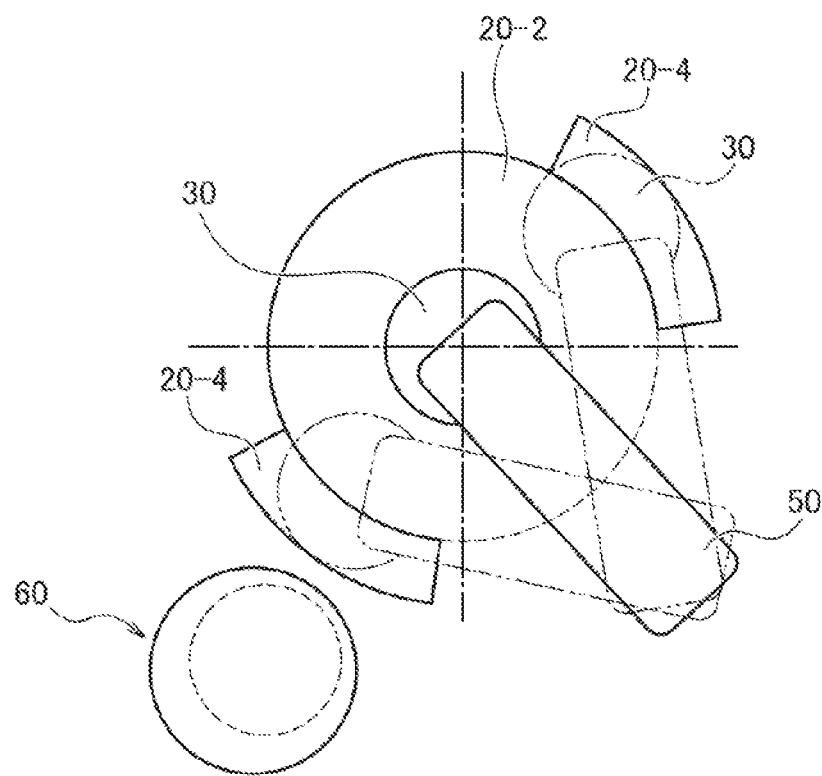
FIG. 26 is a schematic top view of a substrate processing apparatus as one embodiment.

FIG. 26 is a schematic top view illustrating the substrate holding unit 20 and the catalyst holding unit 30 as another embodiment of the substrate processing apparatus 10. As illustrated in FIG. 26, the extension portion 20-4 of the wafer holding stage 20-2 is configured as a separate structure from the wafer holding stage 20-2, and is fixed to the substrate processing apparatus 10 while the wafer holding stage 20-2 is rotatably disposed. This configuration can reduce an area of the extension portion 20-4, thereby contributing to efficient utilization of a space occupied by the entire substrate processing apparatus.

In embodiments including the extension portion 20-4 of the wafer holding stage 20-2, like the embodiments illustrated in FIGS. 24 to 26, the catalyst holding unit 30 is supported by the extension portion 20-4 even when the catalyst holding unit 30 is caused to overhang beyond the wafer W. Therefore, such embodiments allow the catalyst holding unit 30 to keep constant the status in which the catalyst 31 is in contact with the wafer W (for example, the distribution of the contact pressure) even when overhanging, resulting in a capability to maintain the uniformity of the etching rate of the wafer W.

The extension portion 20-4 of the wafer holding stage 20-2 can also be provided with the conditioning unit 60 having any feature described in the present disclosure. Configuring the extension portion 20-4 in this manner contributes to efficient utilization of the space occupied by the entire apparatus.

Figure 28:
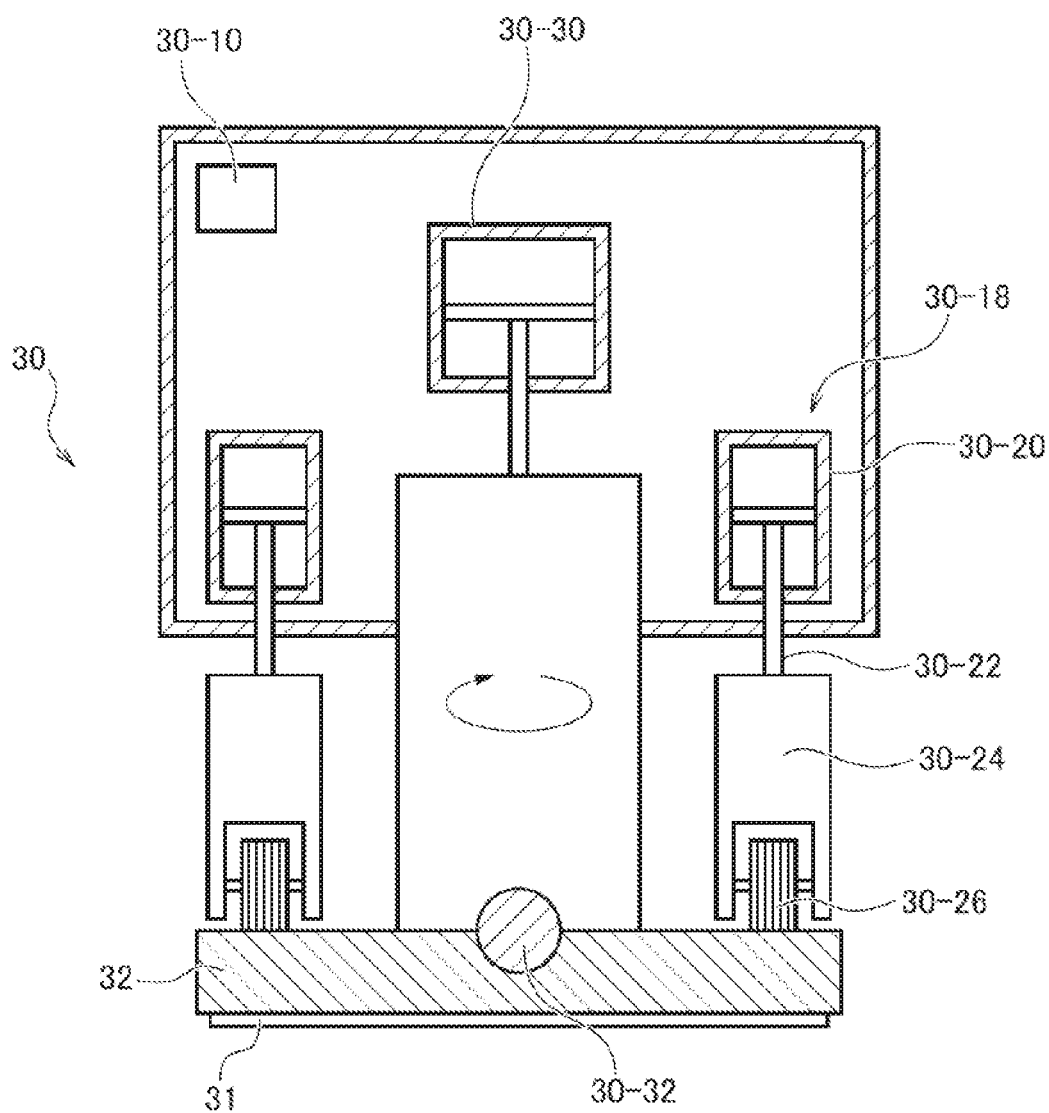
FIG. 28 is a schematic side view of a catalyst holding unit as one embodiment.

FIG. 28 is a schematic side view illustrating the catalyst holding unit 30 as one embodiment of the substrate processing apparatus 10. In the embodiment illustrated in FIG. 28, the catalyst holding unit 30 includes a tilt sensor 30-10 for detecting a tilt of the surface of the catalyst 31. The tilt of the catalyst 31 with respect to the surface of the wafer W held on the substrate holding stage 20-2 can be detected by the tilt sensor 30-10. For example, the tile that may occur, for example, when the catalyst holding unit 30 overhangs beyond the wafer W (refer to FIG. 27), can be detected.

In the embodiment illustrated in FIG. 28, the catalyst holding unit 30 includes a tilt correction mechanism for correcting the tilt of the surface of the catalyst 31 of the catalyst holding unit 30. As a specific configuration of the tilt correction mechanism, this mechanism can use an air cylinder mechanism 30-18 disposed around the edge of the catalyst holding member 32 (for example, the elastic member 32) as illustrated in FIG. 28. The air cylinder mechanism 30-18 includes an air cylinder 30-20, a piston 30-22 having one end configured to be pneumatically driven into the air cylinder 30-20, and a pressing member 30-24 coupled with the other end of the piston 30-22. The pressing member 32-24 includes a roller 30-26. The roller 30-26 rotatably supports the opposite surface of the catalyst holding member 32 from the surface thereof where the catalyst 31 is held. In the embodiment illustrated in FIG. 28, a plurality of air cylinder mechanisms 30-18 (for example, two air cylinder mechanisms 30-18) is disposed on radially opposite sides of the catalyst holding member 32. These air cylinder mechanisms may be configured rotatably in a circumferential direction of the catalyst holding member 32 while maintaining relative positions therebetween.

The catalyst holding unit 30 according to the embodiment illustrated in FIG. 28 includes another cylinder mechanism 30-30 for moving the catalyst holding member 32 in the direction perpendicular to the surface of the wafer W to be processed. In the illustrated embodiment, the air cylinder mechanism 30-30 is coupled with the catalyst holding member 32 via the gimbal mechanism 30-32. Further, the catalyst holding member 32 is configured rotatably in the circumferential direction of the catalyst holding member 32.

In the embodiment illustrated in FIG. 28, the tile of the catalyst holding member 32 is detected by the tilt sensor 30-10, for example, when the catalyst holding unit 30 overhangs beyond the wafer W while the wafer W is processed. The tilt of the catalyst holding member 32 can be corrected by the tilt correction mechanism, such as the air cylinder mechanism 30-18, according to the detected tilt. Therefore, this embodiment allows the catalyst holding unit 30 to keep constant the status in which the catalyst 31 and the wafer W are in contact with each other (for example, the distribution of the contact pressure), resulting in a capability to improve the uniformity of etching rate of the wafer W.

According to the above-described substrate processing apparatus 10 using the CARE method, the wafer W is etched only at the portion in contact with the catalyst 31, and is not etched at other portions out of contact with the catalyst 31. Therefore, only protrusions of the wafer W having the rough surface are selectively chemically removed, so that the planarization processing can be performed. Further, the wafer W is chemically polished, so that the processed surface of the wafer W is less likely damaged. Theoretically, the wafer W and the catalyst 31 do not necessarily have to contact each other, and may be merely located in proximity to each other. In this case, "located in proximity to each other" can be defined to mean being located sufficiently close to each other to allow the etchant generated from the catalytic reaction to reach the processing target region of the wafer W. A distance between the wafer W and the catalyst 31 when they are separated from each other can be, for example, 50 nm or shorter.

After the etching processing according to the present CARE method, the wafer W is cleaned by the substrate cleaning unit, but may be cleaned within the present substrate processing apparatus 10. For example, the wafer W is cleaned by being rotated while wafer cleaning liquid or water is supplied from the processing liquid supply unit 40 thereto.

Further, because an etching product is adhered onto the surface of the catalyst 31, an etching capability of the substrate processing apparatus 10 should be gradually deteriorating. Therefore, the control unit 90 retracts the catalyst holding unit 30 to the conditioning unit 60 to condition the catalyst 31 at a predetermined timing. The predetermined timing can be set to a timing during an interval of the etching processing (a time period during which the processed wafer W is transferred out, and an unprocessed wafer W is mounted on the substrate holding unit 20), each time a predetermined operation time has elapsed, or the like. In the present embodiment, the conditioning unit 60 includes a scrub cleaning unit 61. The scrub cleaning unit 61 includes a scrub member, such as a sponge and a brush, and cleans the catalyst 31 by scrubbing it under existence of cleaning liquid supplied form a cleaning liquid supply unit 62. At this time, a contact between the catalyst holding unit 30 and the scrub member of the scrub cleaning unit 61 is established by a vertical movement of the catalyst holding unit 30 side or the scrub member. Further, when conditioning the catalyst 31, the conditioning unit 60 causes a relative motion such as a rotation of at least one of the catalyst holding unit 30 or the scrub member of the scrub cleaning unit 61. As a result, this embodiment can recover the surface of the catalyst 31 with the etching product adhered thereon to an active status, and can also prevent or reduce the damage that the processing target region of the wafer W might be incurred due to the etching product.

The conditioning unit 60 can be embodied with use of not only the above-described configuration but also various configurations. For example, basically, water may be used as the cleaning liquid in the present scrub cleaning unit 61, but it may be difficult to remove the etching product only by the scrub cleaning depending on a type of the etching product. In this case, a chemical capable of removing the etching product may be supplied as the cleaning liquid. For example, if the etching product is silicate salt ($SiO_2$), hydrofluoric acid may be used as the chemical. Alternatively, the conditioning unit 60 may include an electrolytic regeneration unit configured to remove the etching product adhered on the surface of the catalyst 31 with the aid of an electrolytic action. More specifically, the electrolytic regeneration unit includes an electrode configured to be electrically connectable to the catalyst 31, and is configured to remove the etching product adhered on the surface of the catalyst 31 by applying a voltage to between the catalyst and the electrode.

Alternatively, the conditioning unit 60 may include plating regeneration unit configured to regenerate the catalyst 31 by newly plating the catalyst 31. This plating regeneration unit includes an electrode configured to be electrically connectable to the catalyst 31, and is configured to plate and regenerate the surface of the catalyst 31 by applying a voltage to between the catalyst 31 and the electrode with the catalyst 31 immersed in liquid containing a catalyst for regeneration.

Figure 17A:
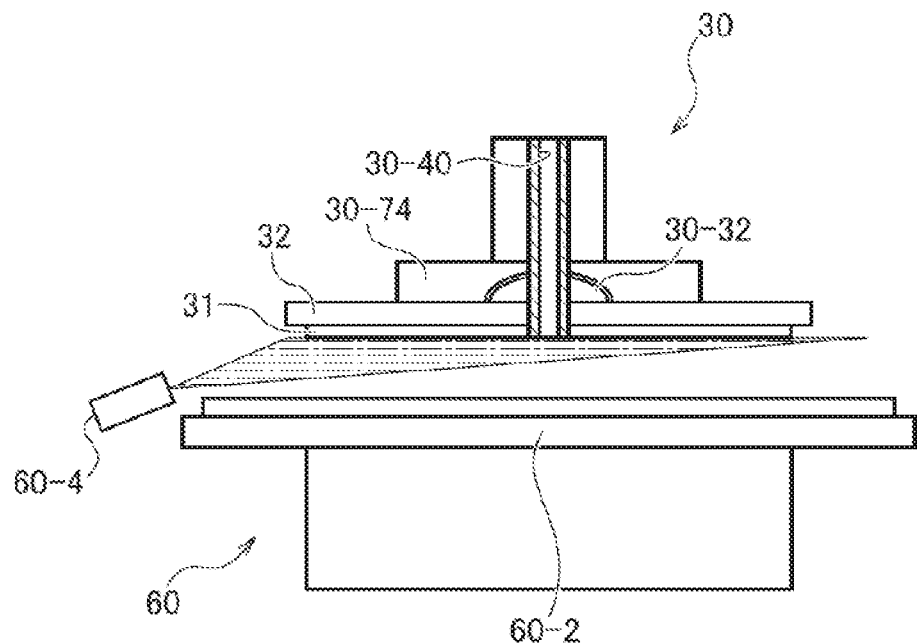
FIG. 17A is a schematic side view illustrating a configuration of an embodiment of a conditioning unit.

FIG. 17A is a schematic side view illustrating a configuration of an embodiment of the conditioning unit 60 usable for the substrate processing apparatus disclosed in the present disclosure. As illustrated in FIG. 17A, the conditioning unit 60 includes a conditioning stage 60-2 disposed so as to face the surface of the catalyst 31 on the catalyst holding unit 30. The conditioning stage 60-2 can be configured to be rotatable, scrollable, or the like by a motor or the like.

Further, the conditioning unit 60 includes a catalyst cleaning nozzle 60-4 configured to supply the water and/or the chemical for cleaning the surface of the catalyst 31. The cleaning nozzle 60-4 is connected to a not-illustrated supply source of the water and/or the chemical, a required pipe and valve, and the like, and can supply desired fluid to the catalyst 31. The conditioning unit 60 may include a plurality of catalyst cleaning nozzles 60-4, and can be configured to supply the water and different kinds of chemicals from these nozzles, respectively. Alternatively, the conditioning unit 60 may be configured to be able to supply the water and the different kinds of chemicals from the catalyst cleaning nozzle 60-4 with use of the single catalyst cleaning nozzle 60-4 by operating a valve and the like. In the embodiment illustrated in FIG. 17A, the cleaning nozzle 60-4 is disposed outside the conditioning stage 60-2.

Figure 17B:
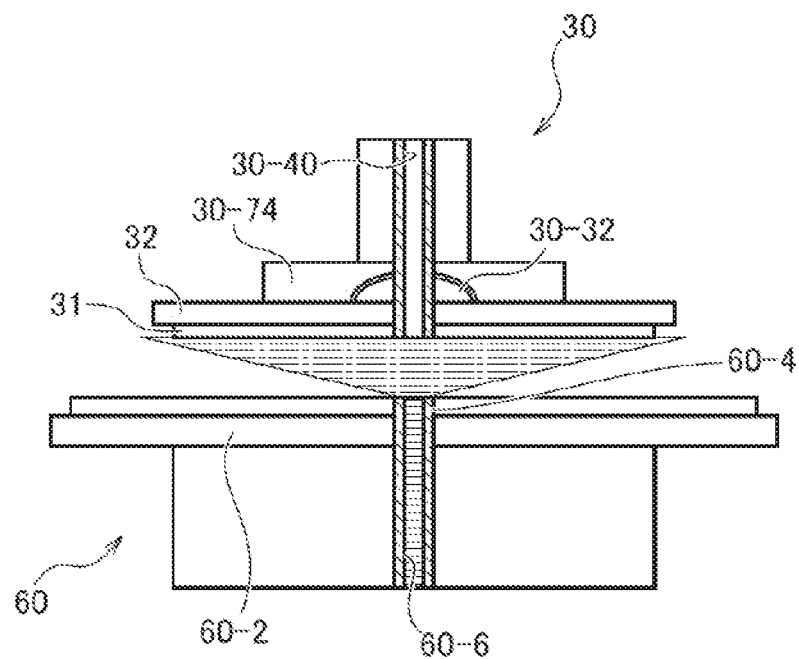
FIG. 17B is a schematic side view illustrating the configuration of the embodiment of the conditioning unit.

FIG. 17B is a schematic side view illustrating another embodiment of the conditioning unit 60. In the embodiment illustrated in FIG. 17B, the cleaning nozzle 60-4 is disposed inside the conditioning stage 60-2. More specifically, the cleaning nozzle 60-4 is disposed on the surface of the conditioning stage 60-2. In the present embodiment, the conditioning stage 60-2 includes a passage 60-6 for supplying the water and/or the chemical to the cleaning nozzle 60-4.

Providing the cleaning nozzle 60-4 to the conditioning unit 60, like the embodiment illustrated in FIGS. 17A and 17B, allows the conditioning unit 60 to remove the etching product that is adhered onto the catalyst 31 while the substrate is processed, with use of the water and/or the chemical. As described above, the catalyst holding unit 30 is rotatable, and the conditioning unit 60 can remove a residue, such as the etching product adhered on the catalyst 31, by spraying the water and/or the chemical onto the catalyst 31 while the catalyst holding unit 30 is rotated. In the embodiment illustrated in FIG. 17B, the cleaning nozzle 60-4 is disposed inside the conditioning stage 60-2, which facilitates the even supply of the water and/or the chemical to the entire catalyst 31 compared to disposing the cleaning nozzle 60-4 outside the conditioning stage 60-2, like the embodiment illustrated in FIG. 17A. On the other hand, the embodiment illustrated in FIG. 17A eliminates the necessity of providing the passage 60-6 inside the conditioning stage 60-2, and thus can simplify a layout of the pipe for supplying the water and/the chemical. The cleaning of the catalyst 31 according to any of the embodiments illustrated in FIGS. 17A and 17B may be used in combination with another conditioning process that will be described below. For example, the conditioning unit 60 may be configured to clean the catalyst 31 before the other conditioning process, and the cleaned catalyst 31 may be subject to further conditioning. Alternatively, the conditioning unit 60 may be configured to clean catalyst 31 according to any of the embodiments illustrated in FIGS. 17A and 17B after the other conditioning process, and remove a residue and the like generated while the catalyst 31 is conditioned, and the like. It is apparent that the conditioning unit 60 may clean the catalyst 31 according to any of the embodiments illustrated in FIGS. 17A and 17B both before and after the other conditioning process.

The conditioning unit 60 illustrated in each of FIGS. 17A and 17B can be configured to scrub and clean the catalyst 31 by being provided with the scrub cleaning unit 61 like the above-described scrub cleaning unit 61.

Figure 18:
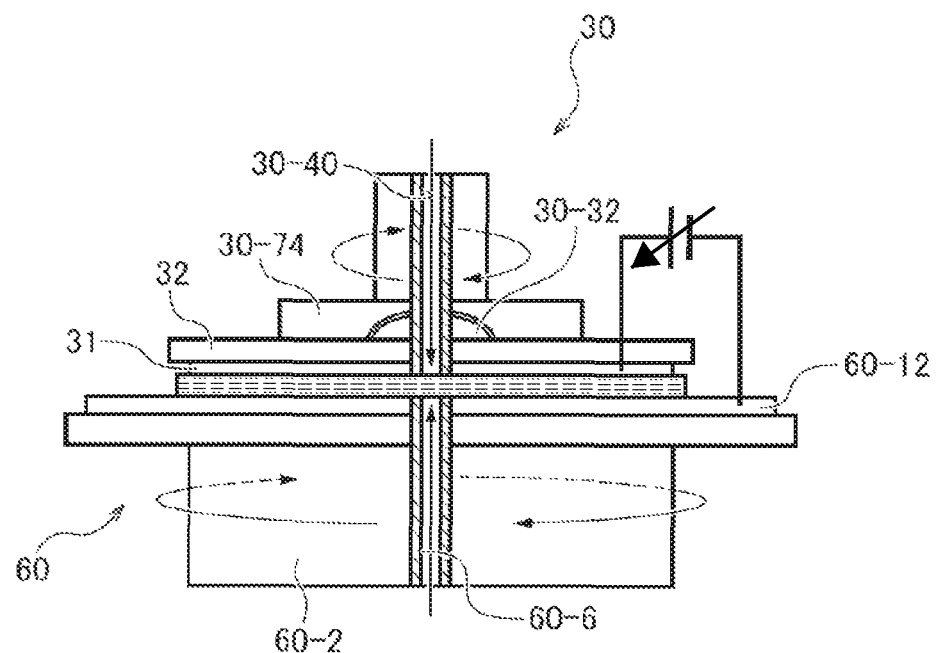
FIG. 18 is a schematic side view of a substrate processing apparatus as one embodiment.

FIG. 18 is a schematic side view illustrating another embodiment of the catalyst holding unit 30 and the conditioning unit 60. In the present embodiment, the catalyst holding unit 30 includes an electrode configured to be electrically connectable to the catalyst. Further, the conditioning unit 60 includes a regeneration electrode 60-12 disposed on the conditioning stage 60-2. Further, in the present embodiment, the conditioning unit 60 can supply the water and/or the chemical onto the conditioning stage 60-2 via the passage 60-6 formed through the conditioning stage 60-2. In addition or alternatively, the conditioning unit 60 may be configured to supply the water and/or the chemical onto the conditioning stage 60-2 via a processing liquid supply passage 30-40 extending through the catalyst holding unit 30, as will be described below.

In the embodiment illustrated in FIG. 18, the voltage is applied in such a manner that the electrode connected to the catalyst 31 becomes a positive side and the regeneration electrode 60-12 disposed on the conditioning stage 60-2 becomes a negative side, by way of example. As a result, the surface of the catalyst 31 can be electrolytically etched via the water and/or the chemical. Electrolytically etching the surface of the catalyst 31 can remove the surface of the catalyst 31 deteriorated due to the adhesion of the etching residue and generation of an altered layer from the etching processing performed on the substrate, so that the surface of the catalyst 31 can be recovered back to the active status.

Further, conversely, the voltage can also be applied in such a manner that the electrode connected to the catalyst 31 becomes the negative side and the regeneration electrode 60-12 disposed on the conditioning stage 60-2 becomes as the positive side. As a result, a reduction action can be caused on the surface of the catalyst 31 via the water and/or the chemical. For example, if the surface of the catalyst 31 is oxidized by the etching processing performed on the substrate, oxides on the surface of the catalyst can be reduced with the aid of the reduction action, so that the surface of the catalyst 31 can be recovered to the active status.

Figure 19:
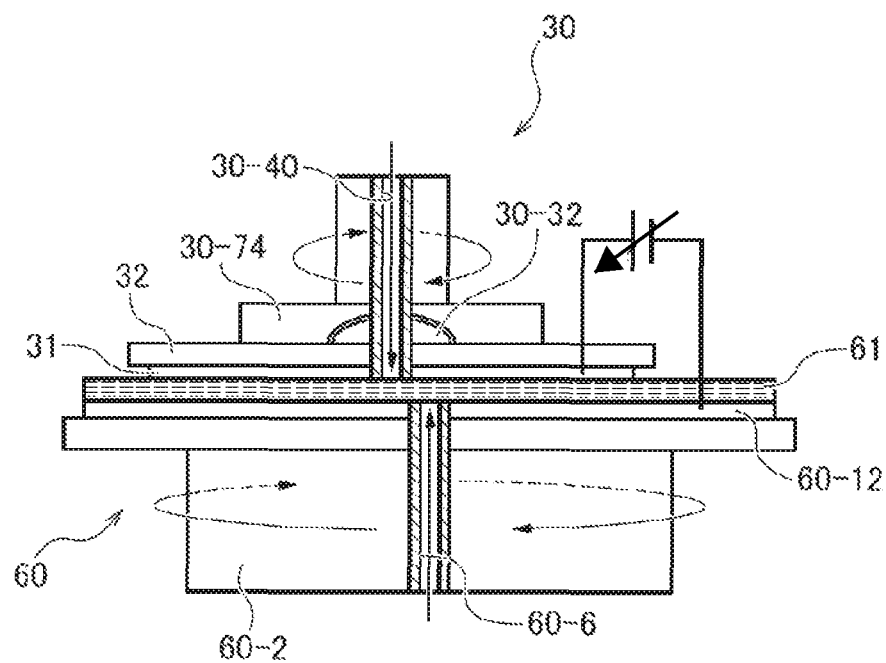
FIG. 19 is a schematic side view of a substrate processing apparatus as one embodiment.

FIG. 19 is a schematic side view illustrating another embodiment of the catalyst holding unit 30 and the conditioning unit 60. In the present embodiment, the conditioning unit 60 also uses the scrub cleaning together with the above-described application of the voltage. In the embodiment illustrated in FIG. 19, the conditioning unit 60 includes the scrub member 61 on the regeneration electrode 60-12 as illustrated in FIG. 19. The scrub member 61 can be made of, for example, a porous liquid-penetrative material. As a specific example of the material, the scrub member 61 can be made of polyvinyl alcohol (PVA). Further, a similar member to the polishing pad for use in the CMP apparatus may be used as the scrub member 61. In the present embodiment, the conditioning unit 60 also uses a physical action from the scrub cleaning in addition to an electric action from the application of the voltage, and thus can more effectively condition the catalyst 31 than conditioning the catalyst 31 with use of only one of them.

Further, an ion exchanger may be used as a modification of the embodiment illustrated in FIG. 18. The ion exchanger has a catalytic function for enhancing ionization of the water under an electric field, and enhances the ionization of the water upon application of a voltage when the catalyst 31 and the ion exchanger are located in proximity to or in contact with each other, thereby generating H+ ions and OH− ions. These H+ ions and OH− ions act on the surface of the catalyst 31, by which the surface of the catalyst 31 can be conditioned with the aid of electrolytic etching or can be conditioned with the aid of a reduction action. Further, liquid used in this case may be water or a dilute chemical, which can reduce a use amount of the chemical.

Figure 20:
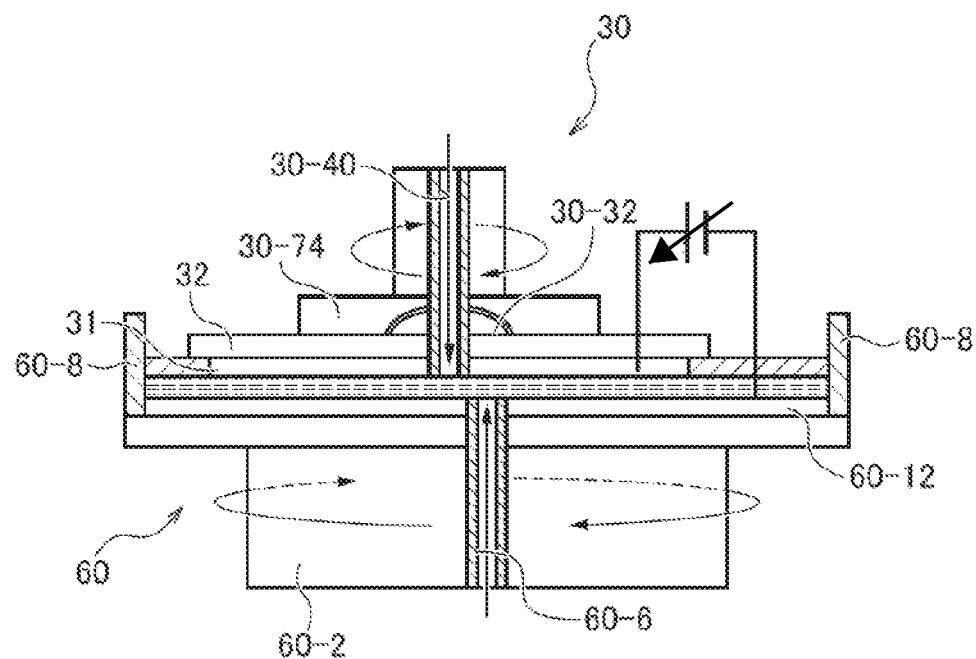
FIG. 20 is a schematic side view of a substrate processing apparatus as one embodiment.

FIG. 20 is a schematic side view illustrating another embodiment of the catalyst holding unit 30 and the conditioning unit 60. In the present embodiment, the conditioning stage 60-2 includes a wall 60-8 extending vertically upwardly throughout the circumferentially entire outer periphery. This wall 60-8 forms a liquid reservoir portion that temporarily holds the water and/or the chemical while the conditioning of the catalyst 31 is in progress. The wall 60-8 can be configured variably in height. This configuration allows the water and/or the chemical to be kept by a variable amount, and to be discharged by lowering the wall 60-8 after an end of the conditioning of the catalyst 31. Regarding the other structures, this embodiment can include any feature described in the embodiments illustrated in FIGS. 17 to 19, or a known feature. In the present embodiment, the water and/or the chemical can be kept in the liquid reservoir portion while the conditioning of the catalyst 31 is in progress. As a result, the catalyst 31 can be efficiently conditioned, and the catalyst 31 can be conditioned with use of a reduced amount of the water and/or the chemical. Further, in the embodiment illustrated in FIG. 20, the conditioning unit 60 can be configured to keep the water and/or the chemical in the liquid reservoir portion, and condition the catalyst by emitting an ultrasonic wave to the liquid in the liquid reservoir portion while the catalyst 31 is immersed in the liquid. The emitted ultrasonic wave is preferably an ultrasonic wave in the unit of kHz. In the present embodiment, the conditioning unit 60 can efficiently remove the residue adhered on the catalyst 31 by emitting the ultrasonic wave.

Figure 21:
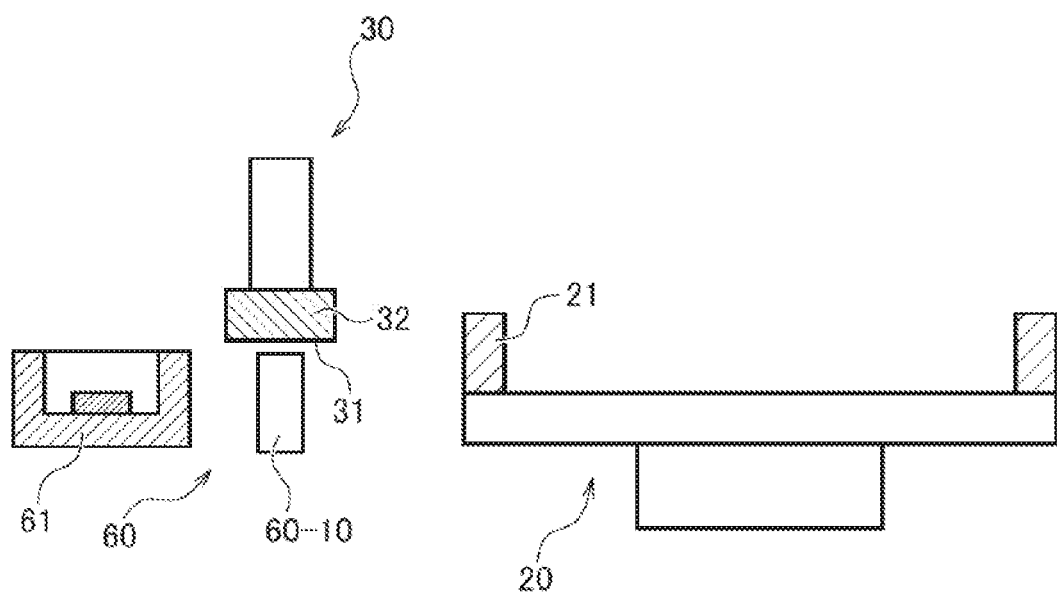
FIG. 21 is a schematic side view of a substrate processing apparatus as one embodiment.

FIG. 21 schematically illustrates the conditioning unit 60 as one embodiment. In the embodiment illustrated in FIG. 21, the conditioning unit 60 includes a catalyst measurement sensor 60-10 for measuring the status of the surface of the catalyst 31.

As one embodiment, the catalyst measurement sensor 60-10 can be a resistance sensor that measures electric resistance of the catalyst 31. If the catalyst 31 is metal, an electric resistance value varies due to a change in the film thickness of the catalyst 31, the adhesion of the etching residue on the surface of the catalyst 31, and the generation of the altered layer constituted by oxides. Use of this variation allows the catalyst measurement sensor 60-10 to measure the status of the surface of the catalyst 31.

As one embodiment, the catalyst measurement sensor 60-10 can be a thickness sensor that measures the thickness of the catalyst. For example, if the catalyst is metal, the thickness of the catalyst can be measured by measurement of an eddy current flowing on the surface of the catalyst 31. More specifically, a high-frequency current is applied to a sensor coil disposed in proximity to the surface of the catalyst 31 to generate the eddy current on the catalyst 31, thereby producing an induction magnetic field on the electrically-conductive metallic film formed on the catalyst 31. The eddy current generated there and a synthetic impedance calculated therefrom vary according to the thickness of the metallic film of the catalyst 31, the adhesion of the etching residue on the surface of the catalyst 31, and the altered layer constituted by the oxides, so that the thickness sensor 60-10 can measure the status of the catalyst 31 in a non-contact manner by using this variation.

As one embodiment, the catalyst measurement sensor 60-10 is an optical sensor. Use of the optical sensor allows the catalyst measurement sensor 60-10 to measure the status of the surface of the catalyst 31 in a non-contact manner by measuring a reflection intensity according to the change in the film thickness if the catalyst 31 is a light transmissive material.

Generally, the catalyst is conditioned for the purpose of keeping the surface of the catalyst in an optimal status. The insufficiently conditioned catalyst makes it impossible to acquire a desired capability of etching the substrate to be processed due to the deterioration of the active status of the catalyst surface. On the other hand, the excessively conditioned catalyst leads to a shortened lifetime of the catalyst. The use of the catalyst measurement sensor 60-10 to measure the status of the surface of the catalyst, like the above-described sensor, allows the conditioning unit 60 to acquire an appropriate catalytic status with a minimum conditioning amount. For example, the conditioning unit 60 can detect an end point of the conditioning while measuring the status of the catalyst with use of the catalyst measurement sensor 60-10 as needed in the process of the conditioning of the catalyst 31. More specifically, the adhesion of the etching residue on the catalyst 31 or the generation of the altered layer constituted by the oxides, if any, leads to an increase in the electric resistance of the surface of the catalyst 31. On the other hand, the electric resistance reduces as the catalyst 31 is being conditioned and the surface of the catalyst 31 is being cleaned. Therefore, the conditioning unit 60 can determine the end point of the conditioning by using the catalyst measurement sensor 60 of the type that measures the above-described electric resistance or the above-described impedance from the eddy current. Alternatively, the conditioning unit 60 can measure the status of the catalyst with use of the catalyst measurement sensor 60-10 before conditioning the catalyst 31, and predetermine a parameter of the conditioning, such as a setting of the conditioning (for example, a time to be taken for the conditioning, a setting about the application of the voltage, and a scrub setting such as a pressure with which the scrum member 61 should contact the catalyst 31 and the number of times that the scrub member 61 should rotate), based on the measured value. Alternatively, the conditioning unit 60 can also estimate the status of the catalyst 31 from a processing rate while the substrate is processed with use of a monitoring unit 480, which will be described below, without use of the catalyst measurement sensor 60-10 to determine the parameter of the conditioning. Further, the catalyst measurement sensor 60-10a also allows the conditioning unit 60 to acquire a signal corresponding to the film thickness of the catalyst 31, and determine a timing when the catalyst 31 should be replaced by monitoring a reduction in the catalyst 31 due to wear.

Having described the conditioning to correct the deterioration of the surface of the catalyst 31, the deterioration of the catalyst 31 can be eliminated or reduced even by another method than the above-described conditioning especially with respect to the generation of the altered layer, such as the oxidation of the surface of the catalyst 31. For example, in one embodiment, the substrate processing apparatus 10 uses platinum, nickel, iron, or chrome as the catalyst 31, and the catalyst holding unit 30 includes the counter electrode electrically connectable to this metallic catalyst via the processing liquid. Metal having larger ionization tendency than the metal of the catalyst 31 can be used for this counter electrode. In this case, an electromotive force is generated between the two kinds of metal in a direction in which electrons move from the metal with smaller ionization tendency to the metal with larger ionization tendency while the wafer W is processed. As a result, the electrode with larger ionization tendency is preferentially oxidized, which reduces or prevents oxidation and/or hydroxylation of the catalyst 31, which is the metal with smaller ionization tendency.

Further, in one embodiment, the conditioning unit 60 includes a gas supply nozzle for supplying gas to the surface of the catalyst 31. A nozzle configured similarly to the catalyst cleaning nozzle 60-4 illustrated in FIG. 17A can be used as a specific configuration of the gas supply nozzle. Alternatively, a gas source for supplying dry air or nitrogen gas may be connected to the catalyst cleaning nozzle 60-4 so as to allow the catalyst cleaning nozzle 60-4 to be used as the gas supply nozzle. Generally, a metal surface is oxidized and/or hydroxylated due to existence of water. Therefore, the oxidation and/or the hydroxylation of the catalyst 31 can be removed or reduced by injecting the dry air or the nitrogen gas onto the surface of the catalyst 31 with use of the gas supply nozzle to dry the surface of the catalyst 31 while the etching processing of the wafer W is stopped for a long time (for example, an interval time period in lot processing of the wafer W).

The conditioning unit 60 may be configured to remove or reduce the oxidation and/or the hydroxylation of the catalyst 31 by applying the voltage in such a manner that the electrode on the catalyst side becomes the negative side and the regeneration electrode becomes the positive side as described with reference to FIGS. 18 and 19 to thereby cause the reduction action on the surface of the catalyst 31, so as to remove or reduce the oxidation and/or the hydroxylation of the catalyst 31 during the interval time period in which the etching processing of the wafer W is stopped.

Further, the substrate processing apparatus 10 may be used in combination with the CMP apparatus. This combined use allows the substrate processing apparatus 10 to flexibly process the semiconductor material on the substrate, thereby improving the processing capability as a whole. The order of the processing performed by the substrate processing apparatus 10 and the processing performed by the CMP apparatus varies depending on the material to be processed, so that a transfer route by the substrate transfer unit can be selected appropriately according to a situation. For example, the substrate processing apparatus 10 can process the wafer W after the CMP apparatus processes the wafer W first, or the CMP apparatus processes can process the wafer W after the substrate processing apparatus 10 processes the wafer W first.

B. Second Embodiment

Figure 8:
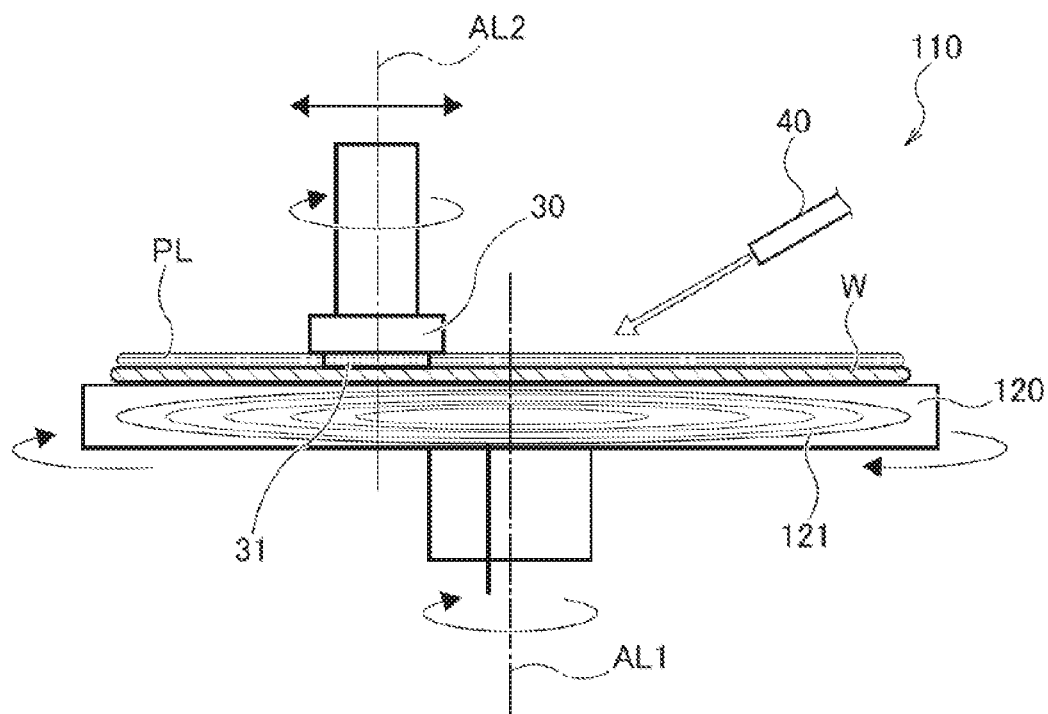
FIG. 8 is a schematic side view of a substrate processing apparatus as a second embodiment.

FIG. 8 schematically illustrates a configuration of a substrate processing apparatus 110 as a second embodiment. In FIG. 8, similar components to the components illustrated in FIG. 2 are identified by the same reference numerals indicated in FIG. 2, and will not be described below. The same applies to the other drawings. In the substrate processing apparatus 110 according to the present embodiment, a substrate temperature control unit 121 is mounted in the substrate holding unit 120. The substrate temperature control unit 121 is, for example, a heater, and is configured to control the temperature of the wafer W. The temperature of the wafer W is adjusted to a desired temperature by the substrate temperature control unit 121. The CARE method is chemical etching, so that the etching rate thereof depends on the temperature of the substrate. According to this configuration, the substrate processing apparatus 110 can change the etching rate according to the temperature of the substrate. As a result, the substrate processing apparatus 110 can adjust the etching rate and the uniformity. In the present embodiment, a plurality of heaters may be arranged concentrically, and a temperature of each of the heaters may be adjusted. Alternatively, a single heater may be spirally laid in the substrate temperature control unit 121.

As an alternative configuration, the substrate processing apparatus 110 may include a processing liquid temperature adjustment unit that adjusts a temperature of the processing liquid PL to a predetermined temperature instead of or in addition to the substrate temperature control unit 121. Alternatively, the catalyst holding unit 30 may include a catalyst temperature control mechanism that adjusts a temperature of the catalyst 31 instead of or in addition to them. This configuration also allows the substrate processing apparatus 110 to adjust the etching rate by adjusting the temperature of the processing liquid. The temperature of the processing liquid PL may be adjusted to, for example, a predetermined temperature within a range of 10 degrees or higher and 60 degrees or lower.

Further, the etching capability can be stabilized by applying this temperature dependency, and for example, placing the substrate processing apparatus 110 in a constant-temperature bath to thereby control the temperature of the entire substrate processing apparatus 110.

C. Third Embodiment

Figure 9:
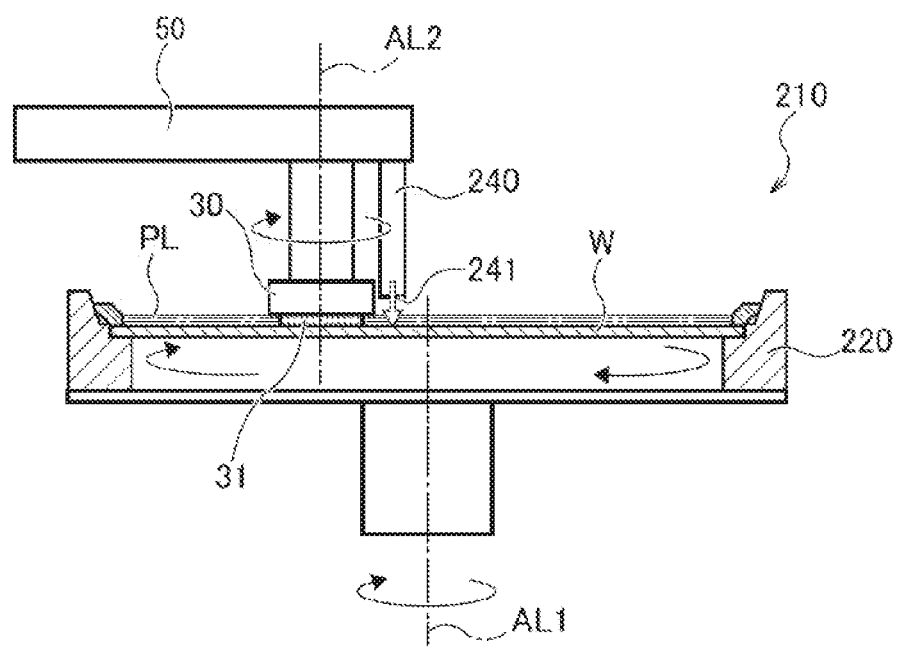
FIG. 9 is a schematic side view of a substrate processing apparatus as a third embodiment.

FIG. 9 schematically illustrates a configuration of a substrate processing apparatus 210 as a third embodiment. The substrate processing apparatus 210 includes a processing liquid supply unit 240 in place of the processing liquid supply unit 40, which is a difference from the first embodiment. In the present example, FIG. 9 illustrates a substrate holding unit 220 as including a clamp mechanism that clamps the front surface and the back surface of the wafer W. The processing liquid supply unit 240 is fixed to the swing arm 50 at a position in the vicinity of the catalyst holding unit 30, preferably, at an upstream portion in terms of the rotation of the wafer W, i.e., a position where the processing liquid supplied from the processing liquid supply unit 240 can be efficiently supplied to the catalyst holding unit 30 due to the rotation of the wafer W. Therefore, a supply port 241 is configured to be moved together with the catalyst holding unit 30 to supply the processing liquid PL onto the processing target region of the wafer W. This configuration allows the processing liquid supply unit 240 to always supply the fresh processing liquid PL to around the catalyst 31, resulting in the stabilization of the etching capability. Further, the processing liquid can be supplied to around the portion where the catalyst 31 and the wafer W are in contact with each other regardless of how the swing arm 50 of the catalyst holding unit 30 swings, which contributes to a reduction in the use amount of the processing liquid.

D. Fourth Embodiment

Figure 10:
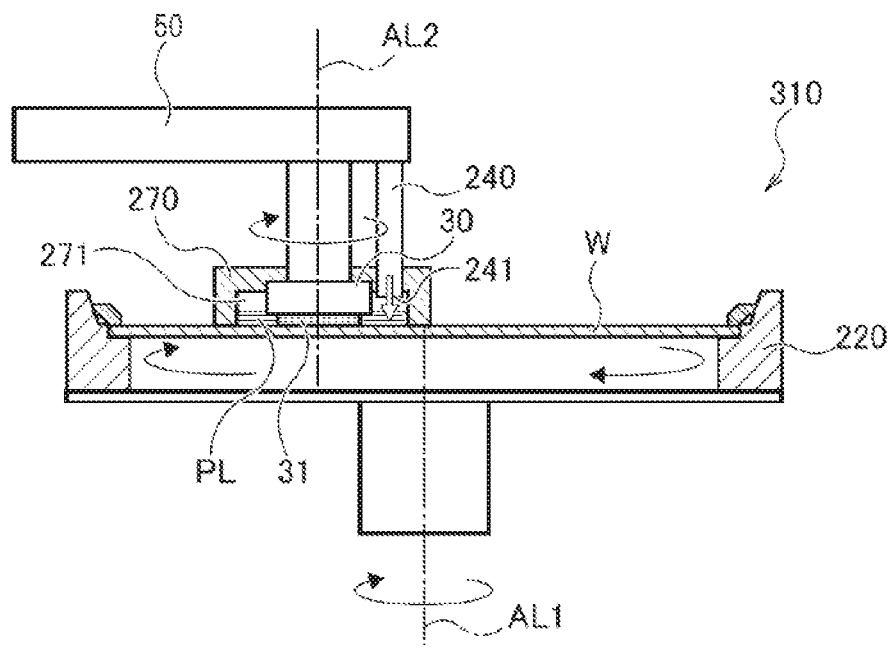
FIG. 10 is a schematic side view of a substrate processing apparatus as a fourth embodiment.

FIG. 10 schematically illustrates a configuration of a substrate processing apparatus 310 as a fourth embodiment. The substrate processing apparatus 310 includes a processing liquid holding unit 270, which is a difference from the third embodiment. The processing liquid holding unit 270 has a box-like shape opening on a bottom side facing the wafer W, and surrounds the catalyst holding unit 30 around the catalyst holding unit 30. The processing liquid supply unit 240 penetrates through the processing liquid holding unit 270, as a result of which the supply port 241 is located inside an inner space 271 and the processing liquid PL is supplied into the inner space 271. A clearance is secured between the processing liquid holding unit 270 and the wafer W so as to prevent the processing liquid holding unit 270 from damaging the wafer W by sliding on the wafer W. This clearance is extremely narrow, and the processing liquid PL supplied into the inner space 271 is mostly held in the inner space 271. This configuration allows the processing liquid PL to be held almost only around the catalyst 31, thereby succeeding in significantly reducing the use amount of the processing liquid PL. In the present embodiment, the clearance is formed between the processing liquid holding unit 270 and the wafer W, but the processing liquid holding unit 270 and the wafer W can be in contact with each other without damaging the wafer W by providing an elastic member, such as a sponge, between a surface of the processing liquid holding unit 270 that faces the wafer W.

Figure 11:
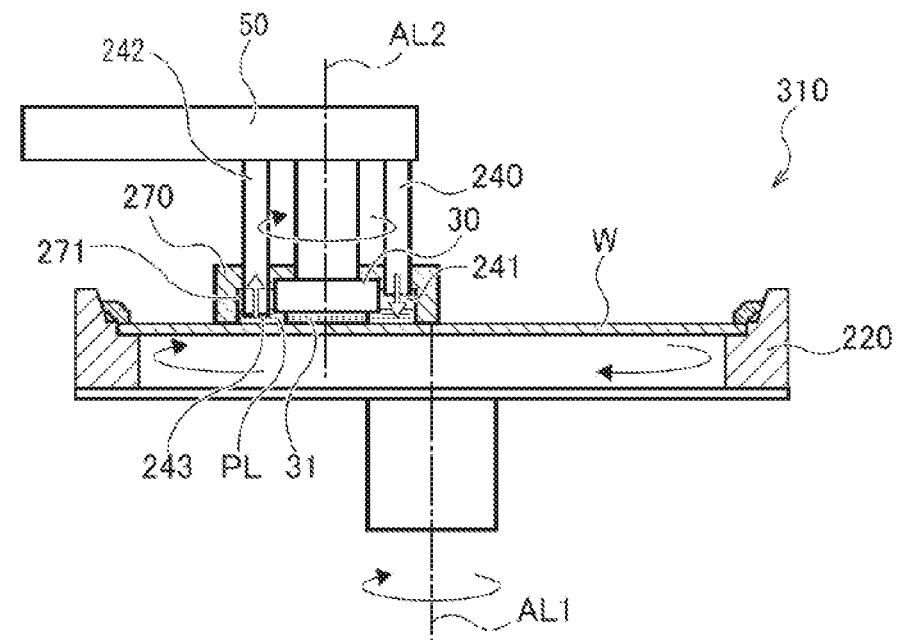
FIG. 11 is a schematic side view of a substrate processing apparatus as a modification of the fourth embodiment.

FIG. 11 illustrates a modification of the substrate processing apparatus 310 illustrated in FIG. 10. In this example, the substrate processing apparatus 310 further includes a processing liquid suction unit 242. The processing liquid suction unit 242 penetrates through the processing liquid holding unit 270, as a result of which a suction port 243 is located inside the inner space 271. In other words, the processing liquid suction unit 242 is in communication with the inner space 271. A suction device (not illustrated), such as a pump, is connected to the processing liquid suction unit 242. The processing liquid PL held in the inner space 271 is sucked and removed by this processing liquid suction unit 242. This configuration allows the processing liquid supply unit 240 to always supply the fresh processing liquid PL onto the catalyst 31, as a result of which the etching capability can be stabilized.

Figure 29:
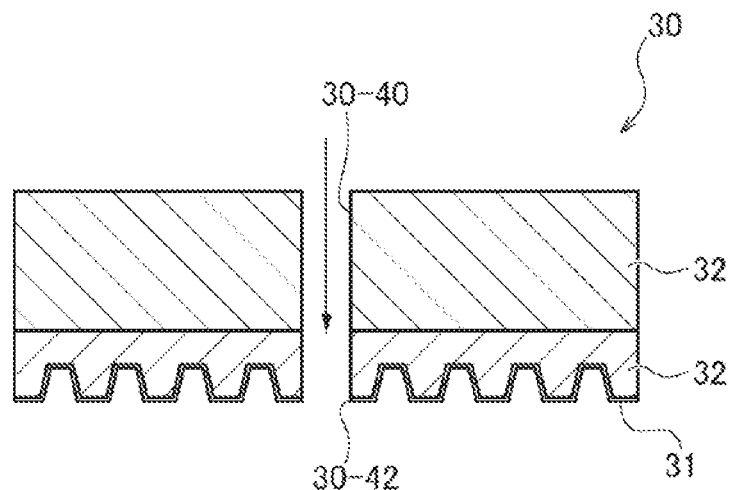
FIG. 29 is a schematic side view of a catalyst holding unit as one embodiment.

FIG. 29 is a schematic side cross-sectional view illustrating one embodiment of the catalyst holding unit 30 usable for the substrate processing apparatus disclosed in the present disclosure. In the substrate processing apparatus 210 according to this embodiments, a pipe of the processing liquid supply unit 240 extends through a rotational axis of the swing arm 50 and the catalyst holding unit 30, and the catalyst holding unit 30, and the processing liquid PL is supplied from the surface of the catalyst 31 that contacts the wafer W. Further, in this embodiment, the catalyst 31 and the catalyst holding member 32 (for example, the elastic member 32) include the processing liquid supply passage 30-40 for supplying the processing liquid PL supplied via the catalyst holding unit 30 to between the wafer W and the catalyst 31, and a supply port 30-42 for supplying the processing liquid is formed on the surface of the catalyst 31. As described above, the delivery of the processing liquid PL in the plane of the catalyst 31 affects the distribution of the etching rate in the plane of the catalyst in contact with the wafer W. In the configuration in which the wafer W and the catalyst holding unit 30 rotate, the rotation may fail to allow the processing liquid PL to be sufficiently delivered to the surface where the catalyst 31 and the wafer W are in contact with each other depending on the condition of the number of rotations, if the processing liquid PL is supplied from outside the catalyst holding unit 30. In this case, the processing liquid PL may be unable to be sufficiently evenly introduced to between the wafer W and the catalyst 31. In the embodiment illustrated in FIG. 29, the processing liquid PL is supplied from inside the region where the wafer W and the catalyst 31 are in contact with each other, which allows the processing liquid PL to be evenly introduced to the region where the wafer W and the catalyst 31 are in contact with each other. Therefore, the uniformity of the etching rate can be improved on the region where the wafer W and the catalyst 31 are in contact with each other. Further, the processing liquid PL can be supplied from inside the region where the catalyst 31 and the wafer W are in contact with each other regardless of how the swing arm 50 of the catalyst holding unit 30 swings, which contributes to a reduction in the use amount of the processing liquid PL.

Figure 30:
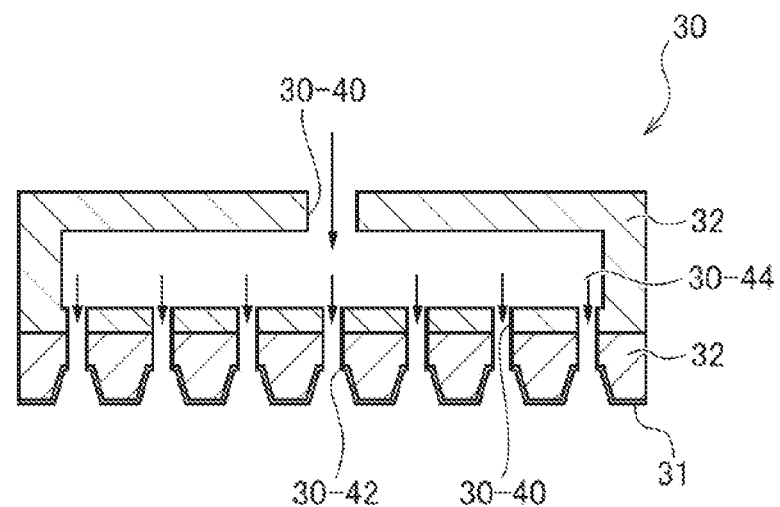
FIG. 30 is a schematic side view of a catalyst holding unit as one embodiment.

FIG. 30 is a schematic side cross-sectional view illustrating one embodiment of the catalyst holding unit 30 usable for the substrate processing apparatus disclosed in the present disclosure. In the embodiment illustrated in FIG. 30, the catalyst holding unit 30 is configured in such a manner that the processing liquid PL is supplied from a groove of the catalyst 31 via the pipe of the processing liquid supply unit 240, the rotational axis of the swing arm 50 and the catalyst holding unit 30, and the catalyst holding unit 30, similarly to the embodiment illustrated in FIG. 29. In the embodiment illustrated in FIG. 30, the catalyst holding unit 30 includes, in the catalyst holding member 32, a buffer portion 30-44 in fluid communication with the pipe of the processing liquid PL inside the swing arm 50. Further, the catalyst 31 and the catalyst holding member 32 include a plurality of processing liquid supply passages 30-40 for supplying the processing liquid PL from the buffer portion 30-44 to between the wafer W and the catalyst 31 via the groove of the catalyst 31. Then, a plurality of supply ports 30-42, which is used to supply the processing liquid onto the surface of the catalyst 31, is formed on a bottom the groove. In the embodiment illustrated in FIG. 30, the processing liquid PL transmitted through the swing arm 50 is temporarily held in the buffer portion 30-44, and is supplied from the buffer portion 30-44 to around the region (the groove) where the wafer W and the catalyst 31 are in contact with each other via the plurality of supply ports 30-42. In the embodiment illustrated in FIG. 30, the processing liquid PL is supplied from the plurality of supply ports 30-42 formed on the surface of the catalyst 31, which facilitates more even supply of the processing liquid PL than the embodiment illustrated in FIG. 29. Further, the embodiment illustrated in FIG. 29 can also realize further even supply of the processing liquid PL by providing the surface of the catalyst 31 with an appropriate groove usable for the processing liquid PL to pass through.

Figure 39A:
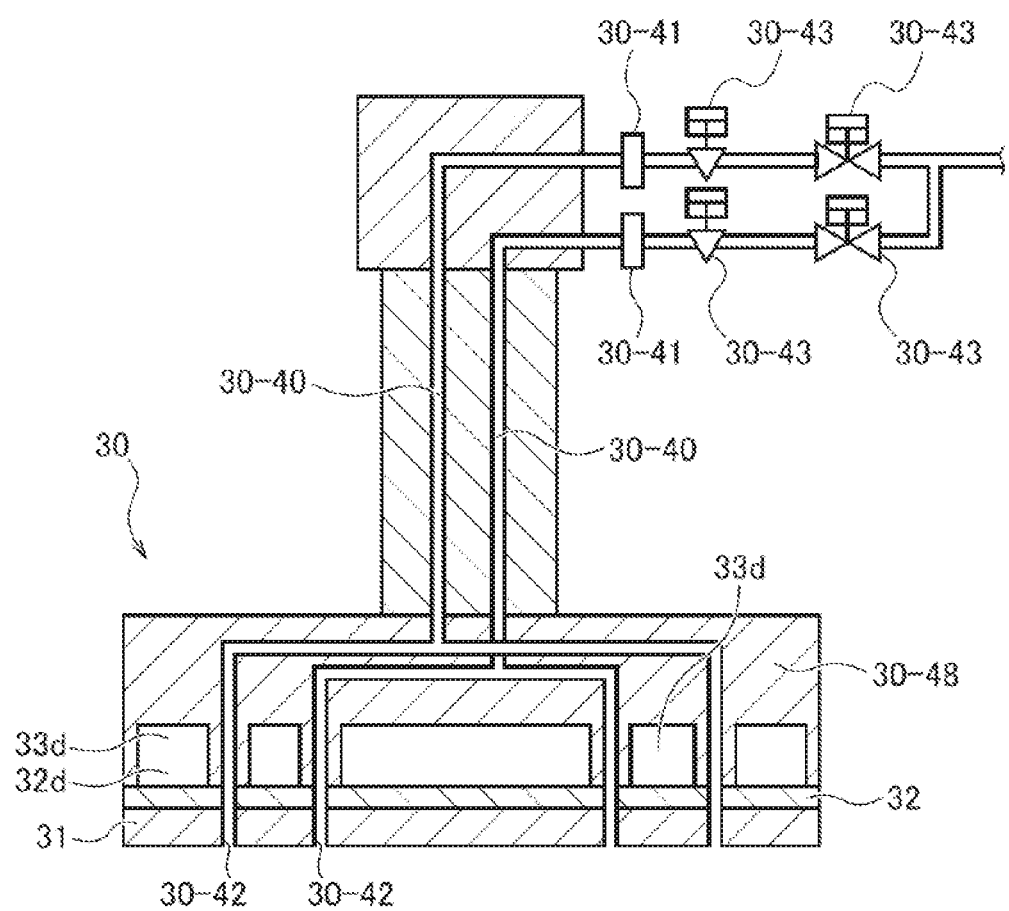
FIG. 39A is a schematic side view of a catalyst holding unit as one embodiment.
Figure 39B:
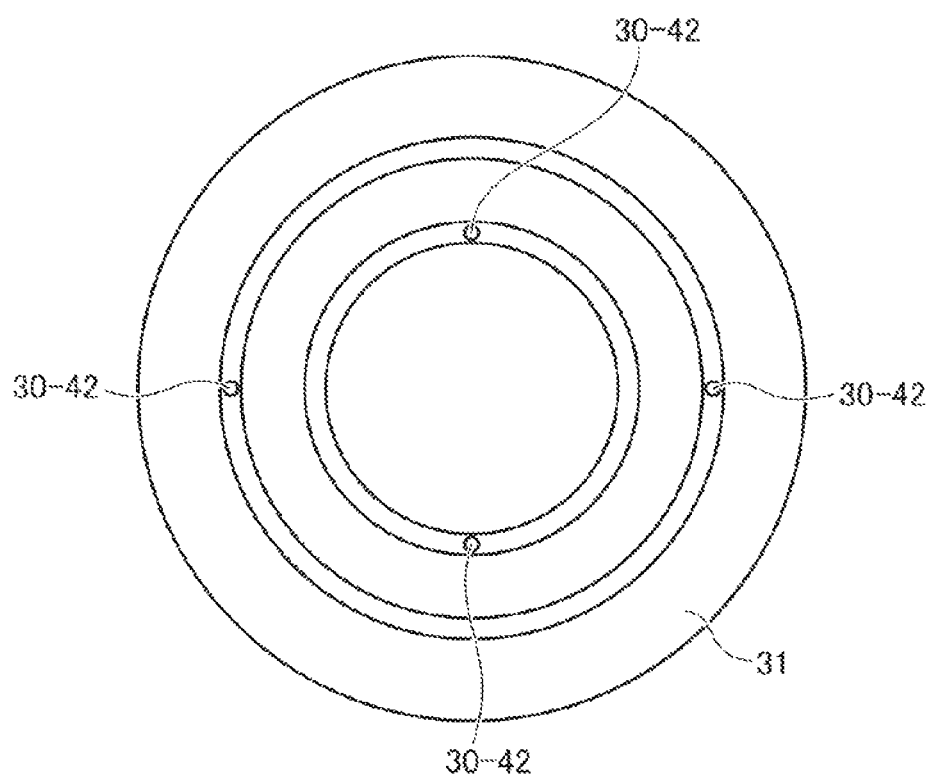
FIG. 39B is a plan view of the catalyst holding unit illustrated in FIG. 39A as viewed from the catalyst.

FIG. 39A is a schematic side cross-sectional view illustrating one embodiment of the catalyst holding unit 30 usable for the substrate processing apparatus disclosed in the present disclosure. FIG. 39B is a plan view of the catalyst holding unit 30 illustrated in FIG. 39A as viewed from the catalyst 31. In the embodiment illustrated in FIG. 39A, the catalyst holding unit 30 is configured in such a manner that the processing liquid PL is supplied from the surface of the catalyst 31 that contacts the wafer W via the pipe of the processing liquid supply unit 240, the rotational axis of the swing arm 50 and the catalyst holding unit 30, and the catalyst holding unit 30, similarly to the embodiment illustrated in FIG. 29A. Further, in the embodiment illustrated in FIG. 39A, the catalyst holding unit 30 includes an elastic member 32d that forms a plurality of concentrically arranged pressure chambers 33d, and is configured to be able to independently control a pressure in each of the pressure chambers 33d, similarly to the embodiment illustrated in FIG. 7. In the embodiment illustrated in FIG. 39A, the processing liquid PL is supplied from a plurality of processing liquid supply passages 30-40 extending through between the plurality of pressure chambers 33d and their respective supply ports 30-42. In the embodiment illustrated in FIG. 39B, four supply ports 30-42 of the processing liquid are formed on the surface of the catalyst 31. Further, in the embodiment illustrated in FIG. 39B, grooves as a concentric circle pattern are formed on the surface of the catalyst 31. These grooves are formed so as to allow the processing liquid PL to flow in the plane of the wafer W between the catalyst 31 and the wafer W with the catalyst 31 and the wafer W in contact with each other. The supply ports 30-42 of the processing liquid PL are desirably arranged in these grooves to efficiently distribute the processing liquid. As another embodiment, the number and the layout of the supply ports 30-42, and the groove pattern may be arbitrarily set. In the embodiment illustrated in FIGS. 39A and 39B, the substrate holding unit 30 is configured to be able to adjust a flow amount of the processing liquid PL for each radial position independently. For example, as illustrated in FIG. 39A, a flowmeter 30-41, and a valve 30-43 for adjusting the flow amount of the processing liquid can be provided to each of the processing liquid supply passage 30-40. In the illustrated embodiment, the substrate holding unit 30 can be configured to supply the processing liquid by equal flow amounts via the processing liquid supply passages 30-40 located at same radial positions, and supply the processing liquid by different flow amounts via the processing liquid supply passages 30-40 located at different radial positions. Further, although not illustrated, the substrate holding unit 30 may include a branch valve in the processing liquid supply passage 30-40 and be configured to be able to supply a plurality of different kinds of processing liquid via the single processing liquid supply passage 30-40.

Figure 39C:
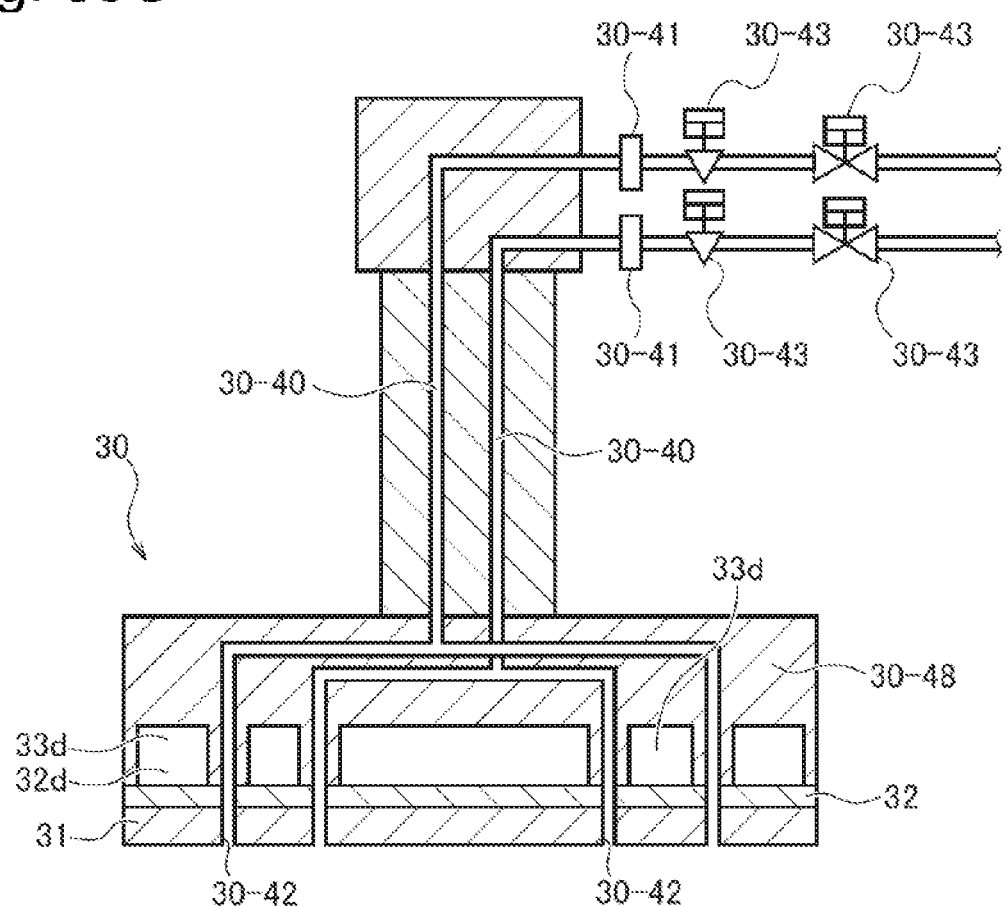
FIG. 39C is a schematic side view of a catalyst holding unit as one embodiment.
Figure 39D:
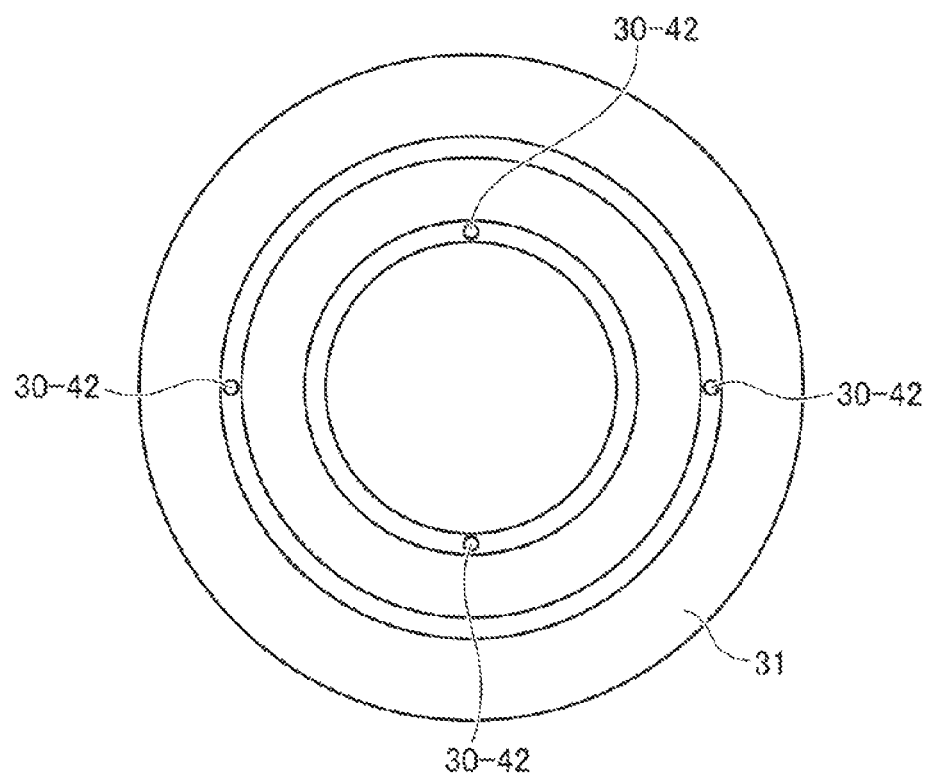
FIG. 39D is a plan view of the catalyst holding unit illustrated in FIG. 39C as viewed from the catalyst.

FIG. 39C is a schematic side cross-sectional view illustrating one embodiment of the catalyst holding unit 30 usable for the substrate processing apparatus disclosed in the present disclosure. FIG. 39D is a plan view of the catalyst holding unit 30 illustrated in FIG. 39C as viewed from the catalyst 31. In the embodiment illustrated in FIG. 39C, the catalyst holding unit 30 is configured to be able to supply a plurality of different kinds of processing liquid onto the surface of the catalyst 31 simultaneously, unlike the embodiment illustrated in FIG. 39A. FIG. 39C illustrates the catalyst holding unit 30 as being capable of supplying two kinds of processing liquid. However, as another embodiment, the substrate holding unit 30 may include a larger number of processing liquid supply passages 30-40 and a larger number of various valves 30-43, and be configured to be able to supply a larger number of kinds of processing liquid.

In the embodiments illustrated in FIGS. 39A to 39D, the pressure with which the catalyst 31 and the wafer W are in contact with each other can be adjusted for each of the regions located at different radial positions, and the amount by which the processing liquid PL is supplied can be also adjusted for each of the regions located at different radial positions. Therefore, these embodiments allow the substrate processing apparatus to control the in-plane distribution of the contact pressure on the region where the wafer W and the catalyst 31 are in contact with each other during the etching processing, thereby further improving the uniformity of the etching rate. Further, the substrate processing apparatus can supply the different kinds of processing liquid onto the surface of the catalyst 31 simultaneously, whereby the configurations of the present embodiments can be effectively used for the process of the wafer W processing by various CARE methods.

E. Fifth Embodiment

Figure 12:
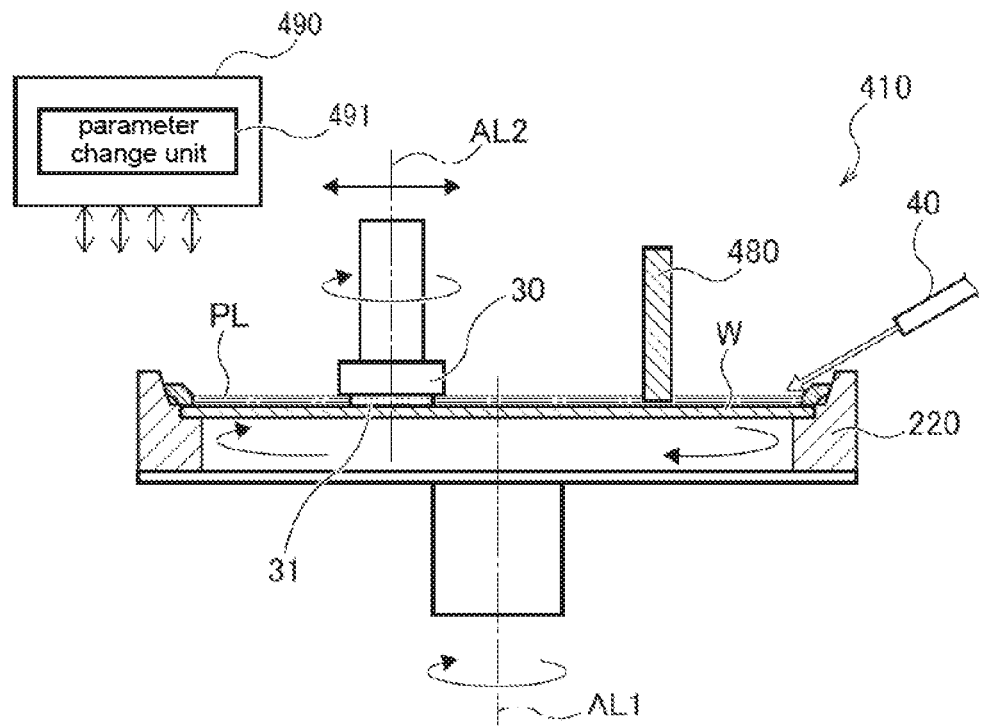
FIG. 12 is a schematic side view of a substrate processing apparatus as a fifth embodiment.

FIG. 12 schematically illustrates a configuration of a substrate processing apparatus 410 as a fifth embodiment. The substrate processing apparatus 410 includes a monitoring unit 480, and a control unit 490 also includes a parameter change unit 491, which are differences from the above-described embodiments. The monitoring unit 480 monitors the status of the etching processing performed on the processing target region of the wafer W. The monitoring unit 480 is configured to be horizontally movable to a specific position on the wafer W by an actuator. The present monitoring unit 480 may be fixed to the specific position, but may be moved in the plane of the wafer W during the etching processing. If the monitoring unit 480 is movable in the plane of the wafer W, the monitoring unit 480 may be configured to be movable according to the movement of the catalyst holding unit 30. This configuration allows the monitoring unit 480 to detect a distribution of the status of the etching processing in the plan of the wafer W. The monitoring unit 480 is configured differently depending on the material of the processing target region. Further, if the processing target region is made of a plurality of materials, a plurality of monitoring units may be used in combination. For example, if the polishing target is a metallic film formed on the wafer W, the monitoring unit 480 may be configured as an eddy current monitoring unit. More specifically, the monitoring unit 480 applies a high-frequency current to a sensor coil disposed in proximity to the surface of the wafer W to generate an eddy current on the wafer W, thereby producing an induction magnetic field on the electrically-conductive metallic film formed on the wafer W. The eddy current generated at this time and a synthetic impedance calculated therefrom vary according to the thickness of the metallic film, so that the monitoring unit 480 can monitor the status of the etching processing with use of this variation.

The monitoring unit 480 can have not only the above-described configuration but also various configurations. For example, if a polishing target is a light transmissive material, such as an oxidized film, the monitoring unit 480 may emit light toward the processing target region of the wafer W and detect light reflected therefrom. More specifically, the monitoring unit 480 receives refection light reflected on the surface of the processing target region of the wafer W or reflected after being transmitted through the processing target layer of the wafer W. An intensity of this reflection light varies depending on the film thickness of the processing target layer, so that the monitoring unit 480 can monitor the status of the etching processing based on this variation.

Alternatively, if a processing target layer is a compound semiconductor (for example, GaN or SiC), the monitoring unit 480 may use at least one of a photocurrent method, a photoluminescence optical method, and a Raman optical method. According to the photocurrent method, the monitoring unit 480 measures a value of a current flowing through a conductive wire connecting the wafer W and a metallic wiring laid in the substrate holding unit 20 when the surface of the wafer W is irradiated with excitation light, thereby measuring the etching amount of the surface of the wafer W. According to the photoluminescence optical method, the monitoring unit 480 measures photoluminescence light discharged from the surface of the wafer W when this surface is irradiated with excitation light, thereby measuring the etching amount of the surface of the wafer W. According to the Raman optical method, the monitoring unit 480 irradiates the surface of the wafer W with visible monochromatic light to measure Raman light contained in light reflected from this surface, thereby measuring the etching amount of the surface of the wafer W.

Alternatively, the monitoring unit 480 may monitor the status of the etching processing based on a torque current of the driving unit when the substrate holding unit 220 and the catalyst holding unit 30 are moved relative to each other. This configuration allows the monitoring unit 480 to monitor a friction status generated due to the contact between the semiconductor material of the substrate and the catalyst via the torque current, thereby monitoring the etching status based on a variation in the torque current due to, for example, a change in the roughness status of the semiconductor material or an exposure of another material on the processing target surface.

Further, as one exemplary embodiment, the monitoring unit 480 may be configured as a vibration sensor included in the catalyst holding unit 3. The monitoring unit 480 detects a vibration when the substrate holding unit 220 and the catalyst holding unit 30 are moved relative to each other with use of the vibration sensor. The friction status between the wafer W and the catalyst 31 varies if the roughness status of the wafer W changes or another material is exposed while the wafer W is processed, and the vibration status varies due to this variation in the friction status. The monitoring unit 480 can detect the status of the processing performed on the wafer W by detecting this variation in the vibration with use of the vibration sensor.

The status of the etching processing monitored in this manner is reflected in the processing performed on the next wafer W in the substrate processing apparatus 410 by the parameter change unit 491. More specifically, the parameter change unit 491 changes a control parameter regarding the condition of the etching processing to be performed on the next wafer based on the status of the etching processing monitored by the monitoring unit 480. For example, the parameter change unit 491 changes the control parameter based on a difference between a distribution of the thickness of the processing target layer acquired based on the result of the monitoring by the monitoring unit 480 and a predetermined target distribution of the thickness in such a manner that this difference reduces. This configuration allows the substrate processing apparatus 410 to feed back the result of the monitoring by the monitoring unit 480, thereby succeeding in improving an etching performance of the processing performed on the next wafer.

The control unit 490 may feed back the result of the monitoring by the monitoring unit 480 for the processing performed on the wafer W currently in process. For example, the control unit 490 may change a parameter among conditions of the processing by the substrate processing apparatus 410 in the middle of the processing, in such a manner that the difference between the distribution of the thickness of the processing target region acquired based on the result of the monitoring by the monitoring unit 480 and the predetermined target distribution of the thickness falls within a predetermined range (ideally, zero). The result of the monitoring acquired by the monitoring unit 480 can be not only fed back for the above-described conditions of the processing but also used to function as an end point detection unit for detecting the end point of the polishing processing.

Further, the substrate processing apparatus 410 may include a thickness measurement unit that measures the thickness of the wafer W after the processing, instead of the above-described monitoring unit 480. The thickness measurement unit may be disposed outside the substrate holding unit 220. The processed wafer W is transferred to the thickness measurement unit, and is measured there in terms of the distribution of the thickness of the processing target layer thereof. A result of the measurement by this thickness measurement unit can also be fed back for the conditions of the processing to be performed on the next wafer W, similarly to the monitoring unit 480. More specifically, the control unit 490 calculates a value of a difference between the result of this measurement and a target film thickness, and changes the condition of the processing to be performed on the wafer W so as to eliminate this difference. Further, in this case, the control unit 490 may function as a reprocessing control unit. The reprocessing control unit causes the substrate processing apparatus 410 to reprocess the wafer W, if the result of the measurement by the thickness measurement unit does not satisfy a predetermined target value, i.e., if the difference between the distribution of the thickness of the processing target layer acquired by this thickness measurement unit and the predetermined target distribution of the thickness is larger than a reference value. If the distribution as the difference value that requires the reprocessing is kept even within the circumference of the wafer but is uneven in the radial direction, the substrate processing apparatus 410 can reprocess the wafer W by, for example, radially adjusting the speed at which the swing arm 50 swings while the wafer W is rotated. However, if the distribution as the difference value is largely uneven in the circumferential direction of the wafer, this method cannot be employed. In this case, the substrate processing apparatus 410 can reprocess the wafer W by, for example, specifying a position of a portion in the plane of the wafer W that should be reprocessed based on a notch, an oriental flat, or a laser marker of the wafer, and moving the substrate holding unit 20 and the catalyst holding unit 30 in such a manner that the catalyst 31 can contact this position. More specifically, the substrate processing system may include a detection unit that detects at least one of the notch, the oriental flat, and the laser maker of the substrate, and a substrate position adjustment unit configured to rotate the substrate only b an arbitrary predetermined angle so that the notch, the oriental flat, or the laser marker of the substrate is located at a predetermined position. The substrate processing apparatus 410 can reprocess the wafer W by setting the substrate by the substrate transfer unit in such a manner that the above-described mark or the like detected by the detection unit is located at the predetermined position of the substrate holding unit 20, and angularly rotating the substrate holding unit 20 based on this predetermined position in such a manner that the portion required to be reprocessed is located on the track along which the swing arm 50 of the catalyst holding unit 30 swings. This configuration allows the substrate processing apparatus 410 to reprocess a desired portion required to be reprocessed, resulting in succeeding in acquiring a satisfactory quality of the etching processing. Further, the substrate processing apparatus 410 may include a thickness measurement unit that measures the thickness of the wafer W before the processing. The thickness measurement unit may be disposed outside the substrate holding unit 220. Further, if the substrate processing apparatus 410 includes a CMP processing unit, the substrate processing apparatus 410 may use a film thickness measurement unit built in the CMP processing unit. The substrate processing apparatus 410 can acquire the target distribution of the thickness regardless of a variation in an initial status among wafers, by feeding back the result of measuring the distribution of the thickness of the processing target layer of the wafer before the processing for the condition of the processing to be performed on the wafer W.

F. Sixth Embodiment

Figure 13:
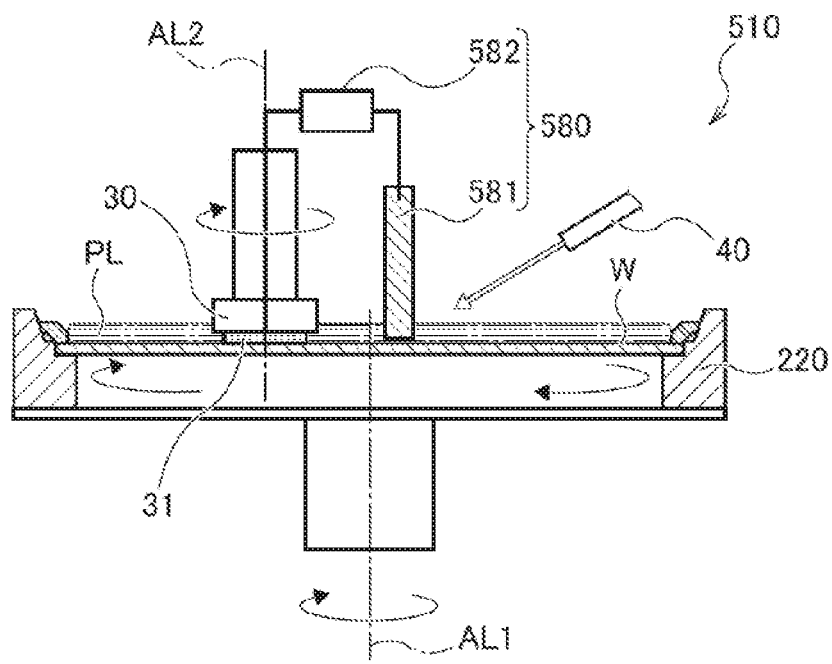
FIG. 13 is a schematic side view of a substrate processing apparatus as a sixth embodiment.

FIG. 13 schematically illustrates a configuration of a substrate processing apparatus 510 as a sixth embodiment. The substrate processing apparatus 510 includes a potential adjustment unit 580, which is a difference from the above-described embodiments. The potential adjustment unit 580 includes a reference electrode 581 and a power source 582. The catalyst 31 and the reference electrode 581 are connected to each other via the power source 582. The reference electrode 581 extends to a region where the reference electrode 581 can contact the processing liquid PL. Therefore, the catalyst 31 and the reference electrode 581 are electrochemically connected to each other via the processing liquid PL. The power source 582 is controlled in such a manner that a potential on the surface of the catalyst 31 decreases within a predetermined range. This configuration allows the substrate processing apparatus 510 to prevent adhesion of a factor that would block the activity of the surface of the catalyst 31 while the wafer W is processed by the etching processing, thereby resulting in succeeding in maintaining the active status of the surface of the catalyst. Further, etching rate of the wafer W varies according to a voltage applied to the catalyst depending on the material of the processing target region of the wafer W, the kind of the processing liquid PL, and the kind of the catalyst, so that the substrate processing apparatus 510 can efficiently process the wafer W. If the substrate processing apparatus 510 includes the processing liquid holding unit 270, the reference electrode 581 may be disposed in the processing liquid holding unit 270 in such a manner that the reference electrode 581 is at least partially in contact with the processing liquid.

FIG. 31 is a cross-sectional view schematically illustrating a configuration of the catalyst holding unit 30 as one embodiment. In the embodiment illustrated in FIG. 31, the counter electrode 30-50 is disposed outside the catalyst holding unit 32. A voltage can be applied to between the catalyst 31 and the counter electrode 30-50 by an external power source. Therefore, the catalyst 31 and the counter electrode 30-50 are electrically connected to each other via the processing liquid PL. Further, the catalyst holding unit 30 illustrated in FIG. 31 includes the wall 30-52 formed outside the elastic member 32 and the catalyst 31 so as to surround them with a space generated therebetween. A processing liquid holding portion, which holds the processing liquid PL, is defined by the wall 30-52 with the catalyst 31 and the wafer W in contact with each other. In the embodiment illustrated in FIG. 31, the processing liquid PL is supplied from the supply port 30-42 on the surface of the catalyst 31 via the inside of the catalyst holding unit 30, so that the processing liquid PL can be effectively held in the processing liquid holding unit. In the embodiment illustrated in FIG. 31, the counter electrode 30-50 is disposed in the processing liquid holding unit, which facilitates establishment of an electric connection between the catalyst 31 and the counter electrode 30-50 via the processing liquid PL.

Figure 32:
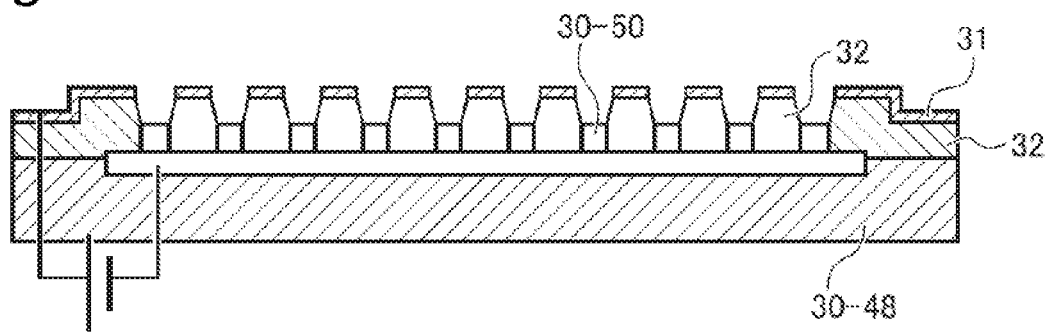
FIG. 32 is a schematic side view of a catalyst holding unit as one embodiment.
Figure 33:
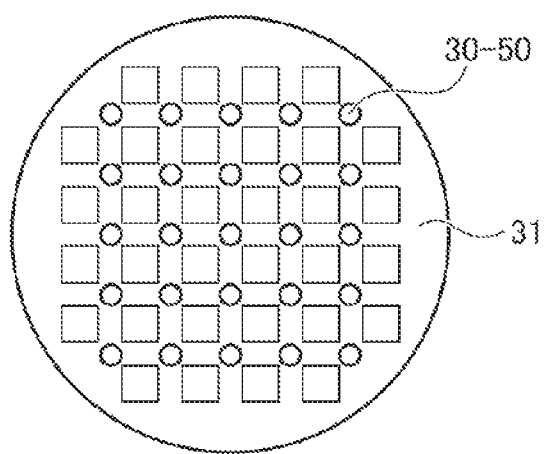
FIG. 33 is a schematic bottom view of the catalyst holding unit illustrated in FIG. 32.

FIG. 32 is a cross-sectional view schematically illustrating a configuration of the catalyst holding unit 30 as one embodiment. FIG. 33 is a plan view of the catalyst holding unit 30 illustrated in FIG. 32 as viewed from the catalyst 31. In the embodiment illustrated in FIGS. 32 and 33, counter electrodes 30-50 are embedded in the catalyst holding member 32, and are configured to be exposed from the catalyst holding member 32 according to a regular pattern. Exposing the counter electrodes 30-50 from the surface of the catalyst 31 according to the regular pattern contributes to further evening out the distribution of the voltage of the catalyst 31, and as a result thereof, contributes to further evening out the etching rate in the plane of the wafer W that is in contact with the catalyst 31.

Figure 34:
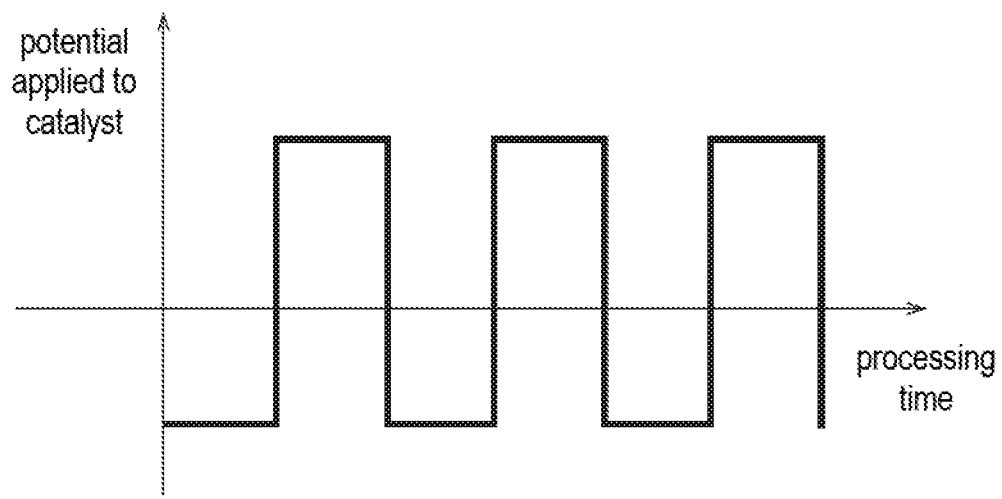
FIG. 34 illustrates an example of a pattern of a potential applied to the catalyst.
Figure 35:
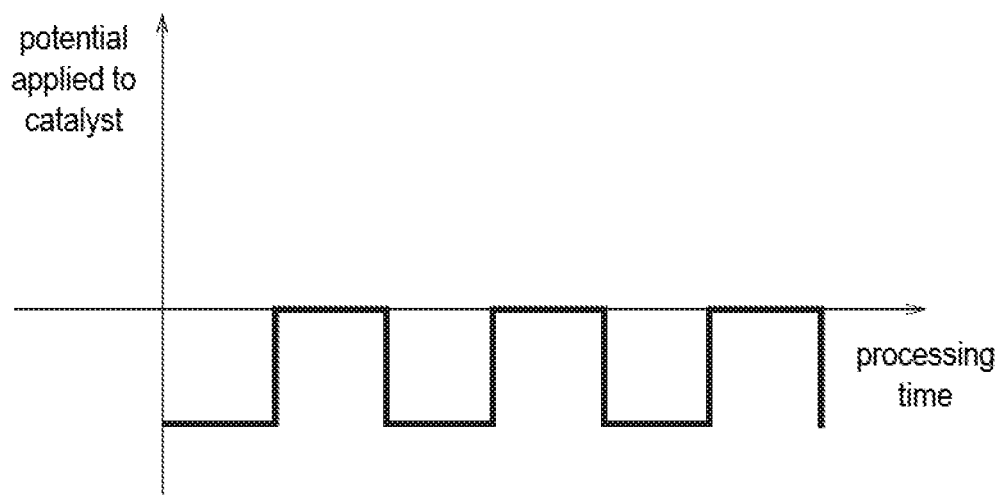
FIG. 35 illustrates an example of a pattern of a potential applied to the catalyst.

In the CARE method, the etching rate can be adjusted by the application of the voltage to between the catalyst 31 and the counter electrode. Therefore, it is desirable to apply an electrode that maximizes the etching rate of the wafer W, to between the catalyst 31 and the counter electrode 30-50 regarding the voltage between the catalyst 31 and the counter electrode 30-50, from the point of view of the rate at which the wafer W is processed. On the other hand, the surface of the catalyst 31 may be oxidized and/or hydroxylated while the wafer W is processed, depending on the kind of the catalyst 31 and the kind of the processing liquid PL. In this case, the substrate processing apparatus can recover the active status of the surface of the catalyst by conditioning the surface of the catalyst as described above during the interval time period between the processing performed on the wafer W and the processing to be performed on the new wafer W. On the other hand, if the catalyst 31 is such a catalyst that the active status of the surface of the catalyst is recoverable by the reduction action, the substrate processing apparatus can reduce the surface of the catalyst by intermittently applying a potential on the reduction side to the catalyst 31 while the wafer W is processed. In other words, the surface of the catalyst can be conditioned to maintain the active status while the wafer W is processed. FIGS. 34 and 35 each illustrate a pattern of the potential applied to the catalyst 31. In each of FIGS. 34 and 35, a horizontal axis represents the processing time, and a vertical axis represents the potential of the catalyst 31 with respect to the counter electrode. As described above, applying a negative potential to the catalyst side can cause the reduction action on the catalyst 31. In the examples illustrated in FIGS. 34 and 35, the rate at which the wafer W is etched is assumed to increase by application of a positive potential or zero potential to the catalyst 31, and the substrate processing apparatus can cause the reduction action on the catalyst 31 to keep the catalyst 31 in the active status by intermittently applying the negative potential to the catalyst 31. Applying the negative potential to the catalyst 31 leads to a temporary reduction in the etching rate, but applying a potential having a rectangular wave, like the example illustrated in FIG. 34, realizes an adjustment of the etching rate and the maintenance of the active status of the catalyst surface.

Figure 36:
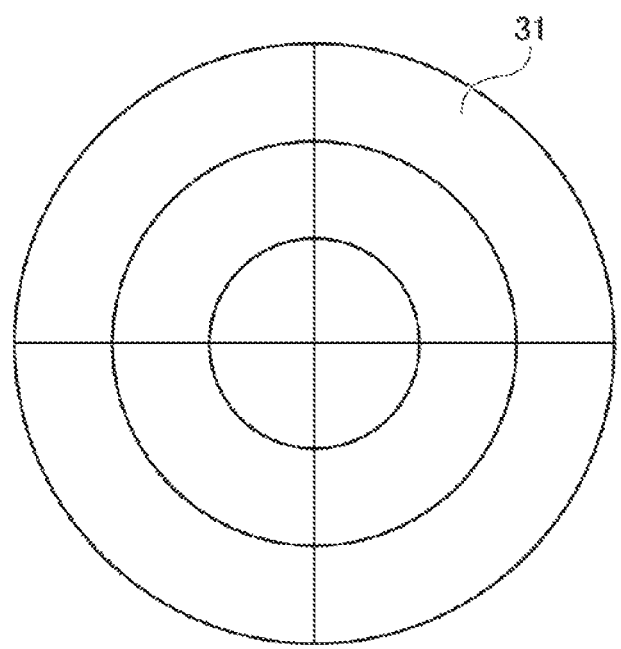
FIG. 36 is a schematic plan view illustrating a pattern in which the catalyst is arranged as one embodiment.
Figure 37:
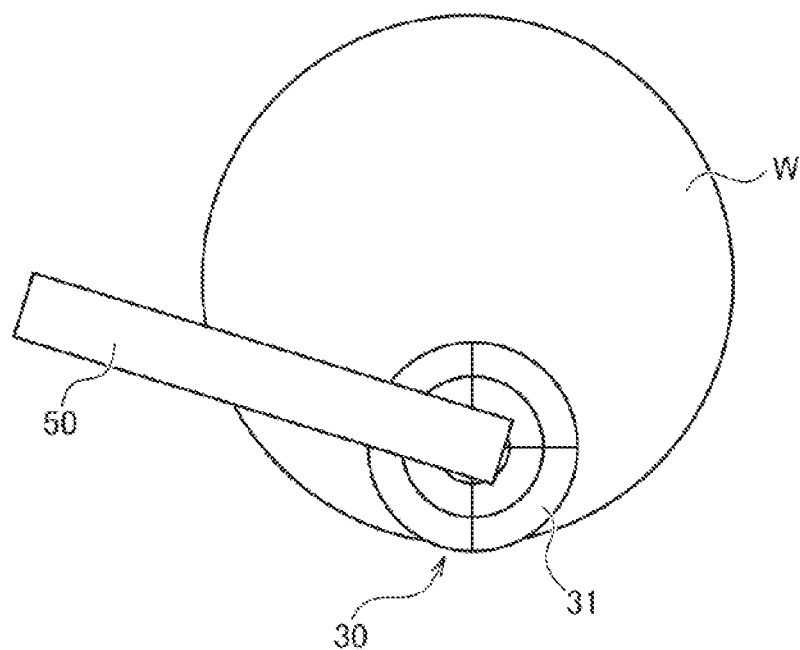
FIG. 37 is a schematic plan view illustrating an example of processing the substrate with use of the catalyst holding unit illustrated in FIG. 36.
Figure 42:
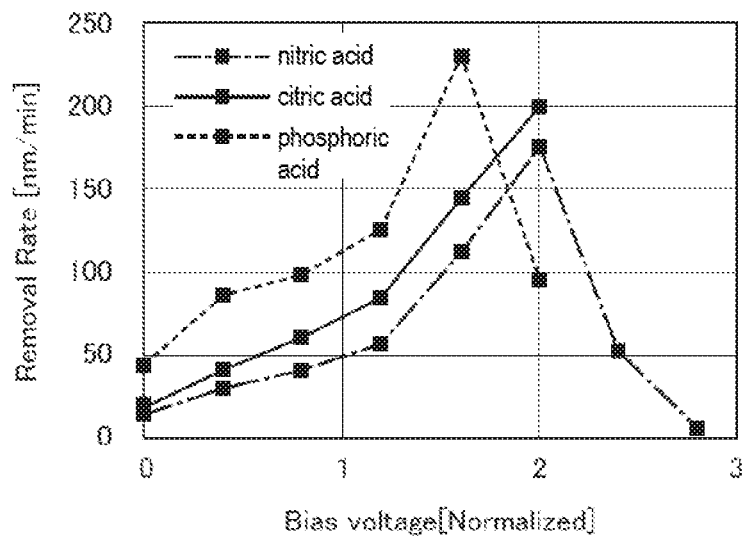
FIG. 42 is a graph indicating a potential applied to the catalyst and the etching rate.
Figure 43:
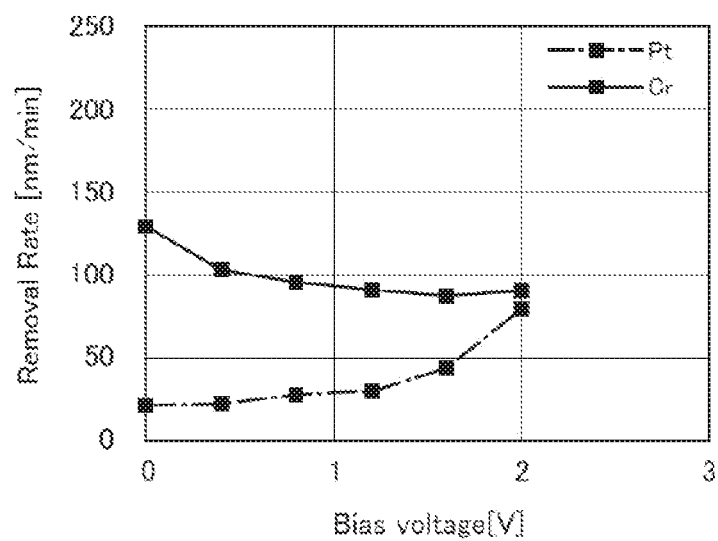
FIG. 43 is a graph indicating a potential applied to the catalyst and the etching rate.
Figure 44:
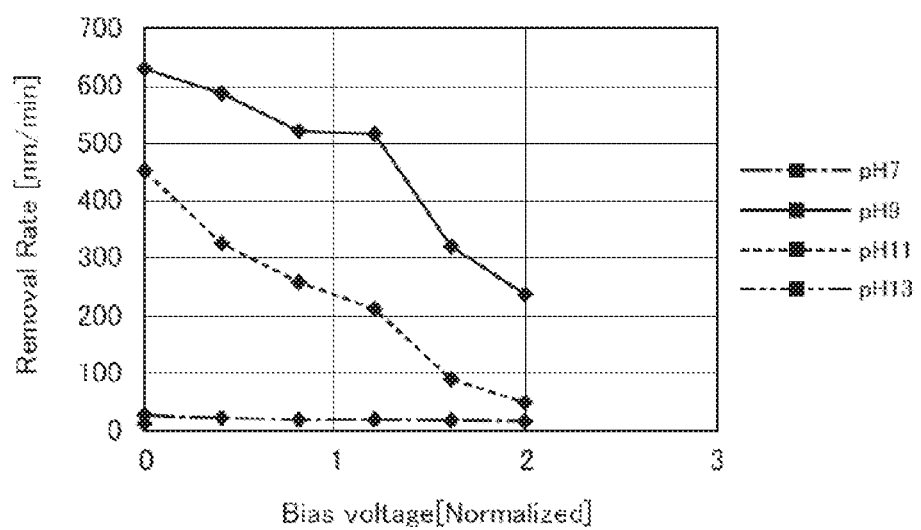
FIG. 44 is a graph indicating a potential applied to the catalyst and the etching rate.

FIG. 36 is a plan view schematically illustrating a layout pattern of the catalyst 31 of the catalyst holding unit 30 as one embodiment. As illustrated in FIG. 36, the catalyst 31 is divided into a plurality of regions in each of the radial direction and the circumferential direction. In the embodiment illustrated in FIG. 36, the catalyst 31 is configured in such a manner that a voltage can be applied to between each of the regions of the catalyst 31 and the counter electrode 30-50 independently of one another. The processing method involving swinging the circular catalyst 31 on the wafer W, like the present embodiment, may lead to a difficulty in controlling the etching amount on the edge side of the wafer W so as to keep the etching amount even. One possible method for etching the edge side of the wafer W while keeping the etching amount even with use of this processing method is to cause the catalyst 31 to overhang from the wafer W. However, causing the catalyst 31 to overhang from the wafer W leads to a reduction in the area over which the wafer W and the catalyst 31 are in contact with each other. Therefore, attempting to acquire a constant etching rate while maintaining the uniformity in the plane of the wafer W results in a loss of efficiency of the processing. Further, a sufficient effect may be unable to be achieved by the method that causes the catalyst 31 to overhang from the wafer W, attempting to improve the uniformity of the etching rate of the wafer. Therefore, the catalyst 31 is divided into the plurality of regions in each of the radial direction and the circumferential direction, and the voltage is applied to each of the regions independently of each other, like the embodiment illustrated in FIG. 36. This configuration can improve the uniformity of the etching rate of the wafer W. More specifically, the catalyst holding unit 30 is provided with a rotational position sensor and a position sensor for detecting the rotational position of the catalyst and the position of the swing arm 50. The substrate processing apparatus detects a positional relationship between each of the regions of the catalyst and the wafer W with use of these sensors, and changes the voltage to be applied to each of the regions of the catalyst 31 so as to be able to acquire a constant processing speed. As described above, applying the voltage to the catalyst may cause a change in the etching rate (refer to FIGS. 42 to 44). Therefore, the substrate processing apparatus can change the etching rate for each of the regions by changing the potential to be applied to each of the regions of the catalyst 31. For example, FIG. 37 illustrates the catalyst holding unit 31 with the catalyst 31 rotated while being in contact with the wafer W. The substrate processing apparatus can control the voltage so as to apply the voltage in such a manner that a low potential is provided to the region of the catalyst 31 located on an inner side of the wafer W while a high potential is provided to the region of the catalyst 31 located on an outer side of the wafer W while the wafer W is processed. In this manner, the substrate processing apparatus can improve uniformity of the processing performed on the wafer W without the catalyst 31 overhanging from the wafer W or with the catalyst 31 minimally overhanging from the wafer W, by dynamically controlling the potential to be applied to each of the regions of the catalyst 31.

Figure 38:
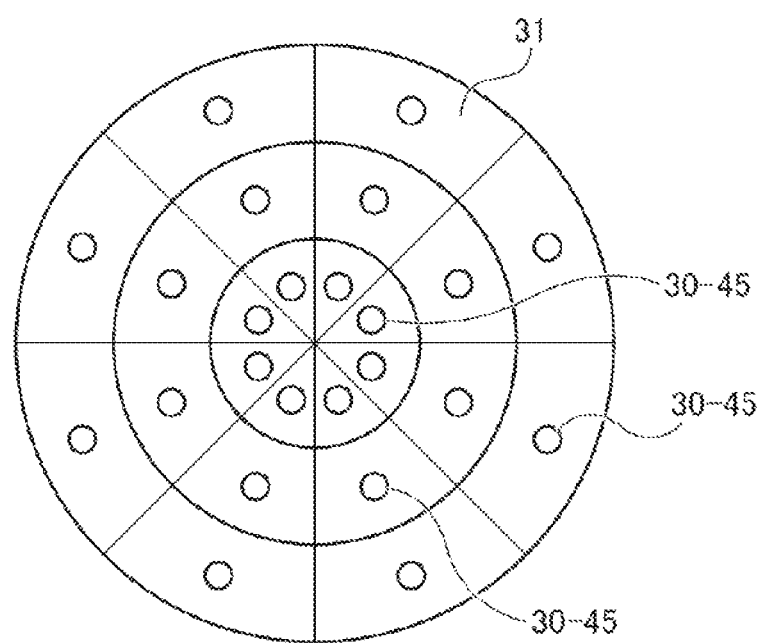
FIG. 38 is a schematic plan view illustrating a pattern in which the catalyst is arranged as one embodiment.

FIG. 38 illustrates one embodiment for realizing a constant etching rate while maintaining the uniformity of the processing performed on the wafer W. FIG. 38 is a plan view illustrating a pattern according to which the catalyst of the catalyst holding unit 30 is divided, similarly to FIG. 36. In the embodiment illustrated in FIG. 38, the catalyst 31 includes the catalyst holding member 32 (for example, the elastic member 32) divided into a plurality of pieces in each of the radial direction and the circumferential direction. The catalyst 31 is held on the surface of the catalyst holding member 32. In the embodiment illustrated in FIG. 38, each of the pieces of the catalyst holding member 32 is made of the elastic film 32d such as the elastic film 32d illustrated in FIG. 7, and the pressure chamber 33d is formed inside them. The pressure chamber 33d is configured to be able to control the pressure with which the processing target region of the wafer W and the catalyst 31 are in contact with each other independently of one another, by the control of the pressure of the fluid (for example, air or nitrogen gas) supplied from the fluid source into the pressure chamber 33D. In the embodiment illustrated in FIG. 38, the substrate processing apparatus includes the rotational position sensor and the positional sensor for detecting the rotational position of the catalyst and the position of the swing arm 50, similarly to the embodiment illustrated in FIG. 36. Further, in the embodiment illustrated in FIG. 38, the catalyst holding member 32 may be configured in such a manner that each of the regions of the catalyst holding member 32 includes a pressure sensor 30-45. The substrate processing apparatus can measure the pressure with which each of the regions of the catalyst 31 and the wafer W are in contact with each other, with use of the pressure sensor 30-45. The substrate processing apparatus detects a positional relationship between each of the regions of the catalyst and the wafer W with use of these sensors, and adjusts the pressure to be applied to each of the regions of the catalyst 31 so as to be able to acquire a constant etching rate. For example, the substrate processing apparatus can control the pressure so as to apply the pressure in such a manner that a low pressure is generated at the region of the catalyst 31 located on the inner side of the wafer W while a high pressure is generated at the region of the catalyst 31 located on the outer side of the wafer W while the wafer W is processed, similarly to the example illustrated in FIG. 37. In this manner, the substrate processing apparatus can improve the uniformity of the processing performed on the wafer W without the catalyst 31 overhanging from the wafer W or with the catalyst 31 minimally overhanging from the wafer W, by dynamically controlling the pressure to be applied to each of the regions of the catalyst 31. As the mechanism for applying the pressure to each of the regions of the catalyst 31, a piezoelectric element can be disposed on each of the regions of the catalyst holding member 32, instead of the method that supplies the fluid to the above-described pressure chamber 33d. In this case, the substrate processing apparatus can dynamically adjust the pressure with which the catalyst 31 and the wafer W are in contact with each other for each of the regions by controlling a voltage to be supplied to the piezoelectric element.

G. Seventh Embodiment

In the substrate processing apparatus 10 as a seventh embodiment, the catalyst 31 includes two kinds or more of individual catalysts. As an alternative embodiment, the catalyst 31 may be a mixture (for example, an alloy) or a compound (for example, an intermetallic compound) containing two kinds of catalysts. According to this configuration, the substrate processing apparatus 10 can etch the wafer W evenly or at a desired selection ratio, if the surface to be polished is made of two or more different kinds of materials according to the region of the wafer W. For example, if a Cu layer and an $SiO_2$ layer are formed on a first region and a second region of the wafer W, respectively, the catalyst 31 may include a region containing an acid solid catalyst for Cu and a region containing platinum for $SiO_2$. In this case, ozone water for Cu and acid for $SiO_2$ may be used as the processing liquid PL. Alternatively, if a III-V series metallic (for example, GaAs) layer and an $SiO_2$ layer are formed on the first region and the second region of the wafer W, respectively, the catalyst 31 may include a region containing iron for the III-V series metal and a region containing platinum or nickel for $SiO_2$. In this case, ozone water for the III-V series metal and acid for $SiO_2$ may be used as the processing liquid PL.

In this case, the substrate processing apparatus 10 may include a plurality of catalyst holding units 30. Each of the plurality of catalyst holding units 30 may hold a different kind of catalyst from one another. For example, a first catalyst holding unit 30 may hold the catalyst 31 containing an acid solid catalyst, and a second catalyst holding unit 30 may hold the catalyst containing platinum. In this case, the two catalyst holding units 30 can be configured to scan only on the layer of the corresponding material on the wafer W. According to this configuration, the substrates processing apparatus 10 can further efficiently process the wafer W by sequentially using the first catalyst holding unit 30 and the second catalyst holding unit 30 and supplying the processing liquid PL according to the catalyst holding unit 30 in use. As a result, the substrates processing apparatus 10 can improve the processing capability per unit time.

As an alternative embodiment, in the fourth embodiment, different kinds of processing liquid PL may be sequentially supplied. According to this configuration, the substrate processing apparatus can etch the wafer W evenly or at a desired selection ratio, if the processing target surface is made of two or more different kinds of materials according to the region of the wafer W. For example, the catalyst holding unit 30 may hold a catalyst containing platinum. Then, the substrate processing apparatus 10 may first supply a neutral solution or a solution containing Ga ions as the processing liquid PL to etch the III-V series metallic layer of the wafer W, and then supply acid as the processing liquid PL to etch the $SiO_2$ layer of the wafer W.

As an another alternative embodiment, the substrate processing apparatus 10 may include a plurality of catalyst holding units 30 holding the same kind of catalyst. In this case, the plurality of catalyst holding units 30 may be used simultaneously. According to this configuration, the substrate processing apparatus 10 can improve the processing capability per unit time.

Figure 49:
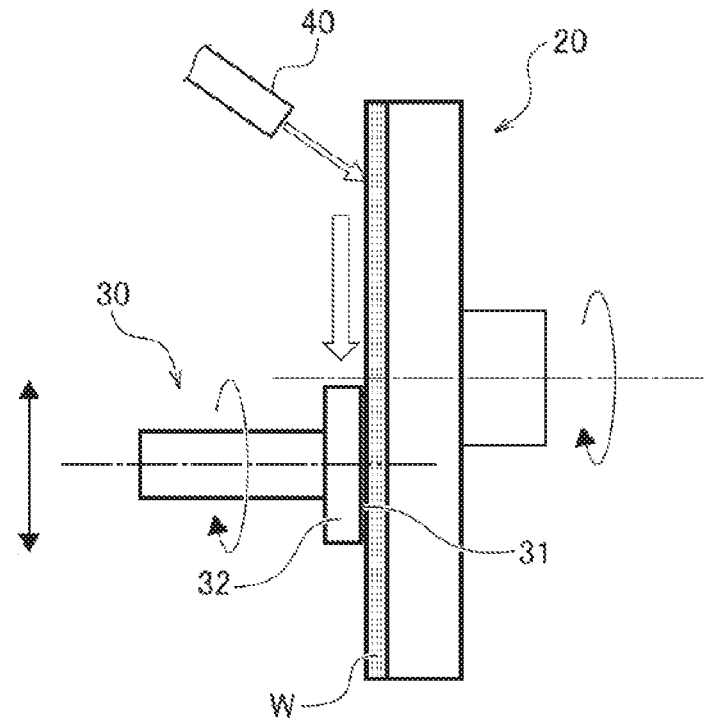
FIG. 49 is a schematic side view of a substrate processing apparatus as one embodiment.
Figure 50:
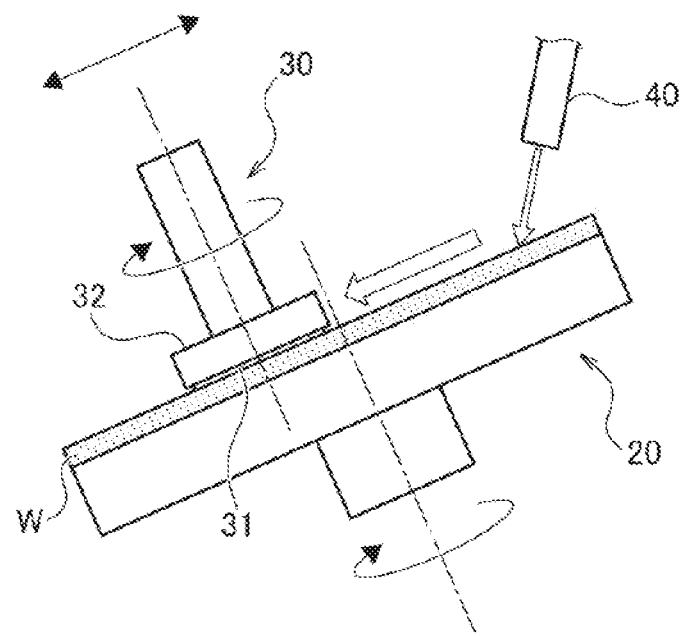
FIG. 50 is a schematic side view of a substrate processing apparatus as one embodiment.

FIG. 49 is a schematic side view illustrating a configuration of the substrate processing apparatus as one embodiment. In the embodiment illustrated in FIG. 49, the substrate holding unit 20 and the catalyst holding unit 30 are arranged in such a manner that the plane of the wafer W and the plane of the catalyst 31 extend in the vertical direction. It is desirable that the processing liquid supply unit 40 is disposed so as to be located above the catalyst holding unit 30 in consideration of the gravity. For example, the catalyst holding unit 30 and the processing liquid supply unit 240, like the units 30 and 240 described with reference to FIGS. 9 and 10, are mounted on the same swing arm 50, and the processing liquid supply unit 240 is disposed so as to be constantly located above the catalyst holding unit 30, which allows the processing liquid PL to be efficiently introduced into between the catalyst 31 and the wafer W with the aid of the gravity in addition to the rotation of the substrate holding unit 20. Further, even if the etching residue is produced while the wafer W is processed by the etching processing, the etching residue is efficiently discharged with the aid of the gravity without remaining between the catalyst 31 and the wafer W. As a modification thereof, the plane of the wafer W and the plane of the catalyst 31 do not necessarily have to extend vertically, and may be arranged so as to be inclined with respect to the horizontal plane that can sill cause a natural flow of the processing liquid due to the gravity, as illustrated in FIG. 50. Regarding the other features, the present embodiment can include an arbitrary feature of the other embodiments disclosed in the present disclosure, or a known feature.

H. Eighth Embodiment

Figure 14:
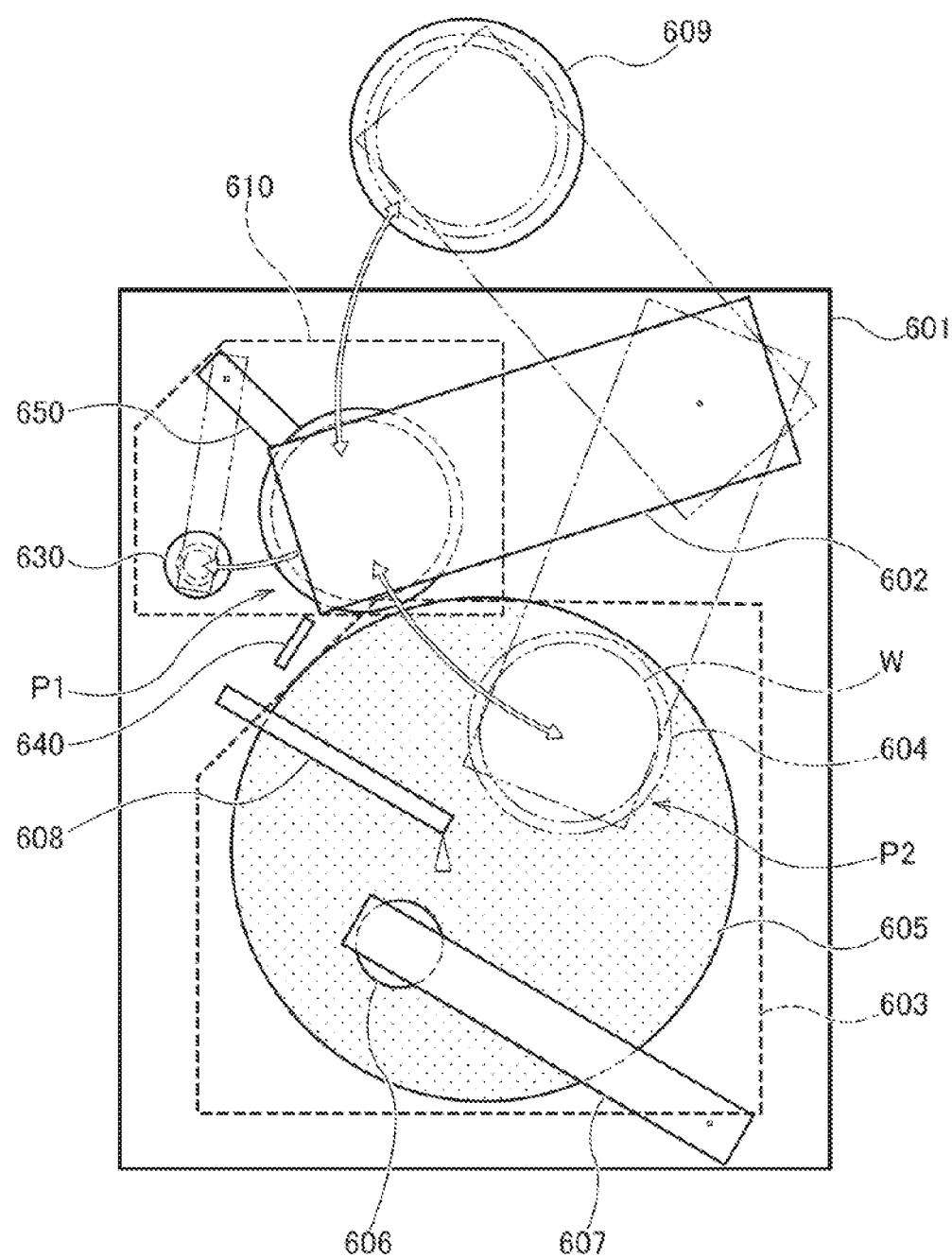
FIG. 14 is a schematic plan view of a substrate processing system as an eighth embodiment.

FIG. 14 schematically illustrates a configuration of a substrate processing system 601 as an eighth embodiment. The substrate processing system 601 is a CMP unit, and includes a swing arm 602, a CMP processing unit 603, a substrate processing unit 610, and a substrate feed unit 609. The CMP processing unit 603 includes a substrate holding head 604 (corresponding to the top ring of the conventional CMP apparatus) mounted on a distal end of the swing arm, a polishing table 605 with a polishing pad attached thereto, a dresser 606 configured swingably by the swing arm 607, and a slurry supply nozzle 608. The substrate holding head 604 holds the wafer W placed on the substrate feed unit 609 by, for example, the vacuum suction mechanism. At this time, the surface of the wafer W to be polished is placed face down, and is pressed against the polishing table 605, by which the CMP processing is performed.

The waver W held by the substrate holding head 604 can be located at a first position P1, where the wafer W is etched by the CARE method, and a second position P2, where the wafer W is polished by the CMP apparatus, with use of a swinging motion of the swing arm 602. The wafer W processed by the CMP processing at the second position P2 is placed on the first position P1 while being kept held by the substrate holding head 604. At this time, the surface of the wafer W to be polished remains face-down. In the present embodiment, the order of the processing procedures performed on the wafer W is set in such a manner that the wafer W is processed by CMP and CARE in this order, but is not limited thereto depending on the material of the processing target region. The wafer W may be processed by CARE and CMP in this order, or may be processed only by CARE or CMP.

The substrate processing unit 610 basically has a similar configuration to the above-described substrate processing apparatus 10, and performs similar processing to the above-described substrate processing apparatus 10. However, the surface of the wafer W to be polished is placed face down, so that the catalyst holding unit 630 mounted on the distal end of the swing arm 650 is moved vertically upwardly to carry the catalyst into contact with the surface to be polished. According thereto, the processing liquid supply unit 640 supplies the processing liquid PL to the bottom surface of the wafer W as the PL. In this case, the processing liquid supply unit 640 may be a spray device that sprays the processing liquid PL vertically upwardly. Alternatively, the processing liquid holding unit 270 illustrated in FIG. 11 may be mounted upside down, and the processing liquid PL may be supplied inside this processing liquid holding unit 270.

In this manner, the substrate processing unit 610 may be realized as a unit integrated with the CMP processing unit 603. According to this configuration, the processing performed by the substrate processing apparatus 610 and the processing performed by the CMP processing unit 603 can share the operation of holding the wafer W, which contributes to a reduction in the processing time as a whole.

Figure 64:
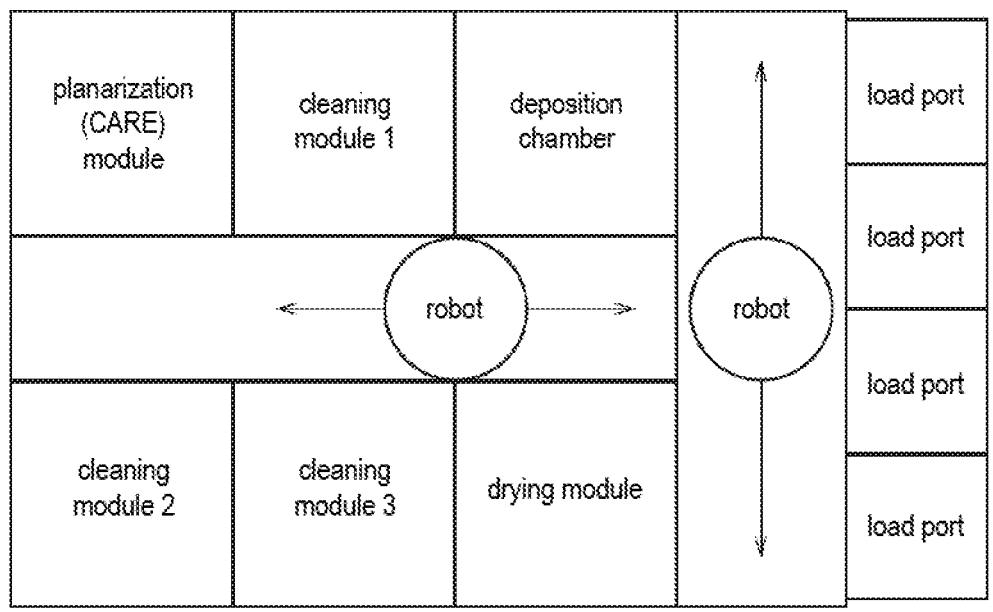
FIG. 64 is a plan view schematically illustrating a configuration of a substrate processing apparatus as one embodiment.

FIG. 64 is a plan view schematically illustrating a configuration of the substrate processing system as one embodiment. The illustrated substrate processing system includes a CARE module that performs the etching processing on the substrate, a plurality of cleaning modules for cleaning the substrate, a deposition chamber, and a mechanism for transferring the substrate, like the apparatuses described in the present disclosure. In this system configuration, the wafer W to be processed is loaded into a load port. The wafer loaded in the load port is subject to the deposition processing in the deposition chamber after being transferred by the wafer transfer mechanism, such as a robot. Examples of the deposition apparatus usable here include the chemical vapor deposition (CVD) apparatus, the sputtering apparatus, the plating apparatus, and the coater apparatus. The wafer W processed by the deposition processing is transferred to a cleaning module 1 by the wafer transfer mechanism, such as the robot, and is cleaned therein. After that, the wafer W is transferred to a planarization module, i.e., the CARE processing module like the apparatuses described in the present disclosure, and is subject to the planarization processing. After that, the wafer W is conveyed to a cleaning module 2 and a cleaning module 3, and is cleaned therein. The wafer W processed by the cleaning processing is transferred to a drying module, and is dried therein. The dried wafer W is returned back to the load port. The present system allows the wafer W to be processed by the deposition processing and the planarization processing by a single system, thereby succeeding in efficient utilization of an area where the system is set up. Further, the transfer mechanism is configured to be able to transfer the substrate in the wet status and the substrate in the dry status separately from each other.

Figure 45:
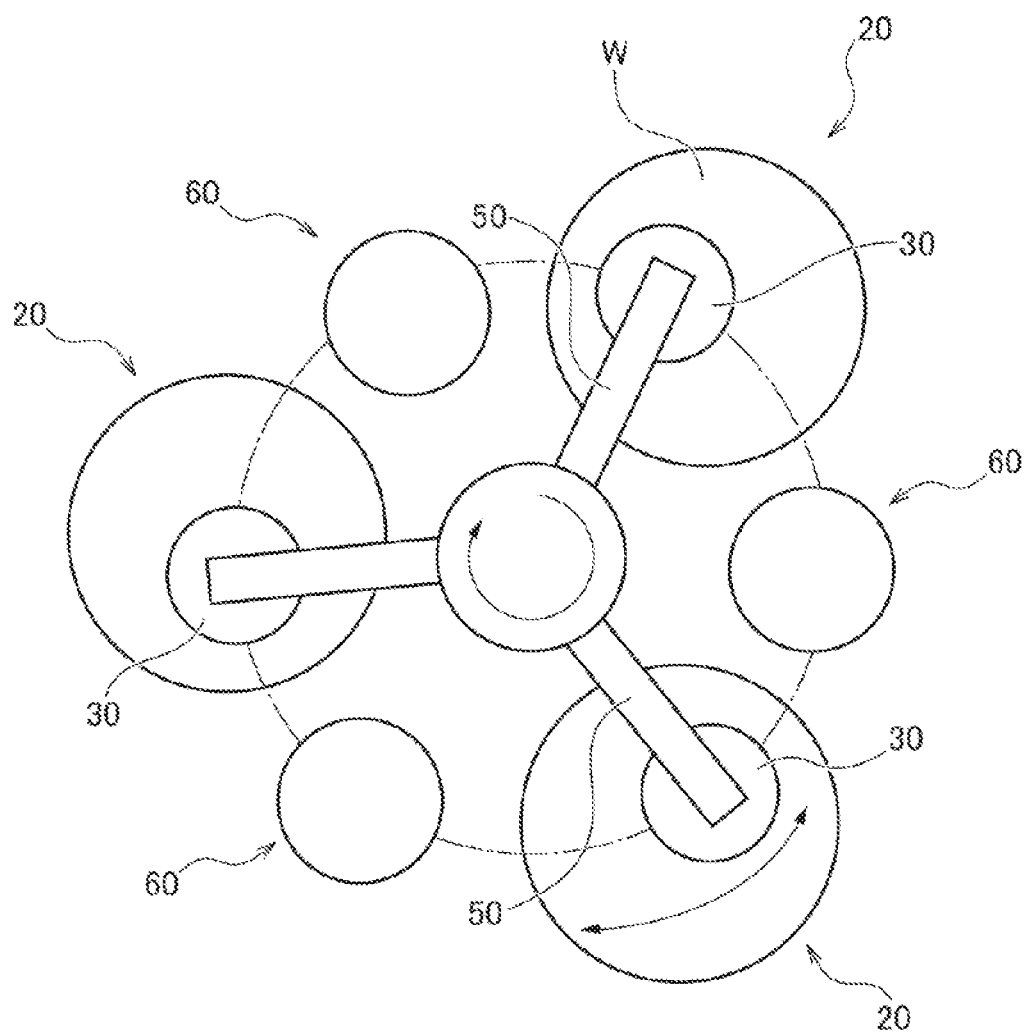
FIG. 45 is a schematic top view of a substrate processing apparatus as one embodiment.

FIG. 45 is a schematic plan view illustrating a configuration of the substrate processing apparatus as one embodiment. The configuration illustrated in FIG. 45 includes three substrate holding units 20, three catalyst holding units 30, and three conditioning units 60. The three catalyst holding units 30 are coupled to one another via the swing arm 50. The swing arm 50 is swingable in the plane of the wafer W on the substrate holding unit 20, and is also movable to arbitrary ones of the substrate holding units 20 and the condition units 60 by rotating around a rotational center of the swing arm 50. As other configurations of the substrate processing apparatus, the substrate processing apparatus can have an arbitrary feature of the embodiments disclosed in the present disclosure, or a known feature. The three catalyst holding units 30 can hold the same kind of catalyst 31, and can also be configured to hold the different kinds of catalysts 31. Further, the illustrated catalyst holding units 30 are illustrated as having identical dimensions, but may have different dimensions as another embodiment. The catalyst holding units 30 having the different dimensions allow the substrate processing apparatus to more precisely process the wafer W, thereby succeeding in the improvement of the in-plane evenness. The substrate processing apparatus according to the embodiment illustrated in FIG. 45 can process a plurality of wafers W simultaneously, thereby improving the productivity. Further, the substrate processing apparatus according to the embodiment illustrated in FIG. 45 can divide a process requiring a long processing time into a plurality of stages, thereby efficiently performing different processing by each of the catalyst holding units 30. Further, the substrate processing apparatus according to the embodiment illustrated in FIG. 45 can simultaneously perform a plurality of processing procedures in a process requiring a plurality of catalysts by using the catalyst holding units 30 holding the different kinds of catalysts 31.

Figure 51:
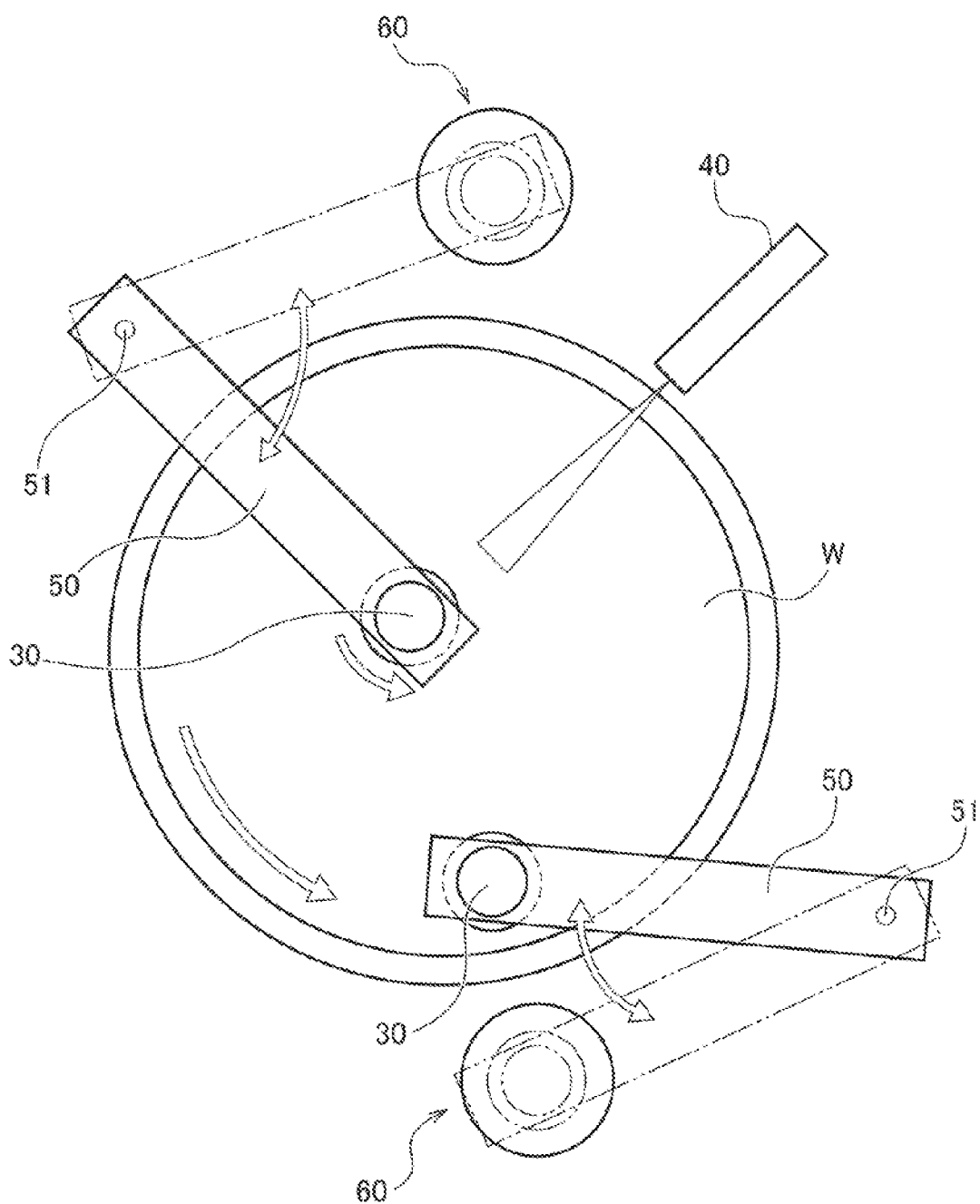
FIG. 51 is a schematic top view of a substrate processing apparatus as one embodiment.

FIG. 51 is a schematic plan view illustrating a configuration of the substrate processing apparatus as one embodiment. The substrate processing apparatus according to the embodiment illustrated in FIG. 51 includes two catalyst holding units 30, two conditioning units 60, and a single substrate holding unit 20. The two catalyst holding units 30 extend along the plane where the wafer W is mounted on the substrate holding unit 20 with a rotational center 51 serving as a supporting point thereof, and are swingable along the plane where the wafer W is mounted. In the illustrated embodiment, the catalyst holding members 32 of the two catalyst holding units 30 have identical dimensions. As the not-illustrated other configurations of the substrate processing apparatus according to the embodiment illustrated in FIG. 51, and detailed configurations of the catalyst holding units 30, the conditioning units 60, and the substrate holding units 20, the substrate processing apparatus can include an arbitrary feature of the other embodiments disclosed in the present disclosure, or a known feature. The substrate processing apparatus illustrated in FIG. 51 includes the two catalyst holding units 30. Therefore, when processing the wafer W with use of one of the catalyst holding units 30, the present substrate processing apparatus can condition the other of the catalyst holding units 30. As a result, the present substrate processing apparatus can improve the productivity of processing the wafer compared to the substrate processing apparatus including the single catalyst holding unit 30. Further, the present substrate processing apparatus can increase the area where the catalyst and the wafer W are in contact with each other by processing the wafer W with use of the two catalyst holding units 30, thereby improving the etching rate of the wafer W. Further, the present substrate processing apparatus improves controllability of processing the wafer by changing the pressure with which the wafer W is in contact with the catalyst 31, the speed at which the catalyst holding unit 30 swings, and the voltage to be applied to the catalyst at each of the catalyst holding units 30. Further, the present substrate processing apparatus can also perform different processing procedures simultaneously by causing the two catalyst holding units 30 to hold different kinds of catalyst 31.

As another embodiment, the number of catalyst holding units 30 is not limited to two, but the substrate processing apparatus can include an arbitrary number of catalyst holding units 30. Further, the dimension may be changed for each of the catalyst holding units 30. For example, the substrate processing apparatus can use the catalyst holding unit 30 large in dimension and the catalyst holding unit 30 small in dimension. The catalyst holding unit 30 small in dimension can especially provide high controllability of the etching rate of the wafer W in the processing performed on the wafer W, so that the use of the catalyst holding units 30 having different dimensions can contribute to the further improvement of the uniformity in the plane of the wafer. As a specific example, the substrate processing apparatus can process the central portion of the wafer W with use of the catalyst holding unit 30 large in dimension, and can process the edge of the wafer W and the vicinity thereof with use of the catalyst holding unit 30 small in dimension.

Further, as another embodiment, a plurality of catalyst holding members 32 can also be mounted on the single swing arm 50. In this case, the respective sizes of the catalyst holding units 32 may be different from one another or may be the same as one another. For example, the substrate processing apparatus can also be configured in such a manner that the single swing arm 50 is provided with the catalyst holding unit 30 large in dimension, and the catalyst holding units 30 small in dimension disposed on both sides of the catalyst holding unit 30 large in dimension so as to sandwich the catalyst holding unit 30 large in dimension Further, the catalysts held on the different catalyst holding units 32 may be the same as one another or may be different from one another. As a modification of the embodiment illustrated in FIG. 51, one of the catalyst holding units 30 may be replaced with the cleaning unit for cleaning the wafer W. In this case, a sponge material for cleaning can be used instead of the catalyst holding member 32. In this case, the wafer W can be cleaned without being transferred to another location before or after being processed.

Further, as a modification of the embodiment illustrated in FIG. 51, a polishing pad for performing the processing according to the conventional CMP may be used instead of one of the catalyst holding units 30. In this case, the substrate processing apparatus can improve the rate at which the wafer W is processed by performing the CMP processing before and/or after the CARE processing. Further, the present substrate processing apparatus can be effectively used for the planarization of the wafer containing a dissimilar interface.

Figure 53:
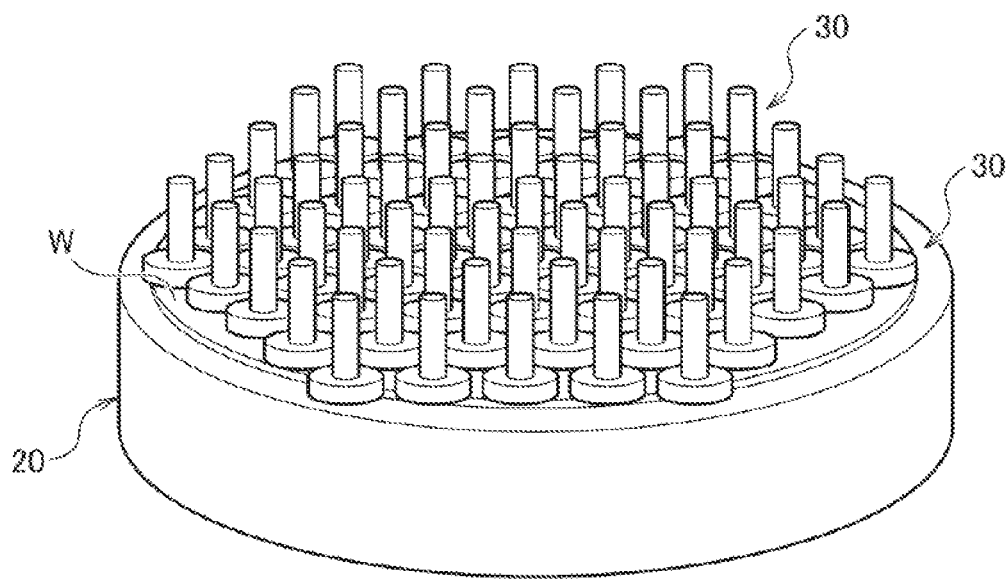
FIG. 53 schematically illustrates a configuration of a substrate processing apparatus as one embodiment.

FIG. 53 is a perspective view schematically illustrating a configuration of the substrate processing apparatus as one embodiment. The substrate processing apparatus according to the embodiment illustrated in FIG. 53 includes a plurality of catalyst holding units 30 and a single substrate holding unit 20. In the embodiment illustrated in FIG. 53, the substrate holding unit 20 is configured to be able to rotate the wafer W placed on the substrate holding unit 20, similarly to the other embodiments. In the embodiment illustrated in FIG. 53, the catalyst holding units 30 are embodied as a large number of relatively small catalyst holding units 30 enough to almost entirely cover the surface of the wafer W. Although being not illustrated in detail in FIG. 53, each of the catalyst holding units 30 can be configured similarly to the other embodiments disclosed in the present disclosure. For example, as one example, each of the catalyst holding units 30 can be configured to be able to supply the processing liquid PL from the surface of the catalyst 31 to the plane of the wafer W. Further, each of the catalyst holding units 30 can be configured to be mounted on the single head 30-74 (refer to FIG. 31), which is not illustrated in FIG. 53. This single head 30-74 can be rotatably configured. Alternatively, the single head 30-74 may be non-rotatably configured, and the individual catalyst holding units 30 may be rotatably configured. Alternatively, the individual catalyst holding units 30 may be configured rotatably together with the rotation of the single head 30-74. Further, the single head 30-74 can be configured movably in the direction in the plane of the wafer W by, for example, the arm 50, which is not illustrated in FIG. 53. Further, each of the catalyst holding units 30 can also be configured to be able to individually adjust the pressure with which the catalyst is in contact with the wafer W with use of, for example, the pressure chamber 33 (refer to FIGS. 3 and 7) and/or an individual elevating mechanism of each of the catalyst holding units 30. For example, the catalyst holding units 30 may be grouped into a plurality of regions in the radial direction of the wafer W, and configured to individually adjust the pressure with which the catalyst is in contact with the wafer W for each of the regions.

I. Ninth Embodiment

Figure 15:
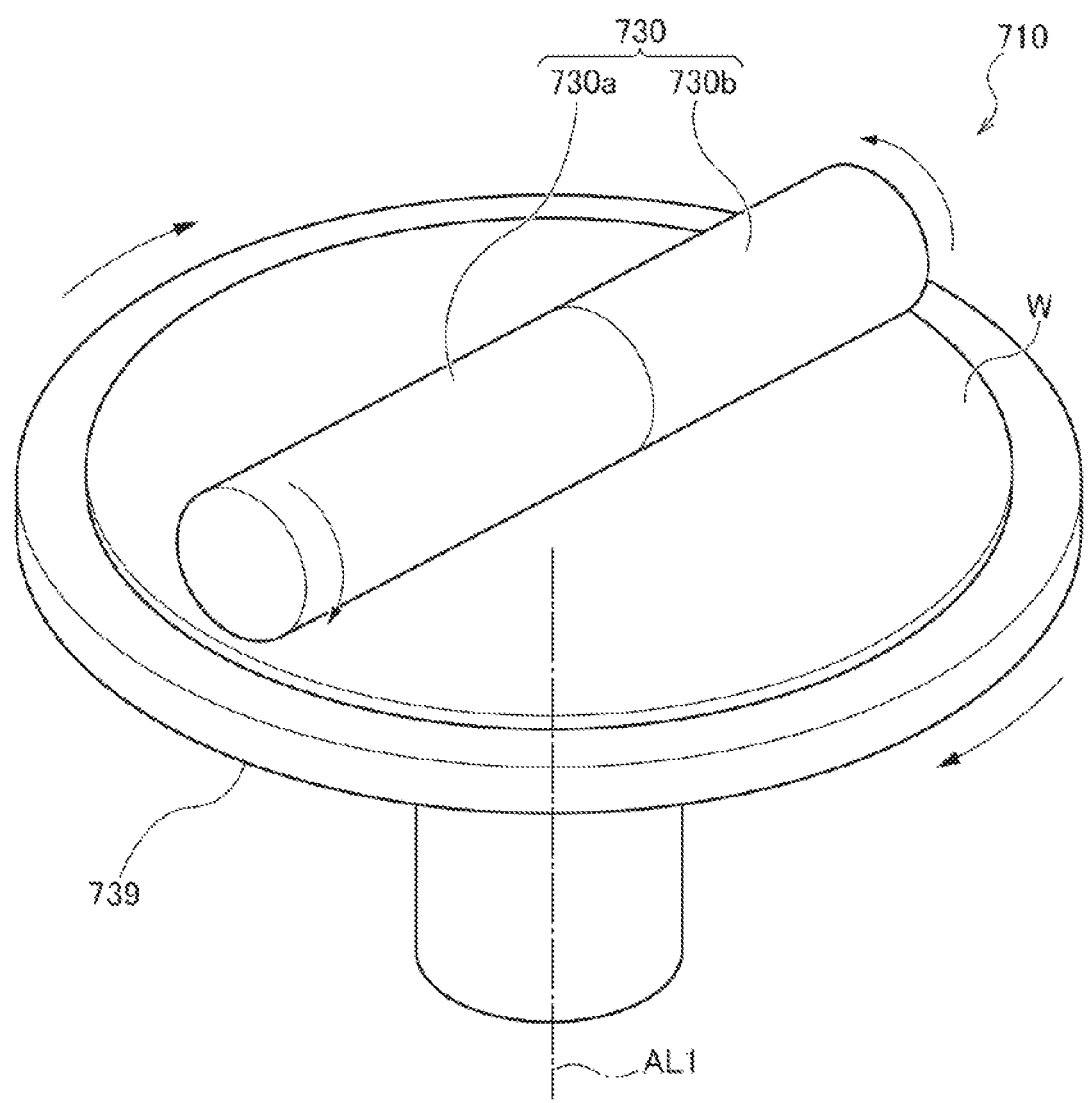
FIG. 15 is a schematic perspective view of a substrate processing apparatus as a ninth embodiment.
Figure 16:
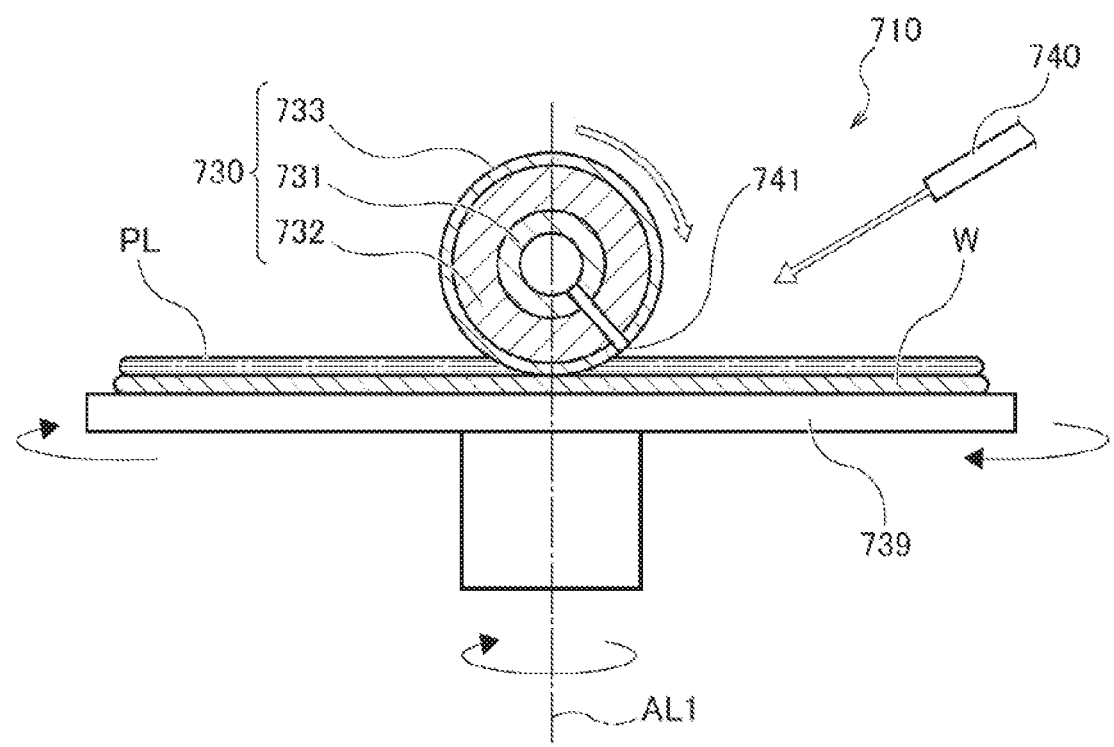
FIG. 16 is a schematic cross-sectional view of the substrate processing apparatus illustrated in FIG. 15.

FIG. 15 schematically illustrates a configuration of the substrate processing apparatus 710 as a ninth embodiment. Further, FIG. 16 is a cross-sectional view of the substrate processing apparatus 710. The substrate processing apparatus 710 includes a cylindrically formed catalyst holding unit 730, a substrate holding unit 739, and a processing liquid supply unit 740. Further, although not illustrated, the substrate processing apparatus 710 includes a conditioning unit and a monitoring unit similarly to the other embodiments, as necessary. The catalyst holding unit 730 includes a first catalyst holding unit 730a and a second catalyst holding unit 730b. The catalyst holding unit includes a cylindrical core member 731 having one end connected to a rotational driving unit and the other end connected to a chemical supply line, a cylindrical elastic member 732 disposed around the core member, and a catalyst 733 formed on a surface of the elastic member 732. In the present embodiment, the first catalyst holding unit 730a and the second catalyst holding unit 730b are arranged along a straight line, and perform a horizontal movement to a predetermined position on the wafer W, a vertical motion into a contact with the wafer W, and a rotational motion driven by the rotational driving unit as motions thereof. The vertical motion is carried out by a method using an air cylinder or a ball screw, which also serves to adjust the pressure with which the catalyst is in contact with the wafer W in addition to the vertical motion. Further, regarding the rotational motion, the first catalyst holding unit 730a and the second catalyst holding unit 730b are configured rotatably in opposite directions from each other. Further, the substrate holding unit 739 may employ any of the suction plate method, the roller chuck method, and the clamp method, like the above-described examples, but is assumed to employ the suction plate method in the present embodiment. Further, the processing liquid supply unit 740 also includes catalyst holding unit internal supply ports 741 in addition to the above-described supply from outside the wafer W. Especially, the catalyst holding unit internal supply ports 741 are connected to a cylindrical portion provide in the core member 731 through an elastic member, and a plurality of catalyst holding unit internal supply ports 741 are arranged along the direction in which the catalyst holding unit 730 extends.

In this substrate processing apparatus 710, the catalyst holding unit 730 contacts the wafer W with a predetermined contact pressure after being horizontally moved to the predetermined position of the wafer W held on the substrate holding unit 730. At this time, the wafer W and the catalyst holding unit 730 may simultaneously start the rotational motions. The holing unit 730a and the second catalyst holding unit 730b rotate in the opposite directions from each other, and further rotate in directions for cancelling out relative speeds with respect to the direction in which the wafer W rotates. Further, the supply of the processing liquid may also be simultaneously started from the processing liquid supply units 740 and 741. According to this configuration, the substrate processing apparatus 710 can reduce a difference between the relative speed between the first catalyst holding unit 730a and the wafer W, and the relative speed between the second catalyst holding unit 730b and the wafer W, and as a result thereof, can reduce a damage that the surface of the wafer W would incur due to the friction.

Figure 52:
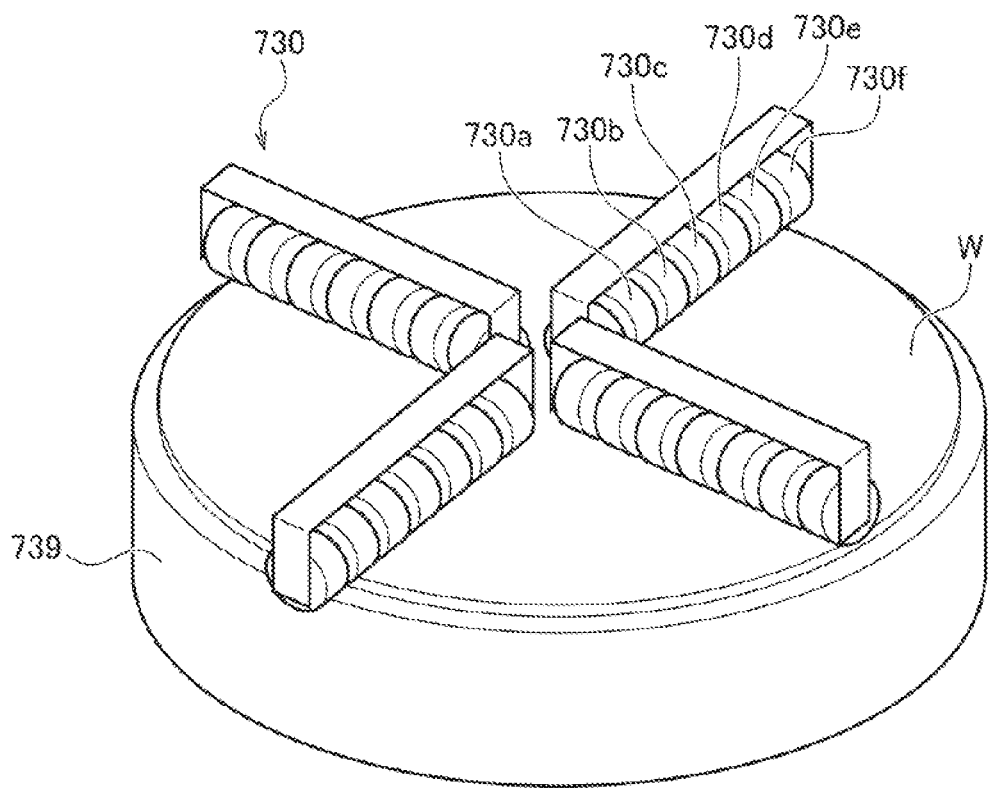
FIG. 52 schematically illustrates a configuration of a substrate processing apparatus as one embodiment.

FIG. 52 schematically illustrates a configuration of the substrate processing apparatus 710 as one embodiment. The embodiment illustrated in FIG. 52 includes cylindrically formed catalyst holding units 730, similarly to the embodiment illustrated in FIGS. 15 and 16. The substrate processing apparatus according to the second embodiment illustrated in FIG. 52 includes four sets of seven catalyst holding units 730a to 730f. In the embodiment illustrated in FIG. 52, each of the catalyst holding units 730a to 703f and the other features can be configured similarly to the embodiment described with reference to FIGS. 15 and 16. In the embodiment illustrated in FIG. 52, each of the catalyst holding units 730a to 730f passively rotates according to the rotation of the wafer W similarly to the embodiment illustrated in FIGS. 15 and 16, whereby the substrate processing apparatus 710 can reduce the damage that would be incurred by the catalyst holding units 730 and the detachment from the catalyst holding units 730 due to the friction between each of the catalyst holding units 730a to 730f and the wafer W. Especially in the embodiment illustrated in FIG. 52, the substrate processing apparatus 710 includes the plurality of catalyst holding units 730a to 730f independently rotatable in the radial direction of the wafer W, so that each of the catalyst holding units 730a to 730f can passively rotate according to the distribution of the speed variable along the radial direction of the wafer W, which can further reduce the damage that would be incurred by the catalyst holding units 730 and the detachment from the catalyst holding units 730 due to the friction between the wafer W and the catalyst holding units 730.

In the embodiment illustrated in FIG. 52, among at least several sets in the sets of the catalyst holding units 730a to 730f, each of the catalyst holding units 730a to 730f may be arranged so as to be located at positions different from one another in the radial direction of the wafer W. Arranging them in this manner allows grooves or spaces between the catalyst holding units 730a to 730f to be laid out in different manners with respect to the radial direction of the wafer W among the sets of the catalyst holding units 730a to 730f, which can reduce occurrence of unevenness of the etching amount due to the pattern in which the catalyst holding units 730a to 730f are laid out during the processing of the wafer W. Further, in the embodiment illustrated in FIG. 52, the catalyst holding units 730a to 730f may be configured to hold the same catalysts among them or may be configured in such a manner that at least some of the catalyst holding units 730a to 730f hold different kinds of catalysts. Further, the catalyst holding units 730a to 730f may be configured to contact the wafer W with equal contact pressures, or may be configured to be controlled independently of one another to contact the wafer W with different contact pressures.

Having described aspects of the present invention based on several embodiments, the above-described embodiments of the invention are intended only to facilitate the understanding of the present invention, and are not intended to limit the present invention thereto. It is apparent that the present invention can be modified and improved without departing from the gist of the present invention, and equivalents thereof are also included in the present invention. Further, the components described in the claims and the specification of the present application can be arbitrarily combined or omitted within a range that can solve at least a part of the above-described problems or achieve at least a part of the advantageous effects.

REFERENCE SIGNS LIST 10 substrate processing apparatus
20 substrate holding unit
20-4 extension portion
20-6 vacuum suction plate
20-8 vacuum line
20-10 suction hole
21 wall
30 catalyst holding unit
30-10 tilt sensor
30-18 air cylinder mechanism
30-32 gimbal mechanism
30-40 processing liquid supply passage
30-42 supply port
30-44 buffer portion
30-48 support member
30-49 catalyst electrode
30-50 counter electrode
30-51 inlet passage
30-52 wall
30-53 outlet passage
30-55 piezoelectric element
30-70 disk holder portion
30-72 catalyzer disk portion
30-74 head
30-76 contact probe
31 catalyst
32 catalyst holding member (elastic member)
32-6 Peltier element
33 pressure chamber
34a support frame
35a pressure adjustment portion
36b bore
37c groove
40 processing liquid supply unit
50 swing arm
51-1 shaft
50-2 cover
50-12 air cylinder
50-14 load cell
50-15 PID controller
51 rotational center
60 conditioning unit
60-2 conditioning stage
60-6 passage
60-8 wall
60-10 catalyst measurement sensor
60-12 regeneration electrode
61 scrub cleaning unit 62 cleaning liquid supply unit
90 control unit
110 substrate processing apparatus
120 substrate holding unit
121 substrate temperature control unit
210 substrate processing apparatus
220 substrate holding unit
240 processing liquid supply unit
241 supply port
242 processing liquid suction unit
243 suction port
270 processing liquid holding unit
271 internal space
310 substrate processing apparatus
410 substrate processing apparatus
480 monitoring unit
490 control unit
491 parameter change unit
510 substrate processing apparatus
580 potential adjustment unit
581 reference electrode
582 power source
601 substrate processing system
602 swing arm
604 substrate holding head
605 polishing table
606 dresser
607 swing arm
608 slurry supply nozzle
609 substrate feed unit
610 substrate processing unit
630 catalyst holding unit
640 processing liquid supply unit
650 swing arm
710 substrate processing apparatus
730 catalyst holding unit
730a first catalyst holding unit
730b second catalyst holding unit
731 core member
732 elastic member
733 catalyst
739 substrate holding unit
704 processing liquid supply unit
741 catalyst holding unit internal supply port
W wafer
PL processing liquid

The invention claimed is:

1. A substrate processing apparatus for processing a processing target region of a substrate by bringing the substrate and a catalyst into contact with each other in the presence of processing liquid, the substrate processing apparatus comprising:
a substrate holding unit configured to hold the substrate, the substrate holding unit comprising a stage having a vacuum port connected to a vacuum line;
a catalyst holding unit configured to hold the catalyst; a processing liquid supply passage defined in the catalyst holding unit, and the catalyst holding unit including a supply port for supplying the processing liquid passed through the processing liquid supply passage onto the processing target region of the substrate, the supply port defined in the catalyst and being in communication with the processing liquid supply passage; and
a driving unit configured to move the substrate holding unit and the catalyst holding unit relative to each other with the processing target region of the substrate and the catalyst kept in contact with each other, the driving unit comprising a first motor for rotating the stage of the substrate holding unit and a second motor for rotating the catalyst holding unit.

2. The substrate processing apparatus according to claim 1, wherein the catalyst holding unit includes:
a buffer portion configured to temporarily hold the processing liquid in the catalyst holding unit; and
a plurality of supply ports for supplying the processing liquid passed through the catalyst holding unit onto the processing target region of the substrate, the plurality of supply ports being in fluid communication with the buffer portion.

3. The substrate processing apparatus according to claim 1, wherein the catalyst holding unit includes an elastic member for holding the catalyst.

4. The substrate processing apparatus according to claim 3, wherein:
the elastic member includes a structure having a pressure chamber formed by an elastic film;
a layer of the catalyst is formed on an outer surface of the elastic film; and
the pressure chamber is configured to control a contact pressure between the processing target region of the substrate and the catalyst by control of fluid supplied into the pressure chamber.

5. The substrate processing apparatus according to claim 1, wherein:
the catalyst holding unit includes an elastic member for holding the catalyst;
the elastic member includes a sponge having a cavity,
wherein the processing liquid supply passage is in fluid communication with the sponge,
wherein a layer that is a layer of the catalyst and has a pore is formed on an outer surface of the sponge.

6. The substrate processing apparatus according to claim 1, wherein:
the catalyst holding unit includes an elastic member for holding the catalyst;
a plurality of grooves is formed on the elastic member, and the catalyst is embedded in each of the plurality of grooves.

7. The substrate processing apparatus according to claim 1, wherein:
the catalyst holding unit includes an elastic member for holding the catalyst;
a plurality of grooves for transferring the processing liquid is formed on the elastic member.

8. The substrate processing apparatus according to claim 1, wherein:
the catalyst holding unit includes an elastic member for holding the catalyst;
the elastic member comprises a plurality of elastic members; and
each of the plurality of elastic members individually holds the catalyst.

9. The substrate processing apparatus according to claim 1, wherein the catalyst includes two or more kinds of individual catalysts, or is a mixture or a compound containing two kinds of catalysts.

10. The substrate processing apparatus according to claim 1, wherein the catalyst holding unit comprises a plurality of catalyst holding units, and
wherein each of the plurality of catalyst holding units individually holds the catalyst.

11. The substrate processing apparatus according to claim 10, wherein at least two of catalyst holding units, among the plurality of catalyst holding units, hold different kinds of catalysts from each other.

12. The substrate processing apparatus according to claim 1, wherein the catalyst holding unit is disposed above the substrate holding unit, and
wherein the substrate holding unit includes a wall extending vertically upwardly throughout an entire circumferential direction outside a region for holding the substrate.

13. The substrate processing apparatus according to claim 1, further comprising a processing liquid holding unit surrounding the catalyst holding unit around the catalyst holding unit and open on a substrate side that faces the substrate, the processing liquid holding unit being configured to hold the processing liquid in this processing liquid holding unit,
wherein the processing liquid is supplied into the processing liquid holding unit.

14. The substrate processing apparatus according to claim 13, further comprising a processing liquid suction unit in communication with the inside of the processing liquid holding unit, the processing liquid suction unit being configured to suck the processing liquid held in the processing liquid holding unit.

15. The substrate processing apparatus according to claim 1, wherein the catalyst holding unit includes a spherical body or a cylindrical body with the layer of the catalyst formed on a spherical surface of the spherical body or a circumferential surface of the cylindrical body, the spherical body or the cylindrical body being configured in such a manner that, when the substrate holding unit and the catalyst holding unit are moved relative to each other, the spherical body or the cylindrical body is rotatable according to this relative movement.

16. The substrate processing apparatus according to claim 15, wherein the spherical body or the cylindrical body includes an elastic member therein.

17. A substrate processing system comprising:
the substrate processing apparatus according to claim 1;
a substrate cleaning unit configured to clean the substrate; and
a substrate transfer unit configured to transfer the substrate.

18. The substrate processing system according to claim 17, further comprising a Chemical Mechanical Polishing apparatus configured to polish the substrate before or after the substrate is processed by the substrate processing apparatus.

19. The substrate processing apparatus according to claim 1, further comprising a control unit configured to control an operation of the substrate processing apparatus,
wherein the control unit performs control so as to move the catalyst holding unit in an in-plane direction of the processing target region of the substrate with the processing target region of the substrate and the catalyst kept in contact with each other, and performs control so as to change a speed at which the catalyst holding unit is moved according to a position of the catalyst holding unit on the processing target region of the substrate.

20. The substrate processing apparatus according to claim 1,
wherein the catalyst holding unit including a plurality of grooves configured to allow the processing liquid to flow between the catalyst holding unit and the substrate with the catalyst holding unit and the substrate kept in contact with each other.

21. The substrate processing apparatus according to claim 20, wherein the plurality of grooves each has such a trapezoidal shape in cross-section that a width of the groove is wider at an opening of the groove than a bottom of the groove.

22. The substrate processing apparatus according to claim 20, wherein the plurality of grooves includes at least one of (i) a pattern including a plurality of concentric circles, (ii) a pattern including a plurality of radial lines, (iii) a pattern including pluralities of parallel lines extending in intersecting different directions, and (iv) a spiral pattern.

23. The substrate processing apparatus according to claim 1, further comprising
a substrate cleaning unit configured to clean the substrate held on the substrate holding unit.

24. A substrate processing system comprising:
the substrate processing apparatus according to claim 1;
a substrate cleaning unit configured to clean the substrate;
a substrate drying unit for drying the cleaned substrate; and
a substrate transfer unit configured to transfer the substrate.

25. The substrate processing system according to claim 24, wherein the substrate transfer unit is configured to be able to transfer the substrate in a wet status and the substrate in a dry status separately.

26. The substrate processing apparatus according to claim 1,
wherein the catalyst holding unit includes an elastic member, and a resin film attached to the elastic member to hold the catalyst.

27. The substrate processing apparatus according to claim 1,
wherein the catalyst holding unit includes an elastic member, and a layer of a harder material than the elastic member that is disposed between the elastic member and the catalyst.

28. The substrate processing apparatus according to claim 1, wherein
the catalyst holding unit includes a disk holder portion, and a catalyzer disk portion coupled detachably from the disk holder portion; and
the catalyzer disk portion includes:
a catalyst holding unit having a surface where the catalyst is held, a catalyst electrode electrically connected to the catalyst, and a counter electrode,
the disk holder portion includes a catalyst electrode wiring electrically connected to the catalyst electrode, a counter electrode wiring electrically connected to the counter electrode, and a contact probe for electrically connecting the catalyst electrode to the catalyst electrode wiring and a contact probe for electrically connecting the counter electrode to the couther electrode wiring when the disk holder portion and the catalyzer disk portion are coupled with each other;
the substrate processing apparatus further comprises a power source for applying a voltage to between the catalyst electrode and the counter electrode.

29. The substrate processing apparatus according to claim 1, further comprising a swing arm configured to be able to move the catalyst holding unit in a direction perpendicular to a surface of the substrate, the swing arm being attached to the catalyst holding unit,
wherein the swing arm includes a load cell configured to measure a contact pressure when the catalyst of the catalyst holding unit is in contact with the substrate.

30. The substrate processing apparatus according to claim 29, further comprising a PID controller configured to control a pressure with which the catalyst and the substrate are in contact with each other based on the contact pressure measured by the load cell.

31. The substrate processing apparatus according to claim 29, wherein the swing arm includes a cover surrounding the entire swing arm, and is configured to be able to supply air and/or nitrogen into the cover.

32. The substrate processing apparatus according to claim 1, wherein
the substrate holding unit includes a substrate holding stage and a vacuum suction plate for holding the substrate onto the substrate holding stage with use of vacuum suction;
the vacuum suction plate includes a suction bore;
the substrate holding unit includes a vacuum line in fluid communication with the suction bore of the vacuum suction plate; and
the vacuum line is configured to be able to carry out vacuum suction of the substrate onto the vacuum suction plate by vacuuming, and release the vacuum suction by supplying water and/or air or nitrogen to the vacuum line.

33. The substrate processing apparatus according to claim 1, further comprising a processing liquid temperature adjustment unit configured to adjust a temperature of the processing liquid to a predetermined temperature within a range of 10 degrees to 60 degrees, inclusive.

34. The substrate processing apparatus according to claim 1, further comprising a potential adjustment unit including a reference electrode, the potential adjustment unit being configured to establish an electrochemical connection between the catalyst and the reference electrode to each other via the processing liquid to control a potential on the surface of the catalyst.

* * * * *